(12) United States Patent
Crane, Jr. et al.

(10) Patent No.: US 6,797,882 B1
(45) Date of Patent: Sep. 28, 2004

(54) DIE PACKAGE FOR CONNECTION TO A SUBSTRATE

(75) Inventors: Stanford W. Crane, Jr., Santa Clara, CA (US); Myoung-soo Jeon, Fremont, CA (US); Charley Takeshi Ogata, San Jose, CA (US)

(73) Assignee: Silicon Bandwidth, Inc., San Jose, CA (US)

( * ) Notice: Subject to any disclaimer, the term of this patent is extended or adjusted under 35 U.S.C. 154(b) by 0 days.

(21) Appl. No.: 09/978,772

(22) Filed: Oct. 18, 2001

Related U.S. Application Data

(60) Provisional application No. 60/240,982, filed on Oct. 18, 2000.

(51) Int. Cl.[7] ............................................. H01L 23/02
(52) U.S. Cl. ...................... 174/52.4; 257/680; 257/698
(58) Field of Search ............................. 174/52.2, 52.3, 174/52.4; 361/785, 789, 752, 737, 803; 257/680, 679, 698

(56) References Cited

U.S. PATENT DOCUMENTS 6,011,698 A * 1/2000 Buehler ...................... 361/799
6,201,704 B1 * 3/2001 Polawski et al. ........... 361/753

* cited by examiner

Primary Examiner—Hung V. Ngo
(74) Attorney, Agent, or Firm—Morgan, Lewis & Bockius LLP

(57) ABSTRACT

A die carrier for holding a die, such as a microdisplay die, may be electrically connected to a substrate by pressing the substrate against flexible, resilient leads of the die carrier. The package includes a housing and a shroud mounted to the housing. The substrate is inserted through a slot in the shroud and, within the shroud, engages against the flexible, resilient leads, thereby establishing an electrical contact.

29 Claims, 56 Drawing Sheets

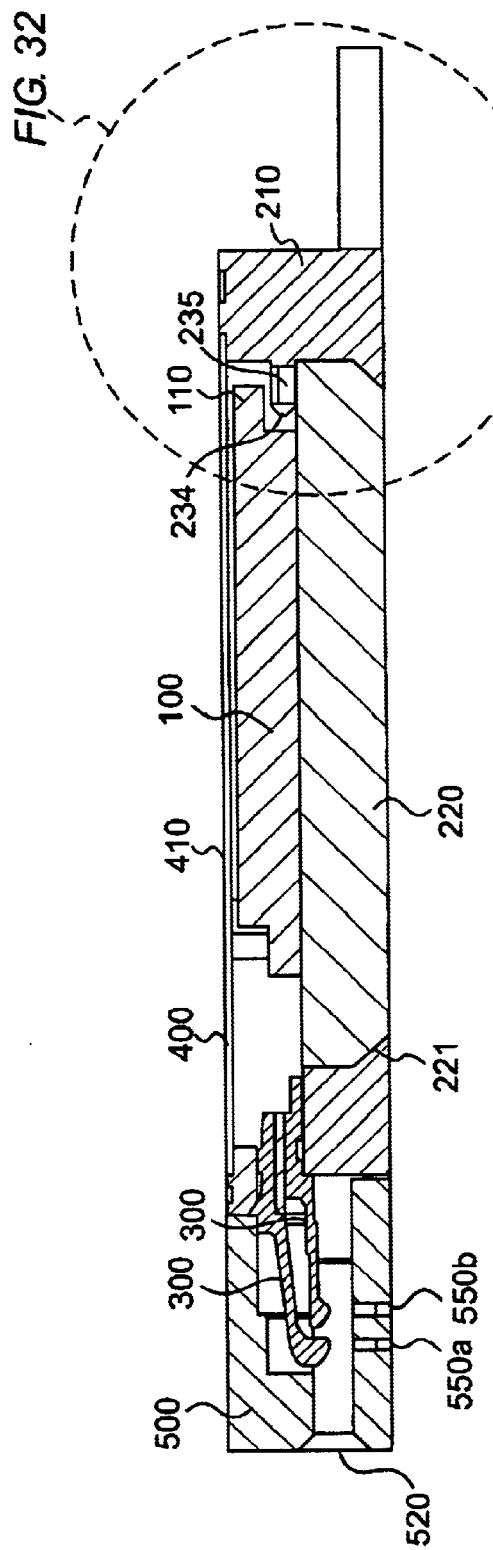
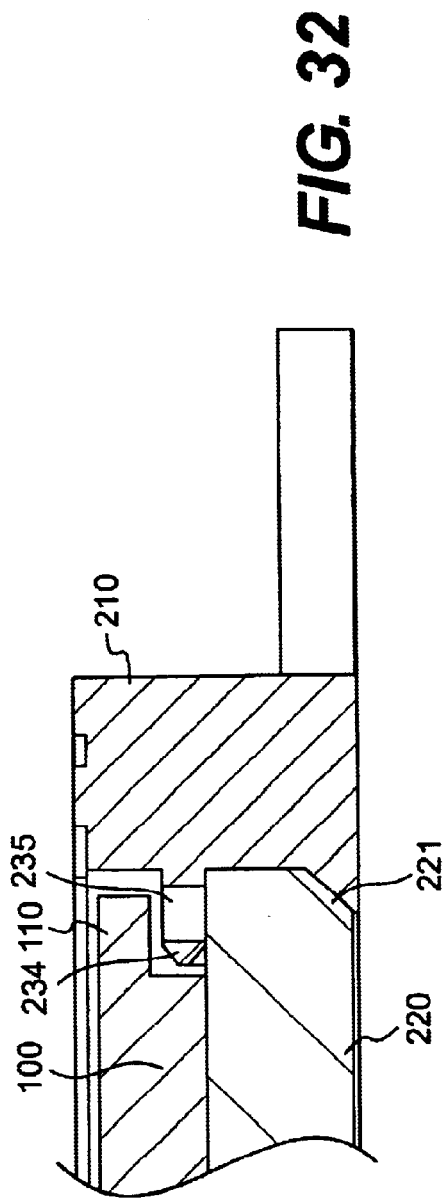
FIG. 31
FIG. 32

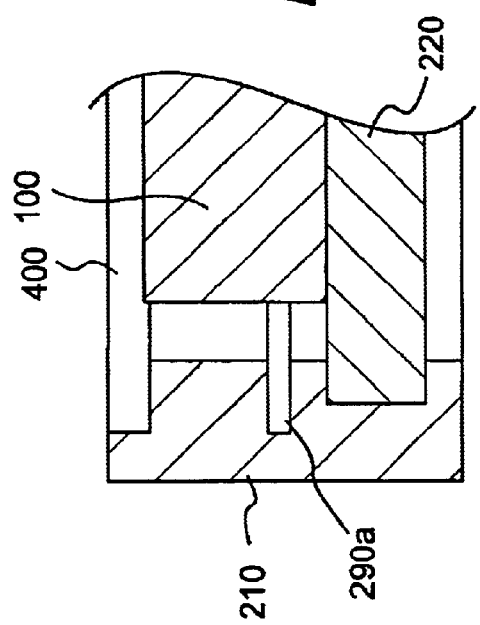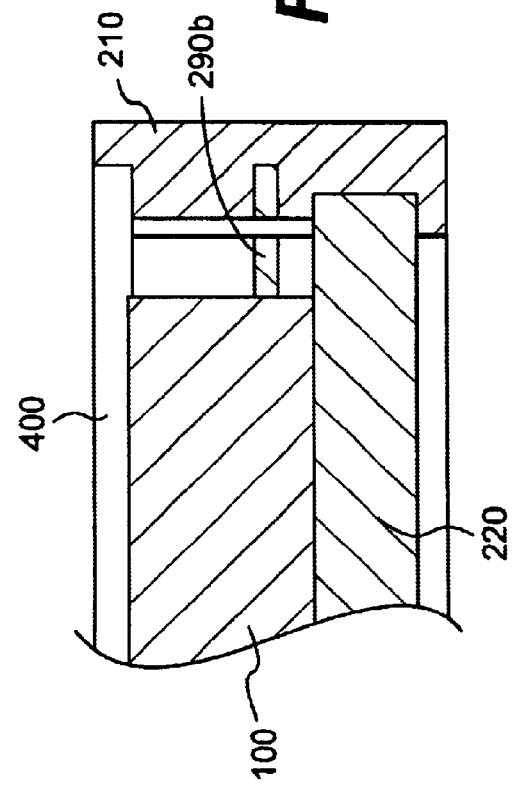

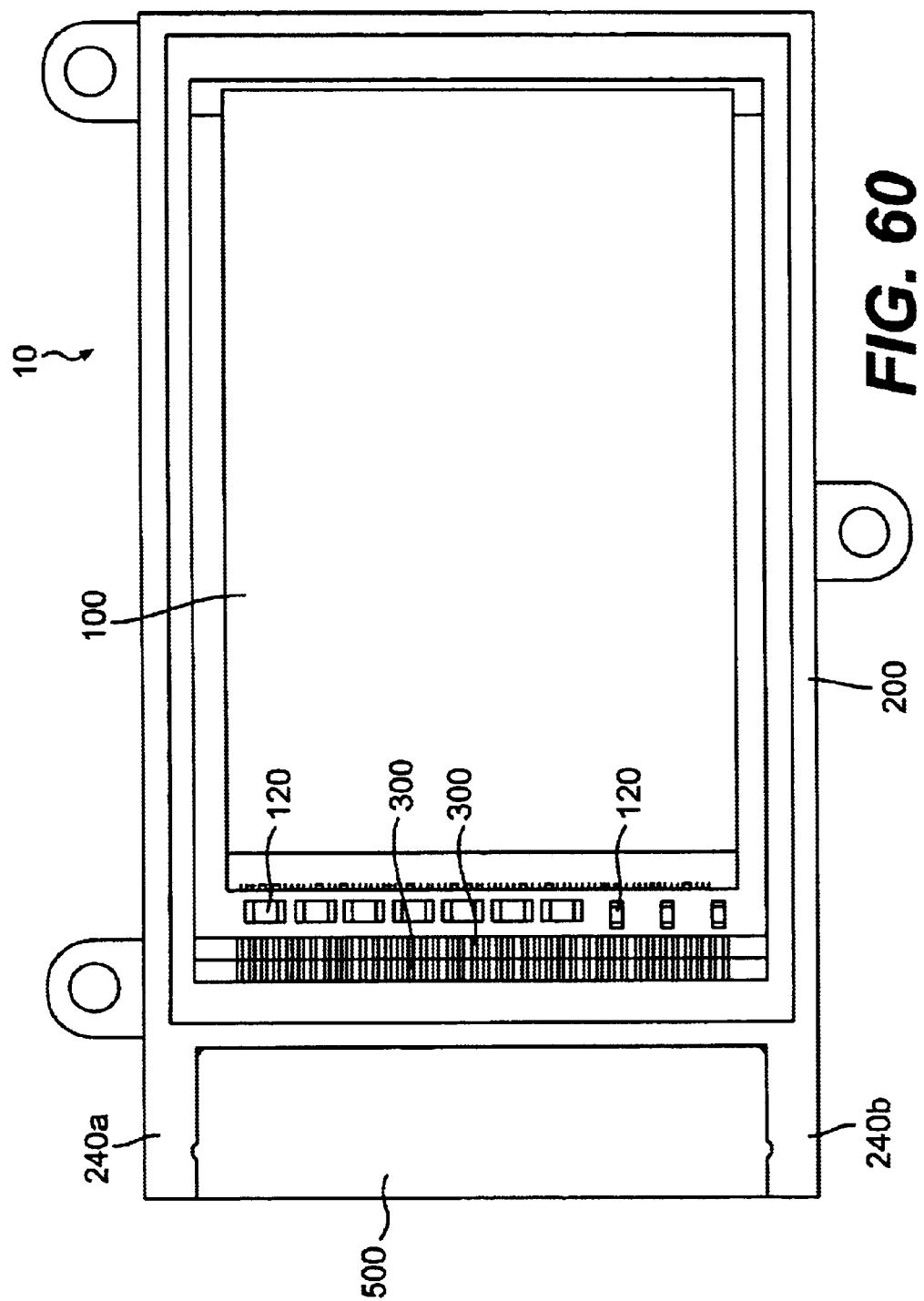

DIE PACKAGE FOR CONNECTION TO A SUBSTRATE

RELATED APPLICATIONS

This application claims the benefit of priority under 35 U.S.C. §119(e) based on U.S. application No. 60/240,982, filed on Oct. 18, 2000, which is incorporated herein by reference.

This application is related in subject matter to U.S. application Ser. No. 08/208,586, entitled "Prefabricated Semiconductor Chip Carrier", filed Mar. 11, 1994, and expressly incorporated by reference herein; U.S. application Ser. No. 08/465,146, entitled "Method of Manufacturing A Semiconductor Chip Carrier", filed Jun. 5, 1995, and expressly incorporated by reference herein; U.S. application Ser. No. 08/487,103, entitled "Semiconductor Die Carrier Having Double-Sided Die Attach Plate", filed Jun. 7, 1995, and expressly incorporated by reference herein; U.S. application Ser. No. 08/902,032, entitled "Semiconductor Die Carrier Having A Dielectric Epoxy Between Adjacent Leads", filed Jul. 29, 1997, which is a continuation of U.S. application Ser. No. 08/487,100, filed Jun. 7, 1995, and expressly incorporated by reference herein; U.S. application Ser. No. 08/482,00, entitled "Low Profile Semiconductor Die Carrier", filed Jun. 7, 1995, and expressly incorporated by reference herein; U.S. patent application Ser. No. 08/970,379, entitled "Multi-Chip Module Having Interconnect Dies", filed Nov. 15, 1997 and expressly incorporated by reference herein; U.S. patent application Ser. No. 09/033,480, entitled "Semiconductor Die Package For Mounting In Horizontal And Upright Configurations", filed Mar. 3, 1998 and expressly incorporated by reference herein; U.S. patent application Ser. No. 09/218,180, entitled "Open Cavity Semiconductor Die Package," filed Dec. 22, 1998 and expressly incorporated by reference herein; and U.S. application Ser. No. 60/240,982, entitled "Die Package for Connection to a Substrate" filed concurrently herewith and expressly incorporated by reference herein.

BACKGROUND OF THE INVENTION

1. Field of the Invention

The present invention relates to a die package for connection to a substrate (such as a printed circuit board, a flexible printed circuit (FPC), or a flexible flat cable (FFC)) and, more particularly, to a die package for a die (such as a microdisplay die) that connects to a flexible printed circuit.

2. Description of the Related Art

A semiconductor die or chip is an electrical component on which a microcircuit is built. The microcircuits can be interconnected together on the printed circuit board to form larger electronic circuits for use in radios, televisions, compact disc players, and computers, to name just a few. Because the semiconductor die is fragile, it is encased in a semiconductor die package to protect it from the environment. If one were to look inside an electronic device, such as a computer, compact disc player, or cell phone, one would see one or more printed circuit boards on which semiconductor die packages are mounted and electrically interconnected.

The semiconductor die package includes a housing that holds the semiconductor die and conductive leads or pins that extend from the bottom or sides of the housing. The conductive leads are electrically connected to the semiconductor die within the housing. The outside ends of the leads are typically connected to conductive paths on the printed circuit board or plugged into a mating connector on the printed circuit board. This secures the semiconductor die package to the printed circuit board, and permits electrical signals to pass between the semiconductor die and other components on the printed circuit board.

Recent breakthroughs in semiconductor technology have led to the development of microdisplays formed on a die. The microdisplay die generates a display, for example, of alphanumeric characters, graphics, or images, in response to electrical signals supplied to the die. The microdisplays may be used in, for example, small appliance displays (e.g., mobile phones and other portable devices), projection televisions, and projectors. The microdisplay dies should be mounted in a die package for protection from the environment. However, conventional package designs are insufficient for housing microdisplay dies. One problem is that microdisplays are sensitive to high temperatures. If a temperature threshold is exceeded, the microdisplay die can warp, affecting the image quality of the microdisplay. For example, the temperature threshold of the microdisplay can be exceeded when package leads are soldered to a circuit board using conventional wave soldering techniques. In addition, if the package housing the microdisplay does not permit adequate cooling, the operation of the die itself or other dies within the housing may generate enough heat to cause damage. Moreover, different applications require different mounting and assembly schemes. Conventional solutions are not flexible enough to be convenient for different applications.

SUMMARY OF THE INVENTION

The present invention has been made in view of the above circumstances and has as an object to provide an economical die package for connecting to a substrate, such as a printed circuit board or a flexible printed circuit.

A further object of the invention is to provide a sturdy and reliable die package having an electromechanical mechanism for establishing an electrical connection between the die package and a substrate.

A further object of the invention is to provide an economical die package that simplifies the interface to a flexible printed circuit or other substrate and increases the range of applications.

A further object of the invention is to provide an economical die package for a microdisplay or other temperature-sensitive die.

A further object of the invention is to provide an economical method of electrically connecting a die package for a microdisplay or other temperature-sensitive die to a flexible printed circuit, printed circuit board, flexible flat circuit, or other substrate.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiment(s) of the invention and together with the description, serve to explain the principles of the invention.

FIG. 31 illustrates a cross section of the die package of FIG. 21 taken through a hole in the ledge.

FIG. 32 is a detailed view of the cross section of FIG. 31.

FIGS. 43 and 44 show details of the cross section of FIG. 42.

FIG. 60 shows a top view of the die package of FIG. 57.

DESCRIPTION OF THE PREFERRED EMBODIMENT

Reference will now be made in detail to the present exemplary embodiment(s) of the invention illustrated in the accompanying drawings. Wherever possible, the same reference numbers will be used throughout the drawings to refer to the same or like parts.

Figure 1:
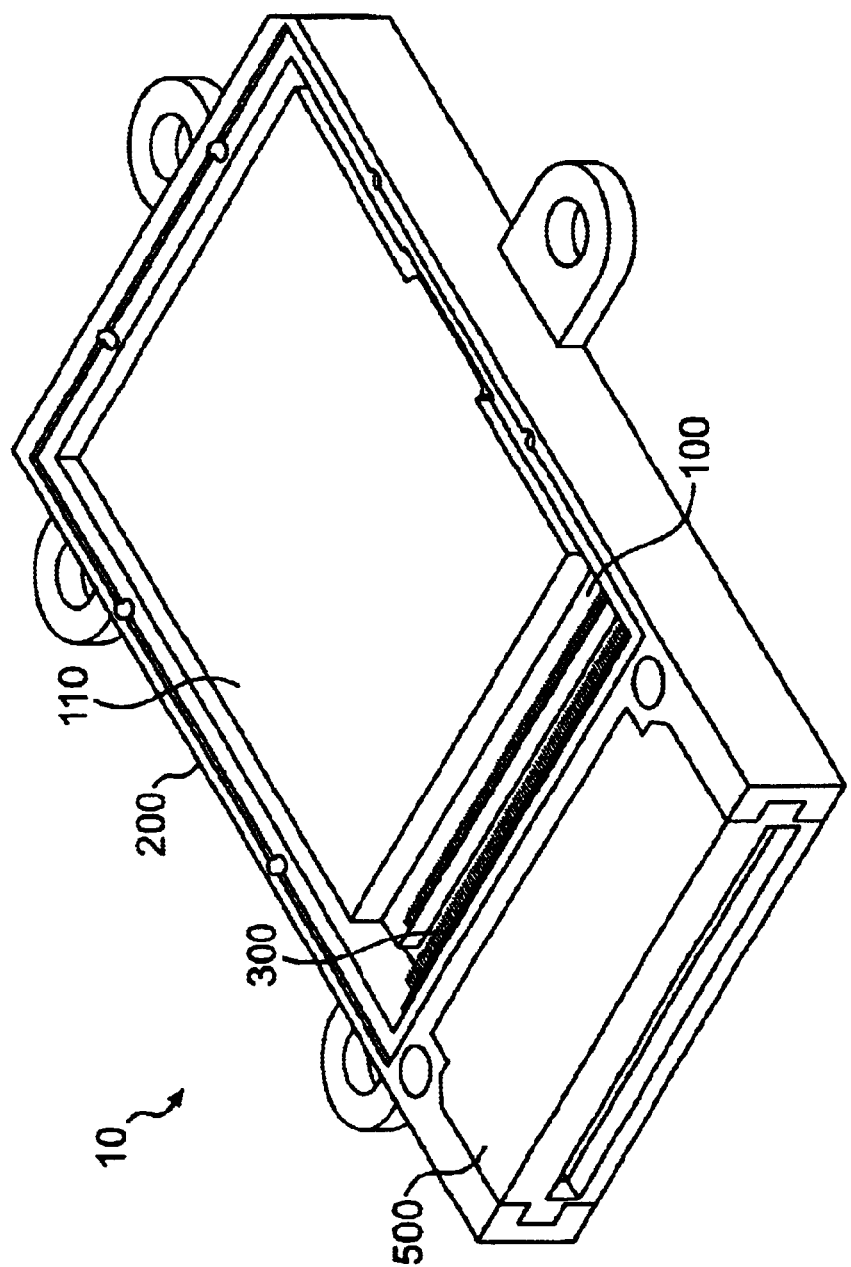
FIG. 1 illustrates an embodiment of a die package in accordance with the present invention.

FIG. 1 provides a perspective view of one embodiment of a die package 10 according to the present invention. The die package 10 includes a housing 200, leads 300 retained in the housing 200, and a shroud 500. A cover plate (not shown) may be attached to the top of housing 200. The cover plate may include an aperture with a light-transmissive aperture plate. Shroud 500 is preferably formed as a separate piece attached after leads 300 are in place within housing 200. Housing 200 may hold one or more dies, for example, a microdisplay die 100 (and possibly other dies and/or components). The microdisplay die 100 may include microelectronic elements formed on an insulative die or in a semiconductor die. The upper surface of the die 100 may function to reflect light directed on to it.

A glass or plastic plate 110 may be mounted over the microdisplay die 100. The plate 110 may be offset with respect to the die 100 to permit electrical connection to the die and/or to the glass plate 110. The plate 110 may be used as an upper substrate for the microdisplay die 100. The plate 110 may include one or more electrodes on a side facing the die 100. The electrode(s) may be formed, for example, of a transparent conductor, such as indium tin oxide. Liquid crystal material may be sandwiched between the plate 110 and the die 100. Accordingly, a potential difference between electrodes formed on the die 100 and the electrode(s) on the plate 110 can be used to selectively pass or block light passing through the liquid crystal material. Plate 110 may also serve to protect the die 100 while allowing the display to be viewed from outside of the die package 10. The plate 110 may further filter or serve as a lens for light transmitted therethrough. For example, the plate 110 may be a polarization or color filter and/or a lens that focuses light onto the die 100. Further, the plate 110 may serve as a lens that magnifies the display. Other components may be included in or with the microdisplay die 100. It should be appreciated that the present invention may be used with a variety of microdisplays 100. Instead or in addition to a microdisplay die, the die package may include a data collection device die such as a transceiver or charge coupled device (CCD) die, or temperature sensor (such as a thermistor, for example), or a cooling device.

Figure 2A:
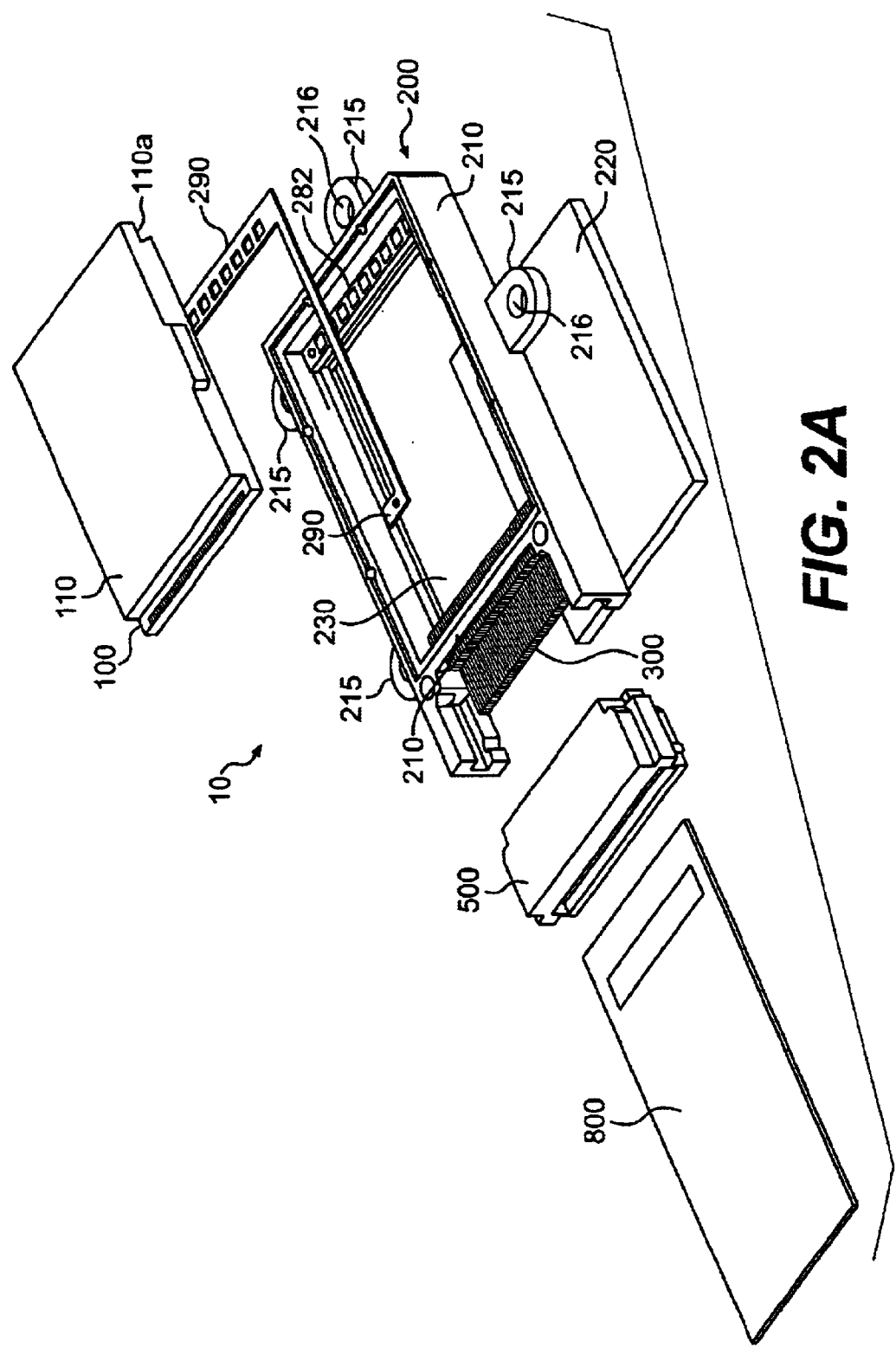
FIG. 2A provides an exploded view of the embodiment of a die package in accordance with the present invention together with a substrate.
Figure 2B:
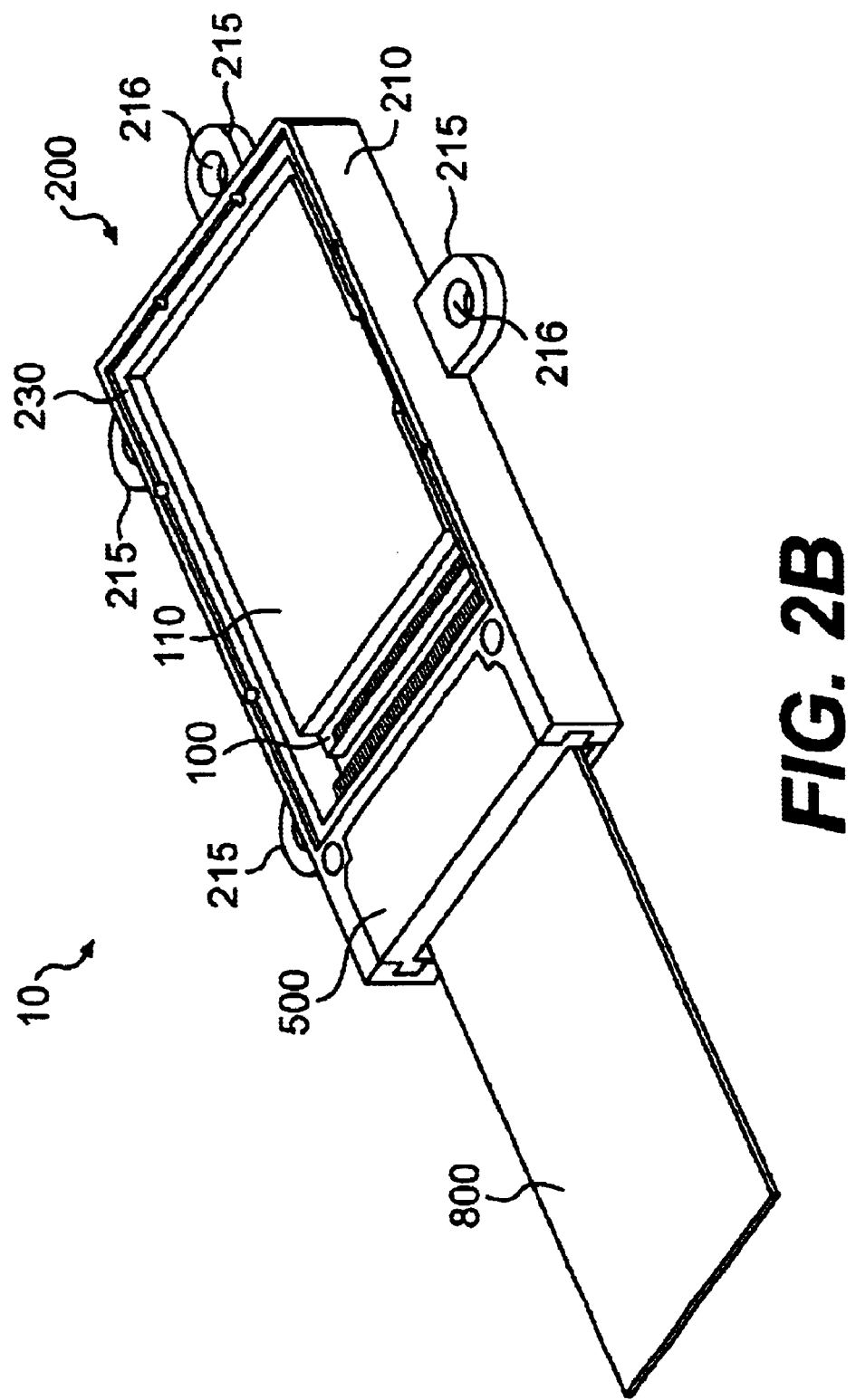
FIG. 2B provides a view of the embodiment of a die package in accordance with the present invention connected to a substrate or FPC.

FIG. 2A provides an exploded view of die package 10 for holding a microdisplay die 100 together with a substrate, such as a flexible printed circuit (FPC) 800. FIG. 2B illustrates the die package 10 connected to FPC 800. The housing 200 includes a plurality of side walls 210 and an end plate 220, as will be described in greater detail below. As shown in FIG. 2A, leads 300 extend from a side wall 210 of housing 200. Leads 300 may extend from any one or more of the other side walls 210 as well. Leads 300 are adapted to make electrical contact with the substrate. In addition, FIG. 2A illustrates a voltage biased plane 290. The plane 290 may be formed of copper or another conductive material. The plane 290 has a plurality of cut-outs that match to features 282 formed on an interior surface of a side wall 210. The cut-outs of plane 290 receive the features 282 for positive positioning. The plane 290 electrically connects to electrical contacts on the bottom 110a of the plate 110, for example, using a conductive paste. An end 290a also electrically connects to one or more leads 300 on the other side of the housing 200. The plane 290 can be used as a ground or a positively charged plane, for example, to facilitate phase shifting of an LCD screen.

A cavity 230 is defined within the interior of the housing 200. The microdisplay die 100 (and possibly other dies and/or components) may be housed within the cavity 230, for example, by mounting to end plate 220 using an adhesive, such as an epoxy. Of course, dies may be mounted within cavity 230 by means other than adhesive and may be mounted to structure other than the end plate 220.

Electrically conductive material (not shown in FIGS. 1, 2A, and 2B), such as tape automated bonding, wires, jumpers, and/or other electrically conductive material, may be used to electrically connect the leads 300 to the die(s). In applications in which one or more of the dies may be damaged by heat, an appropriate electrical connection structure and method may be used to avoid exceeding the thermal threshold of the die. Not all of the leads 300 need to be electrically connected to a die. Some of leads 300 may not be connected to any electrically conductive element within the housing 200. Alternatively or in addition, some of leads 300 may be electrically connected to electromagnetic interference (EMI) or electrostatic discharge (ESD) shielding either internal or external to the housing 200, a ground or power plane included within the housing 200, or another electrical component within the housing.

An encapsulant (not shown) may cover all or part of the electrically conductive material and all or a portion of the die(s). Of course, if the encapsulant covers the display area of the microdisplay die 100, the encapsulant should not be opaque, but may be transparent to allow the light emitted from the microdisplay die to pass through the encapsulant without affecting the display. In embodiments that do not include a microdisplay die and/or do not require visual or physical exposure, an opaque encapsulant may be used to encapsulate the die(s).

Figure 3:
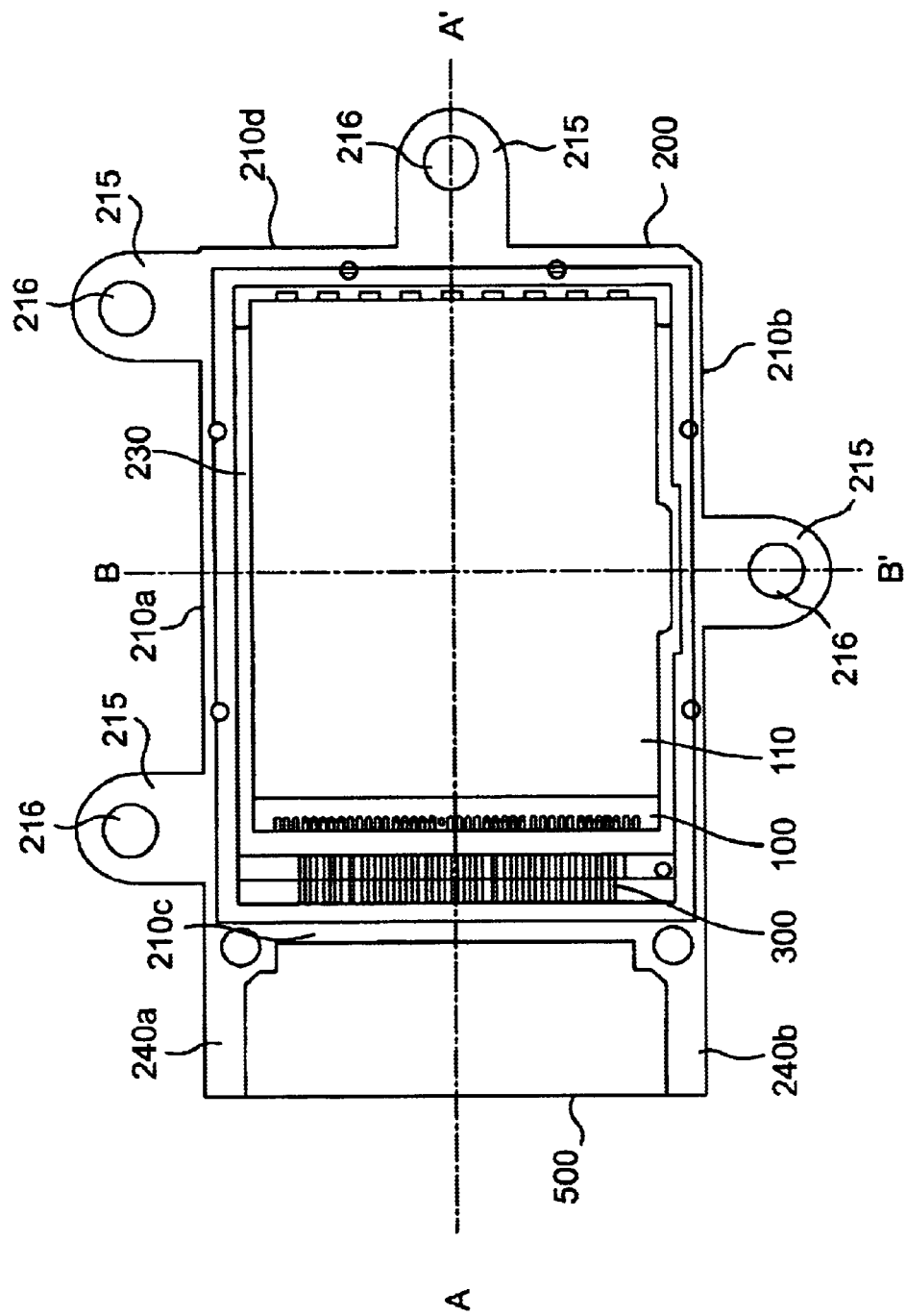
FIG. 3 shows a top view of an embodiment of a housing for the die package shown in FIG. 1.
Figure 4:
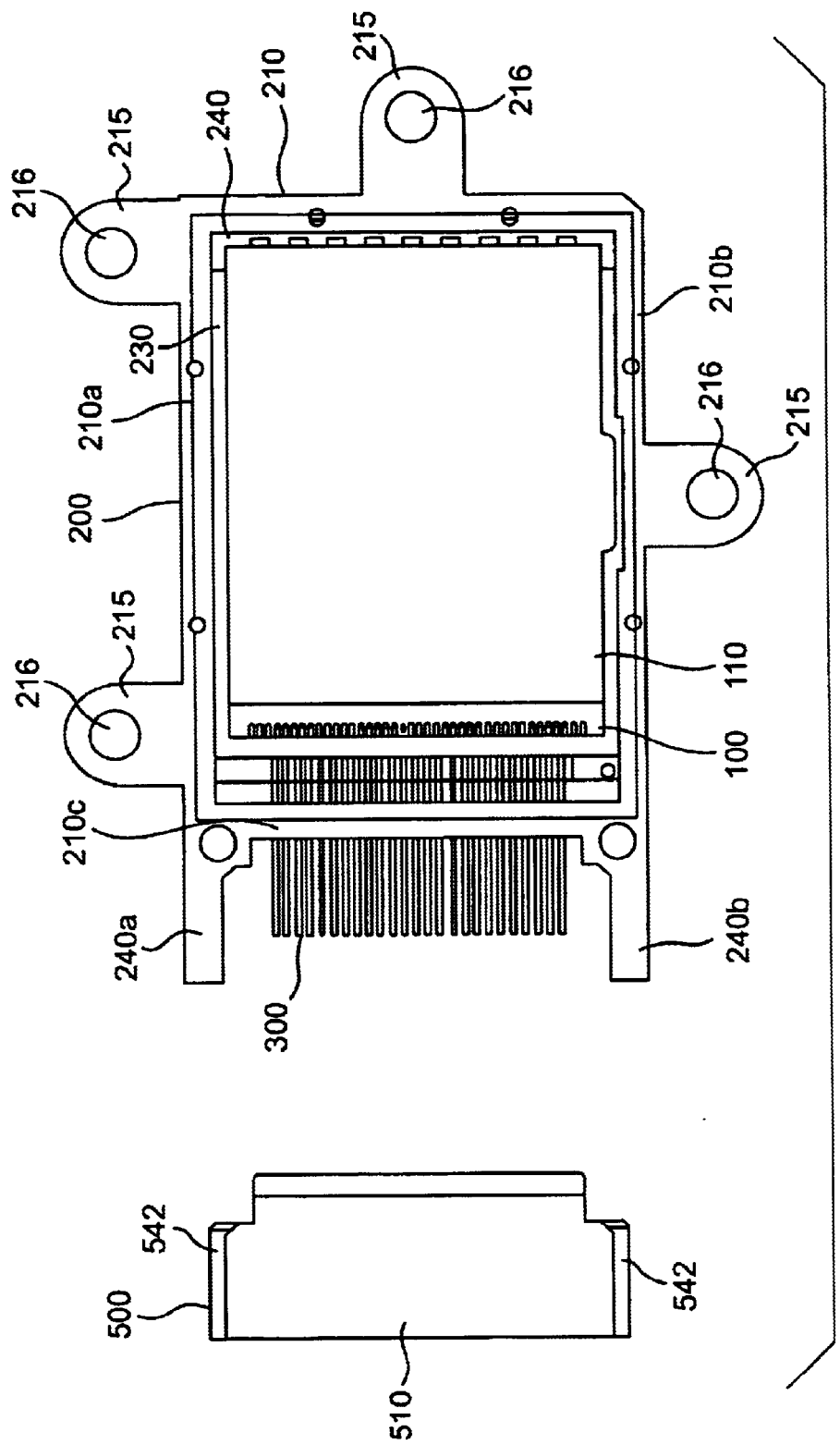
FIG. 4 shows a top view of an embodiment of a housing for the die package shown in FIG. 1 with the shroud detached.
Figure 5:
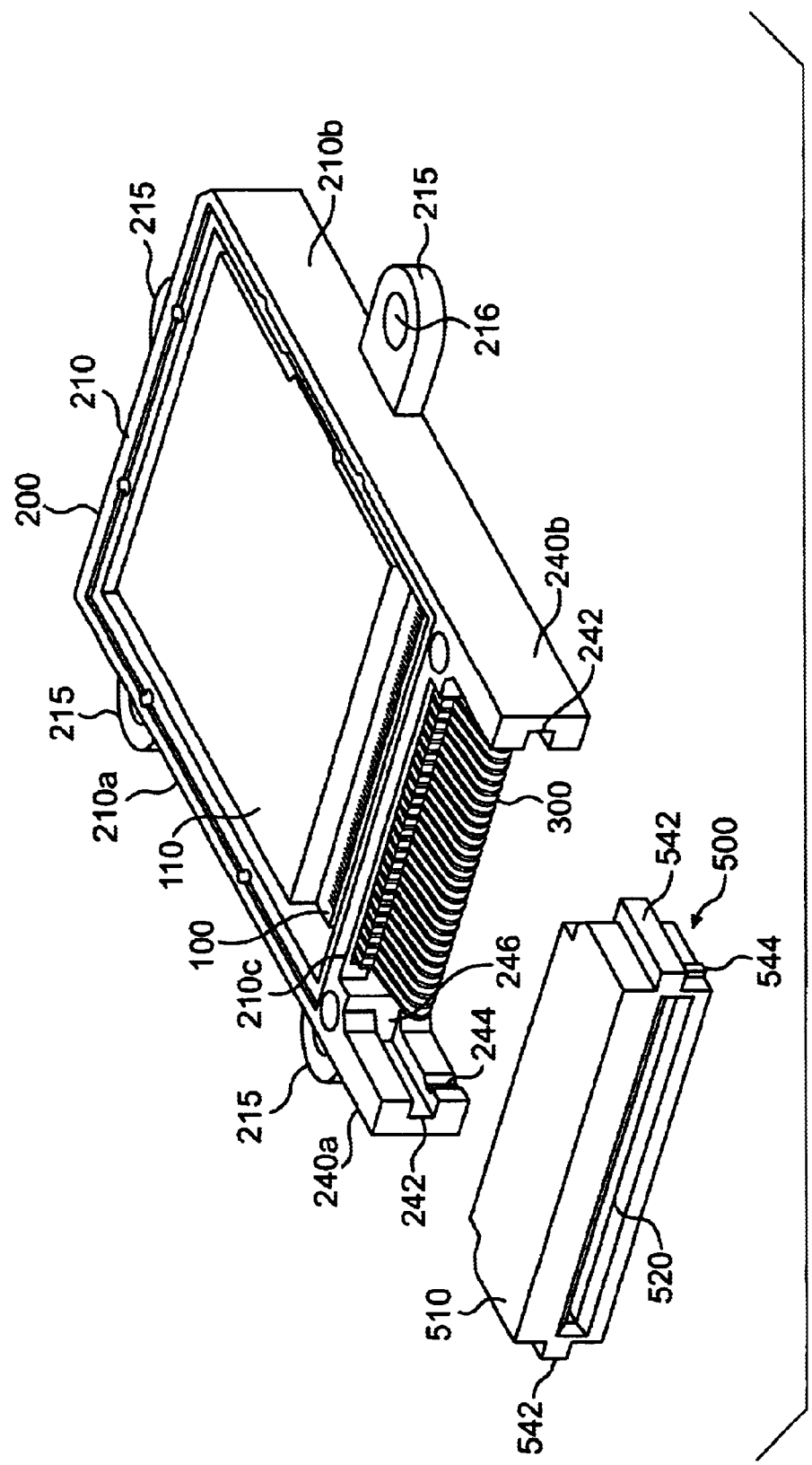
FIG. 5 shows a perspective view of FIG. 4.

FIGS. 3–5 show that housing 200 may have tabs 215 with apertures or holes 216 for securing the die package 10 to a structure. FIGS. 3–5 also show one embodiment for coupling the housing 200 and the shroud 500, as will be described below. It should be understood that several mechanisms or expedients may be used to couple housing 200 to shroud 500, and the illustration of one such mechanism in FIGS. 3–5 is not intended to limit the scope of the invention. As shown, housing 200 includes arms 240a and 240b extending from a sidewall 210c of housing 200. Arms 240a and 240b are sized to receive and help secure shroud 500 to housing 200. Arms 240a and 240b may extend from sidewall 210c beyond the leads 300, as best shown in FIG. 4. The outer sides of arms 240a and 240b may be flush with the adjacent sidewalls 210a and 210b, respectively, as shown in FIGS. 3–5, or one or both outer sides of arms 240a and 240b may be indented or may project beyond sidewalls 210a and 210b. As shown in FIG. 5, a groove 242 extends along an inner side of each arm 240a and 240b. Grooves 242 terminate at a stop 246. The inner side of each arm 240a and 240b also includes a notch 244.

Shroud 500 includes a body 510 having a slot 520 for receiving a substrate, such as a FPC 800, and an opening 530 (not seen in FIGS. 3–5) for receiving the portion of leads 300 extending from the housing 200. The shroud body 510 includes tongues 542 on opposite sides thereof. The tongues 542 are sized to slide into grooves 242 of the housing 200 to guide mating of the shroud 500 to the housing 200. The sides of shroud body 510 further include projections 544, which are sized to fit into notches 244 housing 200. Additional features of the shroud 500 will be discussed below.

The housing 200 and shroud 500 are coupled together as follows. The shroud body 510 is aligned with the housing 200 so that the opening 530 is opposite the leads 300. The tongues 542 of shroud body 510 are slid into grooves 242 of the housing 200. As the tongues 542 slide along grooves 242, leads 300 fit into the opening 530 of the shroud body 510. Moreover, the projections 544 of shroud body 510 will snap into the notches 244 of the arms 240a and 240b as the shroud body 510 is fully received in arms 240a and 240b, thereby attaching the shroud 500 to the housing 200. The projections 544 and grooves 244 may be shaped to secure the shroud 500 to the housing 200. Alternatively, the projections 544 and grooves 244 may be shaped so that the shroud 500 may be detached from the housing 200 by pulling the shroud 500 in the direction of the grooves 242 away from the housing 200. The lengths of the tongues 542 and grooves 242 may be designed and the relative position of the protrusions 544 and notches 544 may be selecting such that the ends of the tongues 542 abut the stops 546 when the protrusions 544 snap into notches 244. As shown in FIG. 3, the shroud 500 attaches snugly to the housing 200.

As noted above, its should be understood that other mechanical and/or other expedients may be used to attach the housing 200 and shroud 500, such as, for example, latches, screws, snaps, pins, adhesives, ultrasonic spiking, and/or ultrasonic welding.

Figure 6:
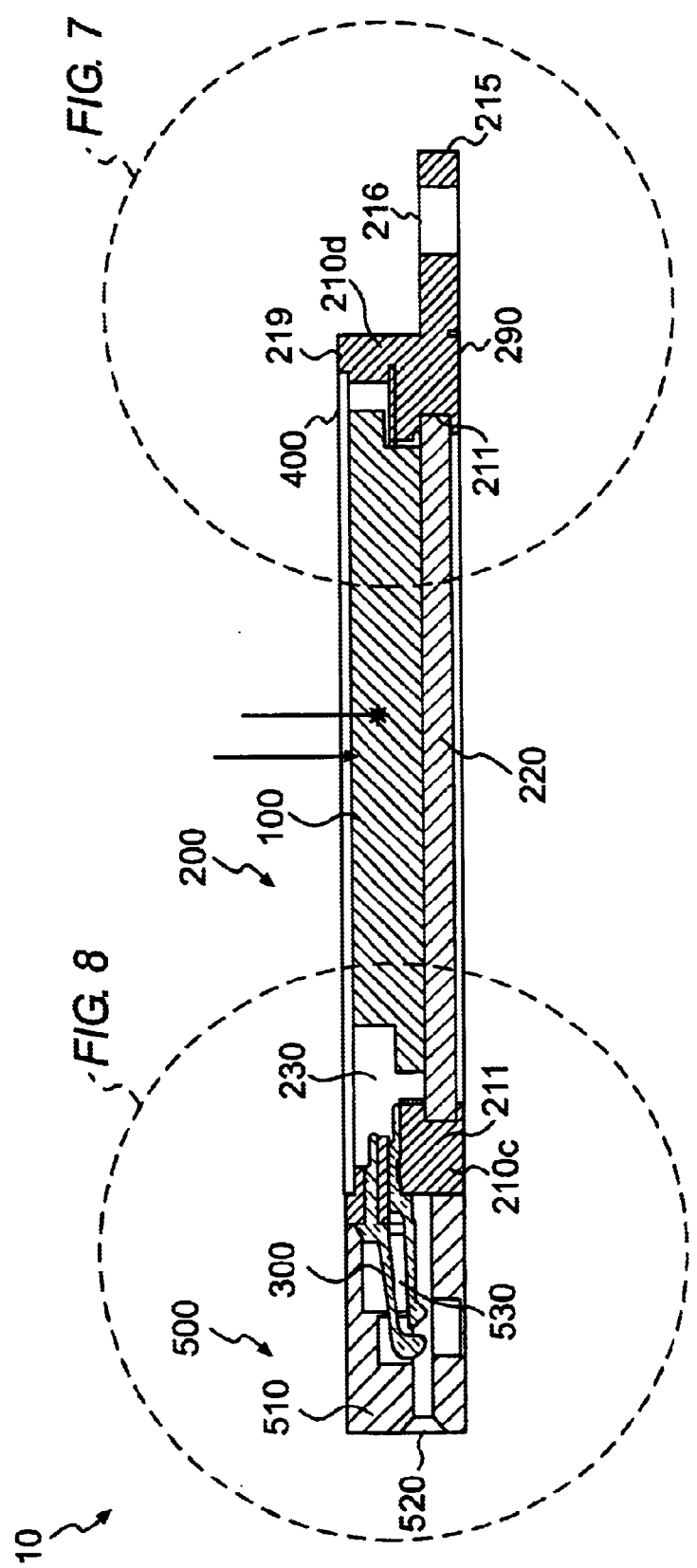
FIG. 6 shows a cross section of the die package depicted in FIG. 1 taken along a first axis.
Figure 7:
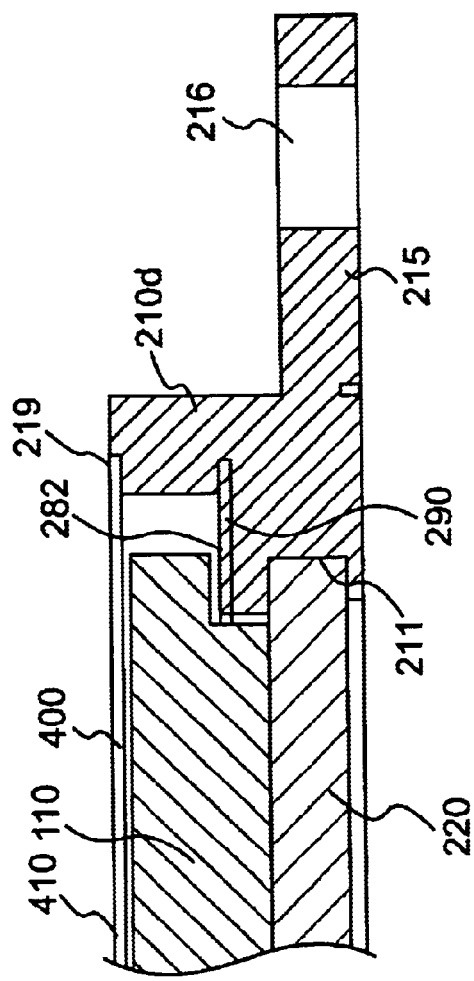
FIGS. 7 and 8 show close-up views of the cross section of the die package shown in FIG. 6.
Figure 8:
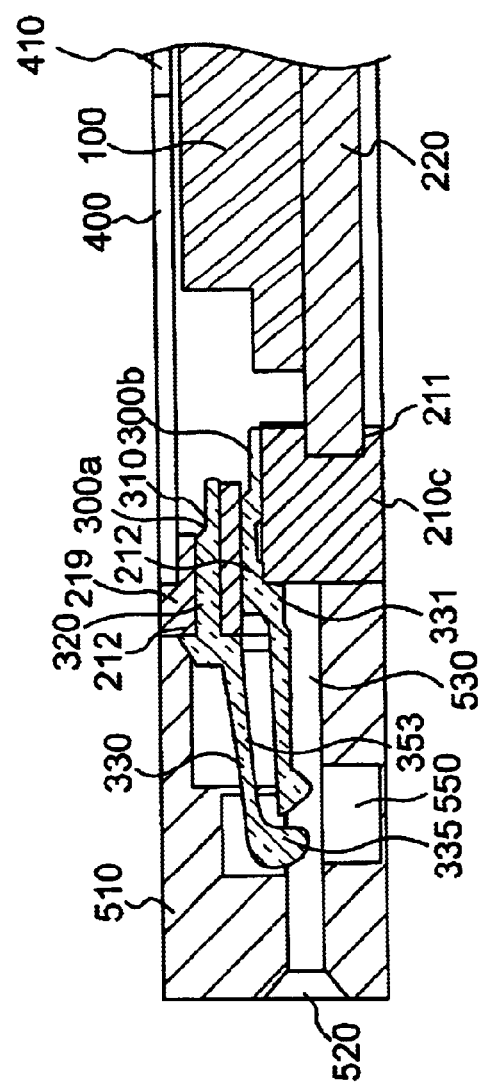
Figure 9:
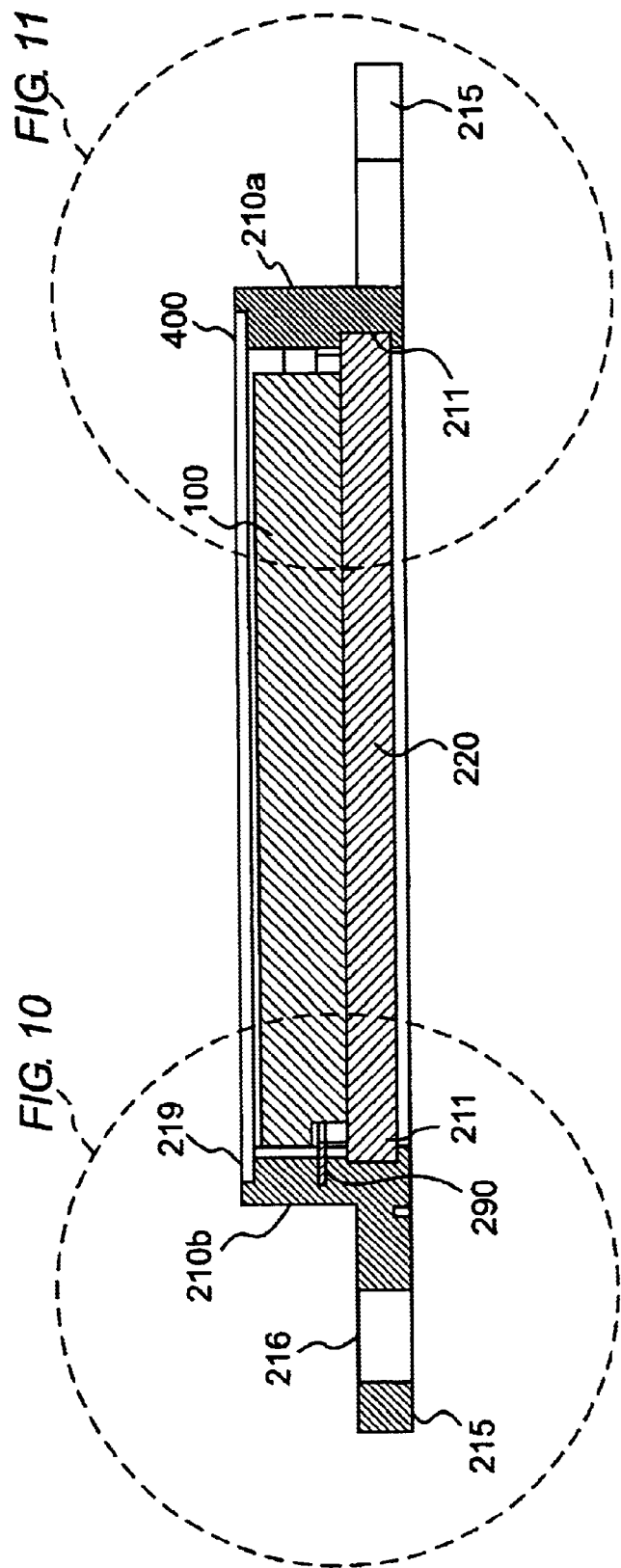
FIG. 9 shows a cross section of the die package depicted in FIG. 1 taken along a second axis orthogonal to the first axis.
Figure 10:
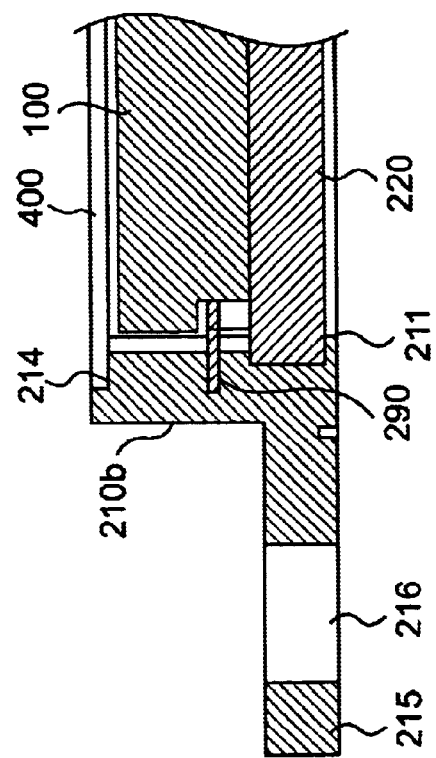
FIGS. 10 and 11 show close-up views of the cross section of the die package shown in FIG. 9.
Figure 11:
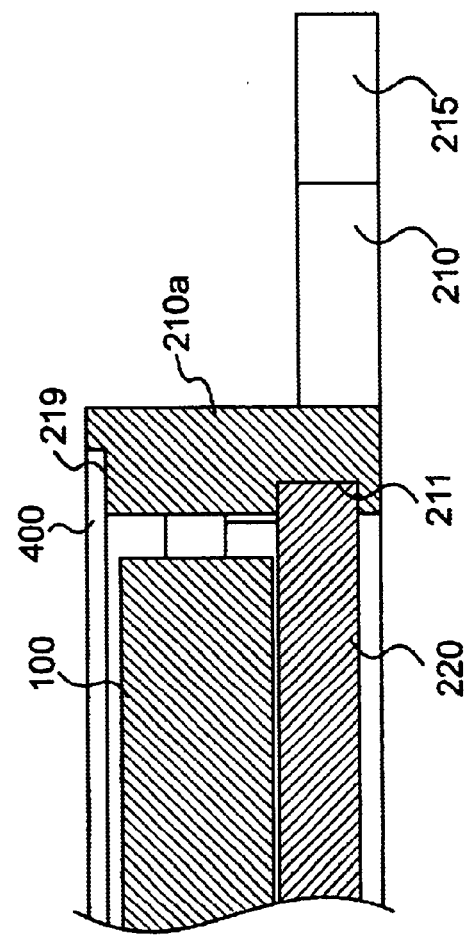

FIG. 6 illustrates a cross-section of the die package 10 of FIG. 3 taken along an axis A–A'. FIG. 7 illustrates the structural features of the die package 10 near sidewall 210*d*. FIG. 8 illustrates the structural features of the die package near sidewall 210*c*. FIG. 9 illustrates a cross-section of the die package 10 of FIG. 3 taken along an axis B–B'. FIG. 10 illustrates the structural features of the die package 10 near sidewall 210*b*. FIG. 11 illustrates the structural features of the die package near sidewall 210*a*.

As indicated above, housing 200 includes side walls 210, an end plate 220 joined to the side walls 210, and cavity 230 for receiving one or more dies 100. While in one preferred embodiment the cavity 230 receives one microdisplay die 100, multiple dies may be accommodated by appropriately sizing and/or shaping the cavity 230. Cavity 230 may be defined within the interior of housing 200, for example, by the interior surfaces of the side walls 210 and end plate 220. Of course, cavity 230 may be defined in whole or in part by other structure located within side walls 210 and end plate 220.

One or more of side walls 210 preferably include openings 212 formed therethrough for receiving leads 300. As shown in FIGS. 6 and 8, openings 212 are formed through sidewall 210*c* in two vertically-spaced rows. Of course, the openings 212 may be provided in a single row, three or more rows, or in another arrangement to facilitate input/output communication with the die(s) housed in the die package 10. The openings 212 in adjacent rows may be aligned with each other or staggered. The openings 212 may be sized and shaped to accommodate insertion of leads 300 and the mechanical retention of the leads 300 in the openings. Of course, side walls 210 may be formed around the leads 300, in which case the openings 212 are shaped to the leads 300 by virtue of the forming process.

The side walls 210 are preferably molded from an insulative, polymeric material, such as a liquid crystal polymer. One suitable liquid crystal polymer is VECTRA™ E 130i, which is available from Ticona. Of course, housing 200 may be made of any suitable organic or inorganic material or combination of materials. The openings 212 may be molded into the side walls 210 or may be formed after molding by removing material from the side walls 210. Further, the side walls 210 may be formed together as a single unit or, alternatively, molded separately and then joined together using an adhesive or other suitable means.

End plate 220 may be formed of a ceramic material, for example, or another material that can be made flat to support microdisplay die 100 without distorting a visual display produced by the microdisplay die. The material may have high thermal conductivity to convey heat away from the die 100, but this may not be necessary if cooling of the dies through the end plate 220 is not needed. The end plate 220 may also include a recess for positioning the die(s). The end plate 220 may be a separate piece, as shown in FIGS. 6–11, or may be formed integrally with the sidewalls 210, such as in a common molding step. The end plate 220 shown in FIGS. 6–11 is molded into a groove 211 formed in side walls 210, e.g., by molding the side walls 210 around the end plate 220. Moreover, leads 300 may be inserted into openings in housing 200 or the housing 200 may be molded around the leads 300, for example, using injection molding.

As shown in FIGS. 6–11, side walls 210 may include a recess 219 for receiving the cover plate 400. Cover plate 400 includes an aperture 410 in the illustrated embodiment. When cover plate 400 is mounted to housing 200, aperture 410 exposes all or a portion of plate 110 depending on how the aperture is fit to the plate 110. An adhesive may be applied to the recess and/or the edges of the cover plate 400 to secure the cover plate 400 to the housing 200. Other mechanisms for mounting the cover plate 400 to the housing 200 may be used as well, for example, the cover plate 400 may be adhered to the housing 200 without the use of a recess, the cover plate 400 may clip or snap to the housing 200, be press fit, or heat sealed, or be permanently or removably attached by other means.

FIG. 8 illustrates leads 300 held in a side wall 210*c*. Of course, the die package 10 may include leads other than leads 300. FIG. 8 shows two separate designs: lead 300*a* and lead 300*b*. The leads 300 illustrated in FIG. 8 are intended to be exemplary. It should be understood that other lead designs may be used in connection with the present invention. Leads 300*a* and 300*b* have some common characteristics. Leads 300*a* and 300*b* (collectively referred to as leads 300) generally extend straight out away from sidewall 210*c*. Leads 300 include a internal lead portion 310 for establishing an electrical contact within housing 200, a retention portion 320 for securing within the openings 212 in sidewall 210*c*, and an external lead portion 330 extending outside of the sidewall 210*c*. The internal lead portion 310 may include a contact surface for receiving a jumper, wire, tape bond, or other electrical connector. The internal lead portion 310 may be smaller than the retention portion 320 to facilitate insertion of the leads 300 into the openings 212. The retention portion 320 may include one or more ridges having a wedge-like profile, for permitting insertion of lead 300 into opening 212, but resisting removal. In this regard, the ridge may deform the interior surface of opening 212. Alternatively, the retention portion 320 may have barbs or spurs to aid retention.

The external lead portion 330 is designed to contact a conductive lead or trace (not shown) of a substrate, for example, of a flexible printed circuit. The external lead portion 330 may include a stop 331 that engages the outer surface of sidewall 210*c* to prevent further insertion of lead 300 in the opening 212. The external lead portion 330 also includes a flexible portion 333, preferably made of a resilient conductive material, such as copper alloy. The resiliency of flexible portion 333 provides a normal force useful for making a good electrical contact to the conductive lead or trace on the substrate. As shown in FIG. 8, the flexible portion 333 of lead 300*a* is angled more than the flexible portion 333 of lead 300*b*, which increases the normal force and also positions lead 300*b* to contact the substrate. Leads 300 include a contact portion 335. As shown in FIG. 8, the contact portion 335 has bulb-like shape with an angular surface portion and a relatively straight surface portion opposite the angular surface portion. Of course, other shapes are possible. The example shown in FIG. 8 is designed to permit the contact portions 335 of leads 300 to contact conductive landings or pads provided in two rows on the FPC or other substrate. Of course, one or more additional rows of leads 300 may be provided that include contact portions 335 facing in the opposite direction as the contact portions 335 of leads 300 shown in FIG. 8. In this way, contact may be made to landings or pads on both sides of a FPC or other substrate. The contact portions 335 of these additional leads 300 may be aligned with or staggered (e.g., horizontally relative to FIG. 8 and/or into the plane of the page) with those contact portions 335 facing in the opposite direction.

The external lead portions 330 of leads 300a and 300b are positioned to contact a substrate 800 inserted through the slot 520 in shroud body 510. As shown, the slot 520 may be flared to make insertion of the substrate 800 easier. As the substrate 800 is inserted into the slot 520, it engages the angular surfaces of leads 300a and 300b and, upon further insertion, slides along the angular surface, displacing the contact portions 333 and causing flexing of the flexible portions 333. Upon further insertion of the substrate 800, the contact portions 333 slide along the upper surface of the substrate 800. Insertion of the substrate 800 stops when the substrate 800 abuts the sidewall 210c. In this position, the contact portions 333 of leads 300a engage a first row of contact pads or traces on substrate 800 and the contact portions 333 of leads 300b contact a second row of contact pads or traces on substrate 800. As will be appreciated by those skilled in that art, a low insertion force is needed to insert the substrate 800 into the shroud 500 to make electrical connection with the leads 300.

The shroud body 510 includes opening 530 that is designed to cover leads 300 and accommodate their flexing upon insertion of substrate 800. Shroud body 510 may also include an opening 550 opposite the contact portions 333 of leads 300. Opening 550 provides access to the contact portions of leads 300, e.g., for testing after the shroud has been inserted. Moreover, if substrate 800 is a flexible circuit board, for example, the leads 300 may push the flexible circuit board into the opening 550. This enhances the ability of the relatively flat surface of the contact portions 333 to retain the flexible circuit board to the die package 10.

In practice, one end of the flexible circuit board 800 may be coupled to the die package 10 and another end may be connected to a printed circuit board either by soldering or using a flexible circuit board connector. If soldering is used to connect the flexible circuit board to the printed circuit board and the die carrier houses a heat sensitive die, it may be best to solder the flexible circuit board 800 to the printed circuit board first to avoid thermal damage to the heat sensitive die. The printed circuit board may include one or more active and/or passive circuit elements, such as a microprocessor, digital signal processor, or other electronic components.

As a further alternative, instead of connecting the flexible circuit board 800 to a printed circuit board having active and/or passive elements, a portion of the flexible circuit board 800 may include a stiffener. The stiffened portion of the flexible circuit board 800 can thus replace the printed circuit board described above.

Substrate 800 has been described on occasion herein as being flexible. It should be understood that the present invention may be practiced with a standard circuit board or other substrate.

Figure 12:
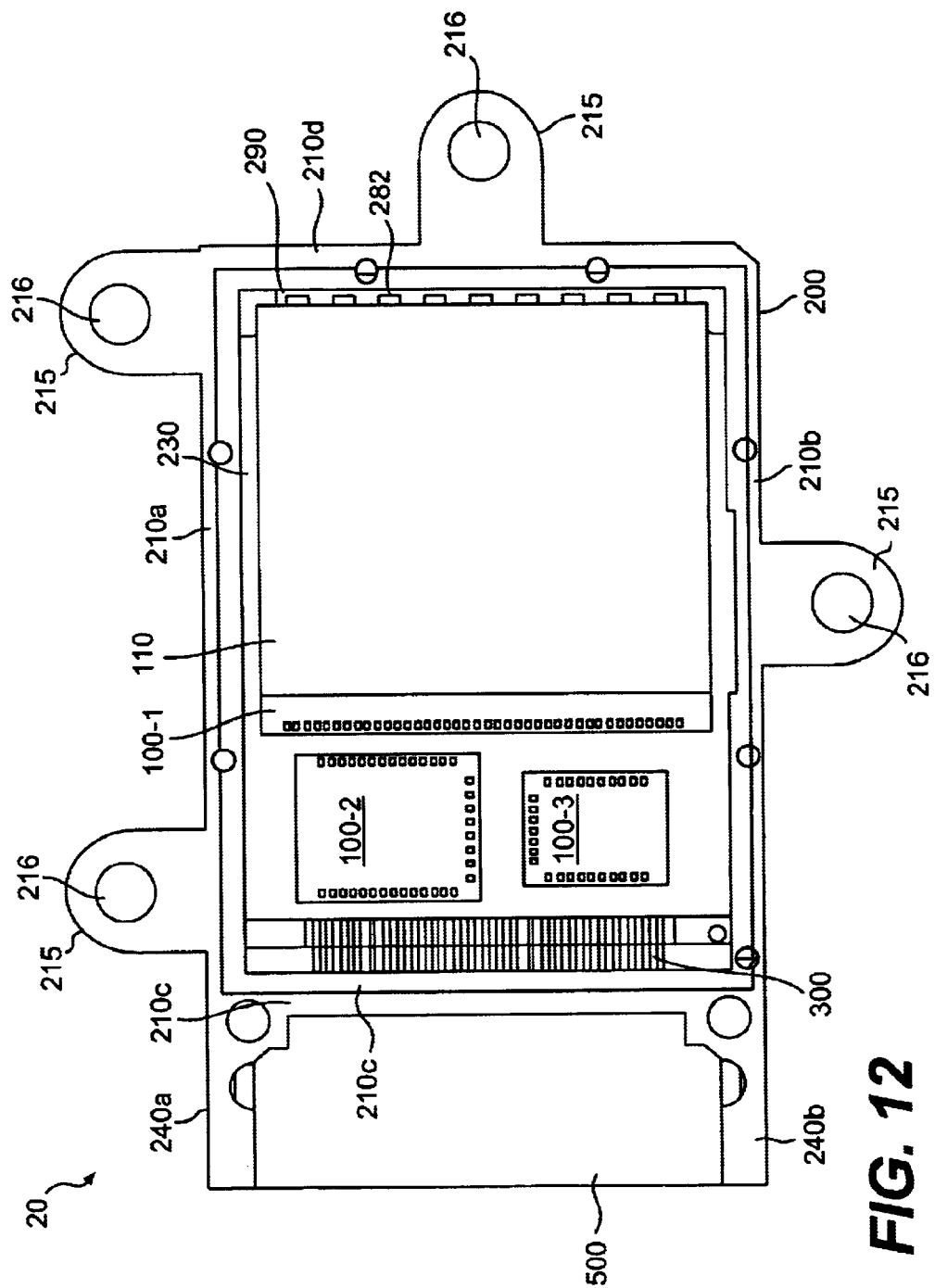
FIG. 12 shows a top view of a second embodiment of a housing for a die package that accommodates multiple dies.

FIG. 12 illustrates a further embodiment of a die package 20 that includes a housing for holding multiple dies 100. The die package 20 has features similar to those of die package 10 described above. As shown in FIG. 12, the cavity 230 of housing 200 is dimensioned to accommodate multiple dies 100. In the example of FIG. 12, the cavity 230 accommodates three dies: die 100-1, die 100-2, and die 100-3. Of course, the number and layout of dies 100 is shown as an example. In FIG. 12, die 100-1 may be a microdisplay die, for example, or a data collective device die. Dies 100-2 and 100-3 may perform other functions necessary or useful to the operation of die 100-1. Dies 100-2 and 100-3 may be driver dies, for example. The leads 300 may connect to dies 100-2 and 100-3. Dies 100-2 and 100-3 may connect to each other and to die 100-1. Common power and/or ground planes may be provided for each of dies 100.

Figure 13:
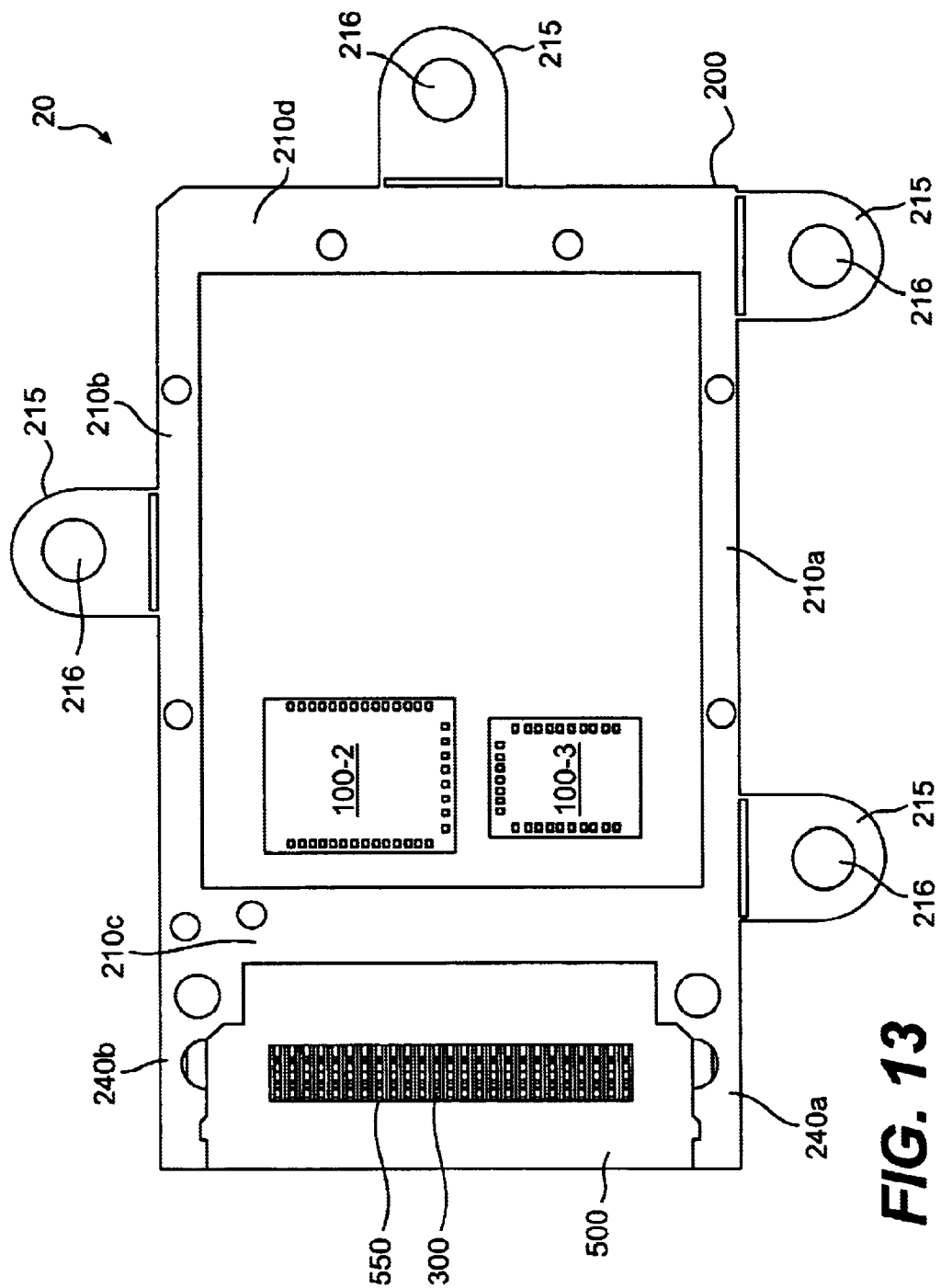
FIG. 13 illustrates a bottom view of a third embodiment of a housing for a die package that accommodates multiple dies.
Figure 14:
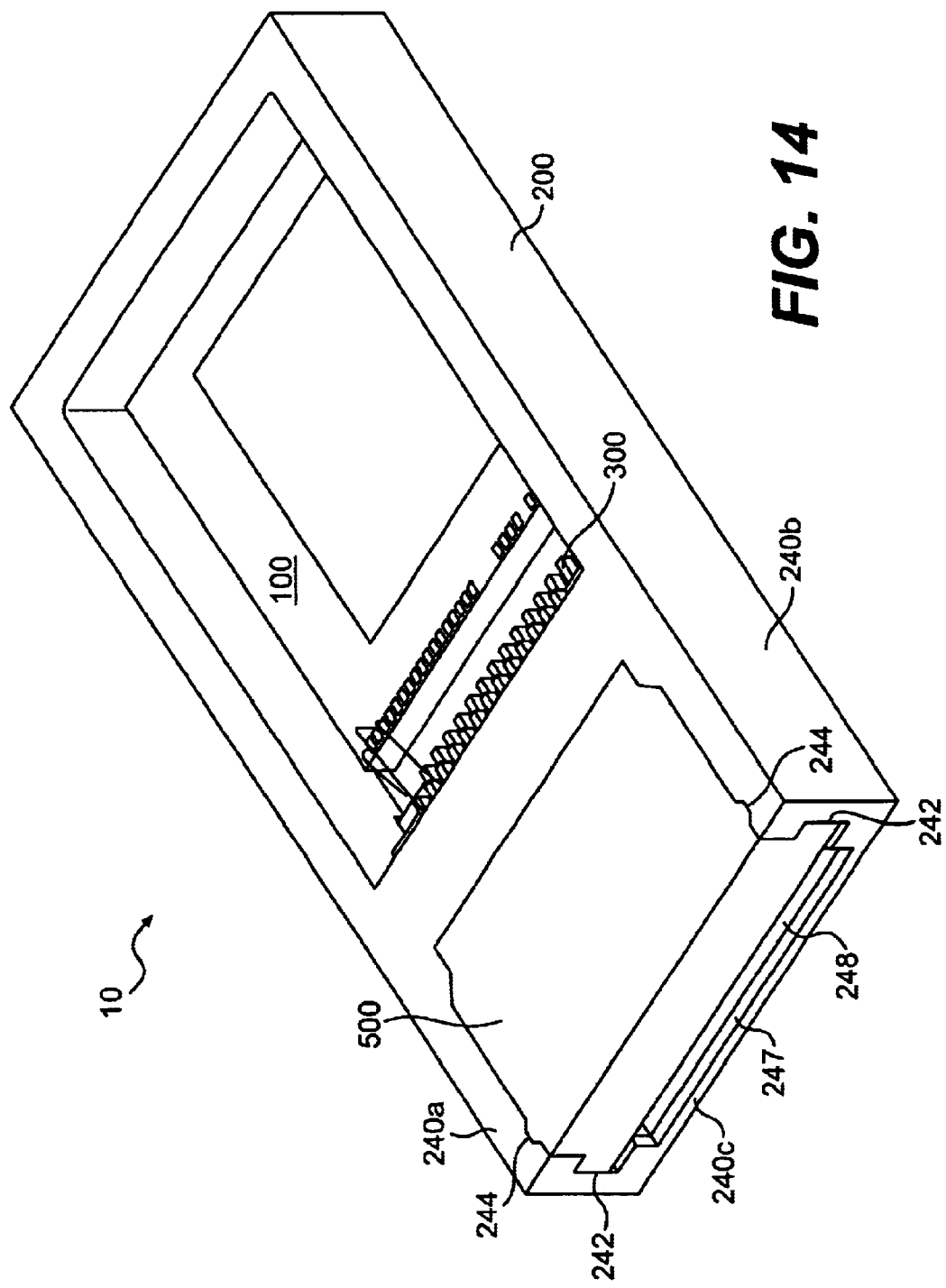
FIG. 14 illustrates a further embodiment of a die package in accordance with the present invention.
Figure 15:
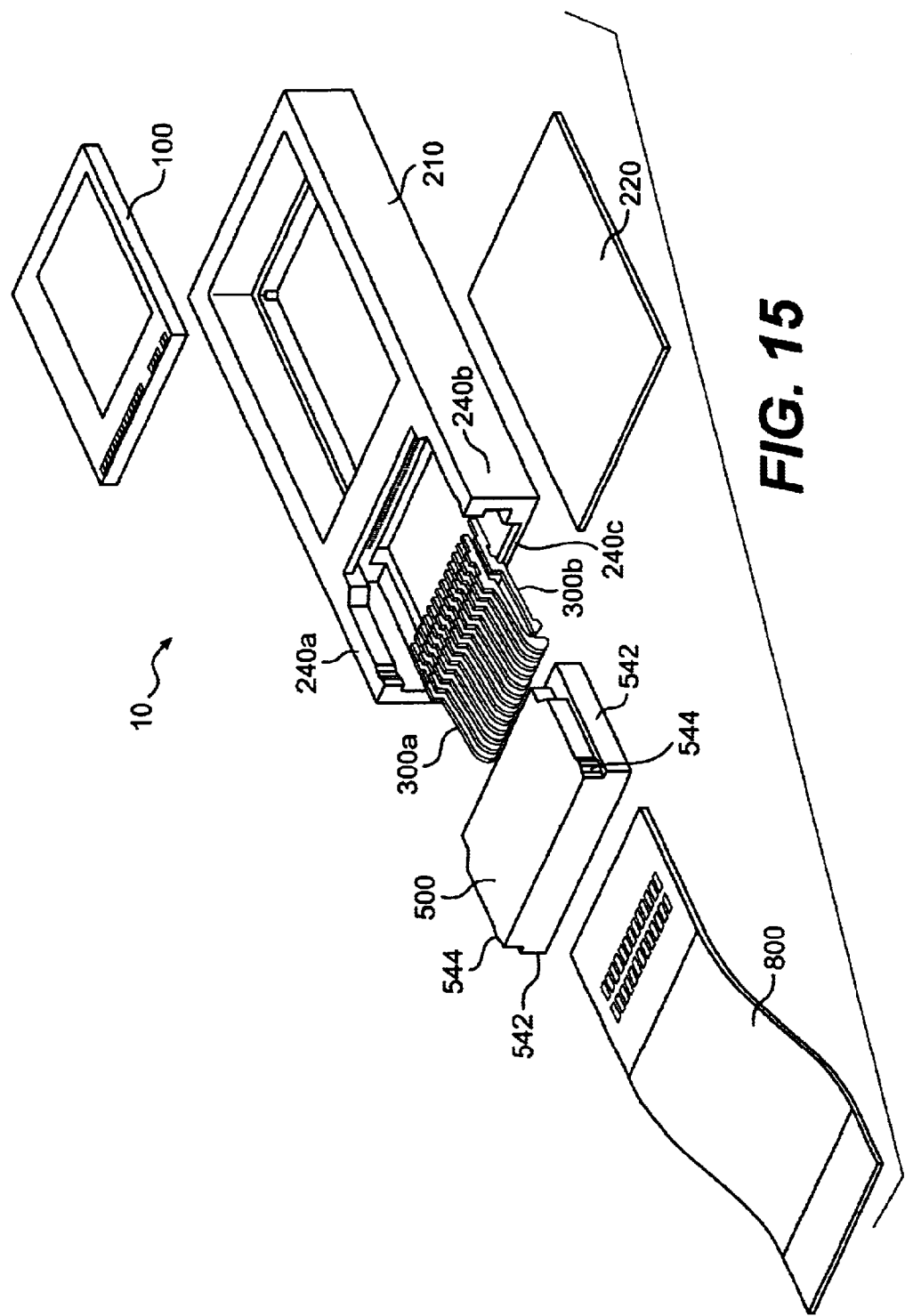
FIG. 15 illustrates an exploded view of the die package of FIG. 14 together with a substrate, in this case an FPC.
Figure 16:
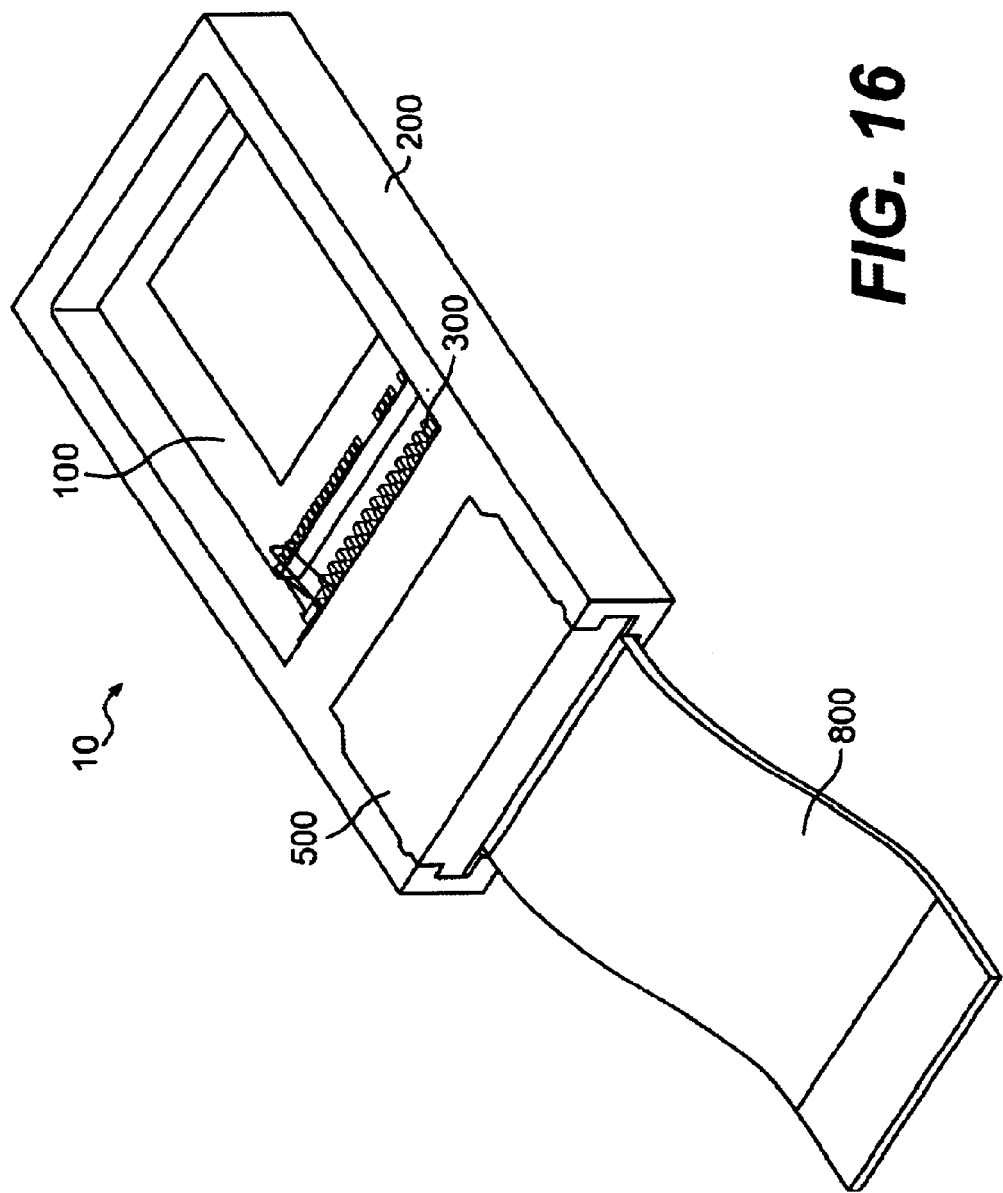
FIG. 16 illustrates a view of the die package of FIG. 14 with the FPC inserted.
Figure 17:
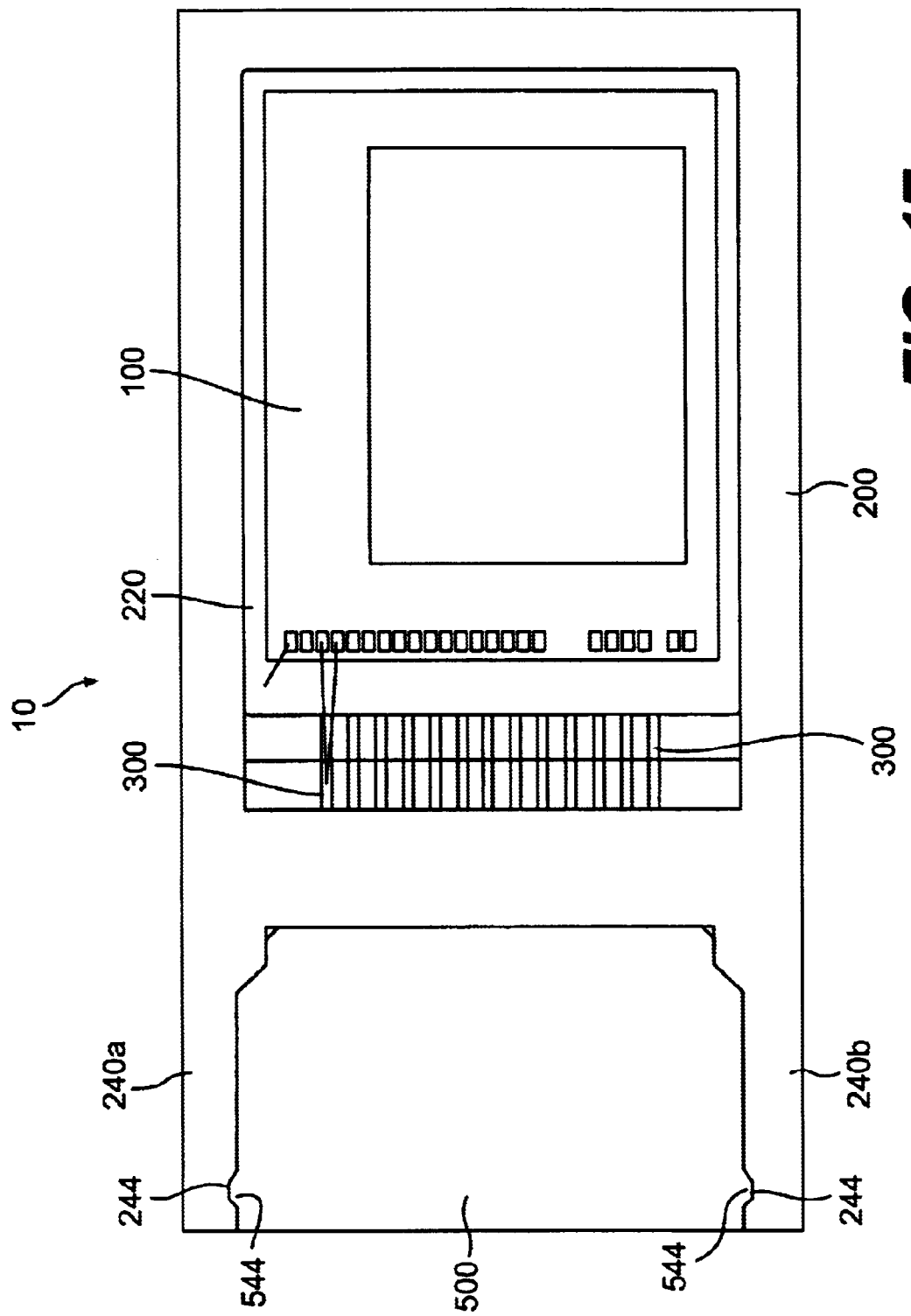
FIG. 17 shows a top view of the die package of FIG. 14.

FIG. 13 illustrates a further embodiment of a die package 20 that includes a housing for holding multiple dies 100. The embodiment of FIG. 13 is similar to that of FIG. 12. However, in FIG. 13, the dies 100-2 and 100-3 are provided on the opposite side of the housing 200 as the die 100-1. This arrangement may be desirable for various reasons, including signal separation, heat, and/or size constraints.

It will be apparent to those skilled in the art that various modifications and variations can be made without departing from the scope or spirit of the invention. For example, the leads 300 may be "L" or "F" shaped to accommodate coupling to a FPC or other substrate at a right angle to the plane of the upper surface of the housing 200. In addition, additional mechanism(s) may be provided to retain the FPC or other substrate in contact with the leads 300 of the die carrier. Such mechanisms may include snaps, latches, posts, clips, or other devices.

FIGS. 14–18 illustrate a further exemplary embodiment of die package 10 according to the present invention. The embodiment of FIGS. 14–18 includes several features in common with the embodiment of FIGS. 1–11, including housing 200, leads 300, and shroud 500. A description of each feature and alternatives will not be repeated for brevity, but an understanding will be had based on the drawings and from the description above. As shown in FIGS. 14–18, housing 200 includes an extension 240 having arms 240a and 240b and a base portion 240c joining the arms 240a and 240b. The base portion 240c includes a cutaway 247 that, together with shroud 500, defines a slot 248 through which the substrate 800 (such as an FPC) can be inserted. As above, arms 240a and 240b include grooves 242 for slidably receiving the shroud 500 and notches 244. The grooves 242 receive tongues 542 of the shroud 500 to guide mating of the shroud 500 and the housing 200. The notches 244 receive projections 544 of the shroud to detachably retain the shroud 500 and the housing 200. The embodiment of FIGS. 14–18 does not include mounting tabs for mounting the die package. However, such mounting tabs may be provided if desired.

Figure 18:
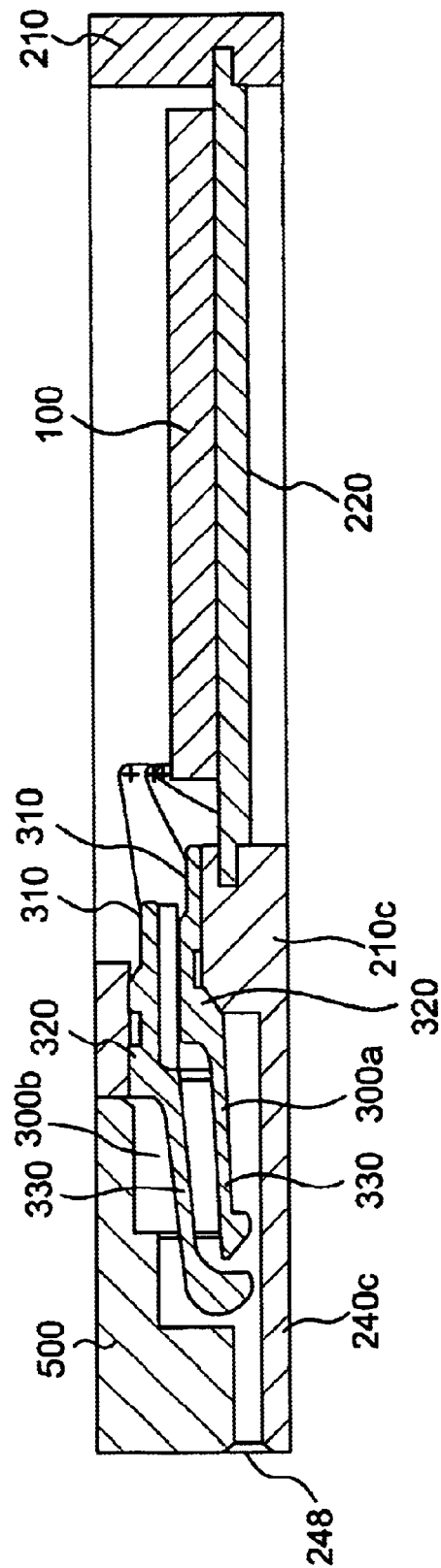
FIG. 18 illustrates a cross section of the die package of FIG. 14 taken through the leads 300.

In accordance with the embodiment of FIGS. 14–18, the substrate 800 is inserted through the slot 248 and between the shroud 500 and the extension 240c. As the substrate 800 slides through the slot 248, it contacts and flexes the leads 300. The flexed leads 300 thereby press downward (according to the perspective shown in FIG. 18) on the surface of the substrate 800. As insertion continues, substrate 800 will abut against housing 200, thereby restricting further insertion. In this position, leads 300 press against contact pads or traces on the surface of substrate 800 to form electrical connections as described above. As shown in FIG. 18, the extension 240c does not include an opening, such as the opening 550 in FIG. 8. However, such an opening may be provided if desired.

FIGS. 14–18 further illustrate examples of electrical connections that may be made with the die 100. As shown in FIGS. 14–18, the leads 300 are arranged in multiple tiers, e.g., two as shown in the example of FIGS. 14–18, but other arrangements may have a single tier or three or more tiers. An internal lead portion 310 of the leads 300 may include a contact surface for a jumper, wire, tape bond, or other electrical connector. The example of FIGS. 14–18 show a wire bonding arrangement between the leads and bonding pads of the die 100. Of course, the illustrated connection are intended as an example according to which other electrical may be made.

FIGS. 14–18 further show an electrical connection between end plate 220 and die 100. End plate 220 may be formed of an electrically conductive material (such as, for example, copper) or an insulative material that includes one or more conductive portions, such as traces, wirings, bias planes, and/or other electrical structures. As shown in the example of FIGS. 14–18, the electrical connection may be a bonding wire, but may be multiple bonding wires or other suitable electrical connection. For example, end plate 220 may include a ground plane for providing ground to the die 100, or another stable electrical bias.

Figure 19:
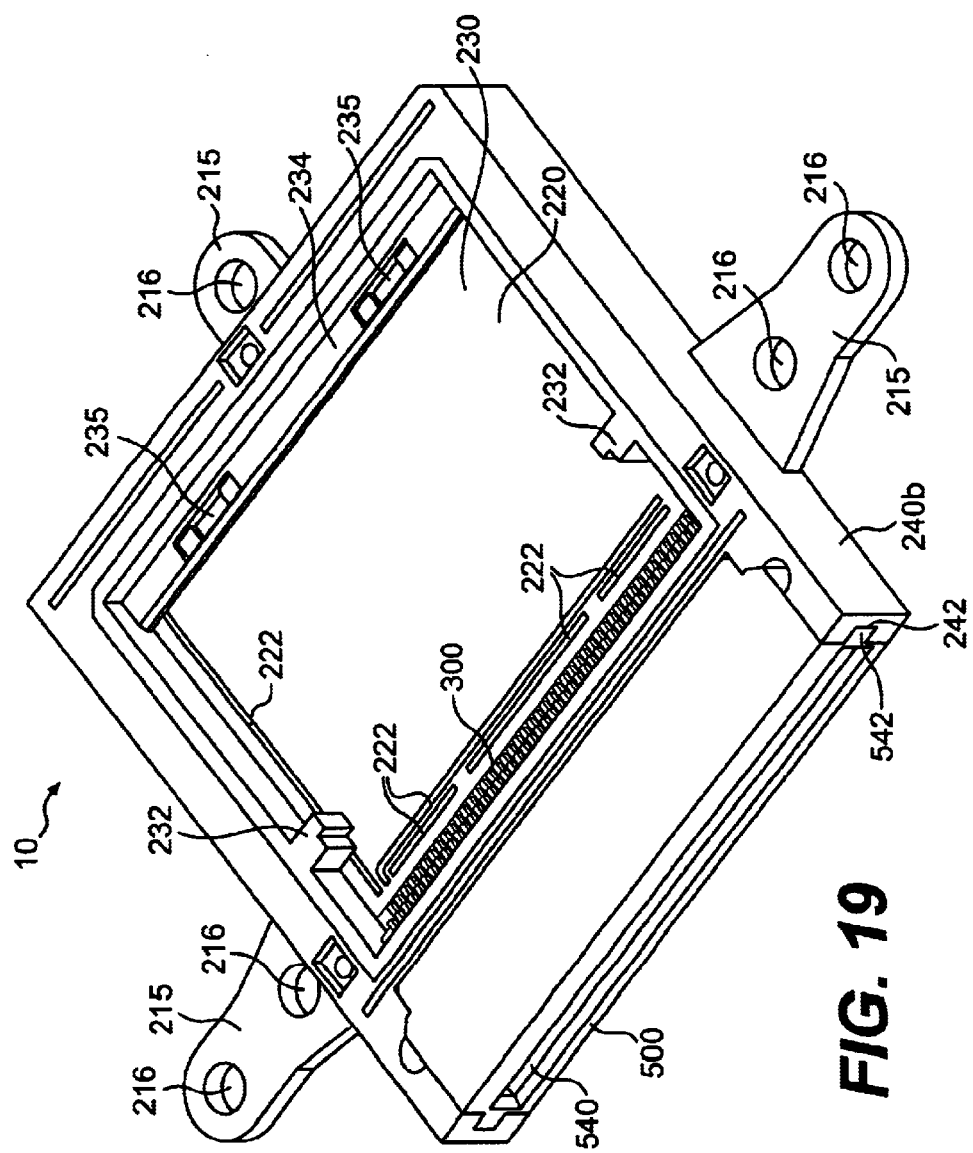
FIG. 19 illustrates a further embodiment of a die package in accordance with the present invention.

FIGS. 19–32 illustrate a further exemplary embodiment of a die package 10 in accordance with the present invention. As above, the embodiment of FIGS. 19–32 includes several features in common with the embodiments of FIGS. 1–18, including housing 200, leads 300, and shroud 500. A description of each feature and alternatives will not be repeated for brevity, but an understanding will be had based on the drawings and from the description above. FIG. 19 provides a view of the die package 10 without the die(s). As shown in various of FIGS. 19–32, the cavity 230 of the housing 200 includes dams 232 that extend from the interior surface of the side walls 210 and a ledge 234 with one or more holes 235 (e.g., two holes 235, in the present example).

Figure 20:
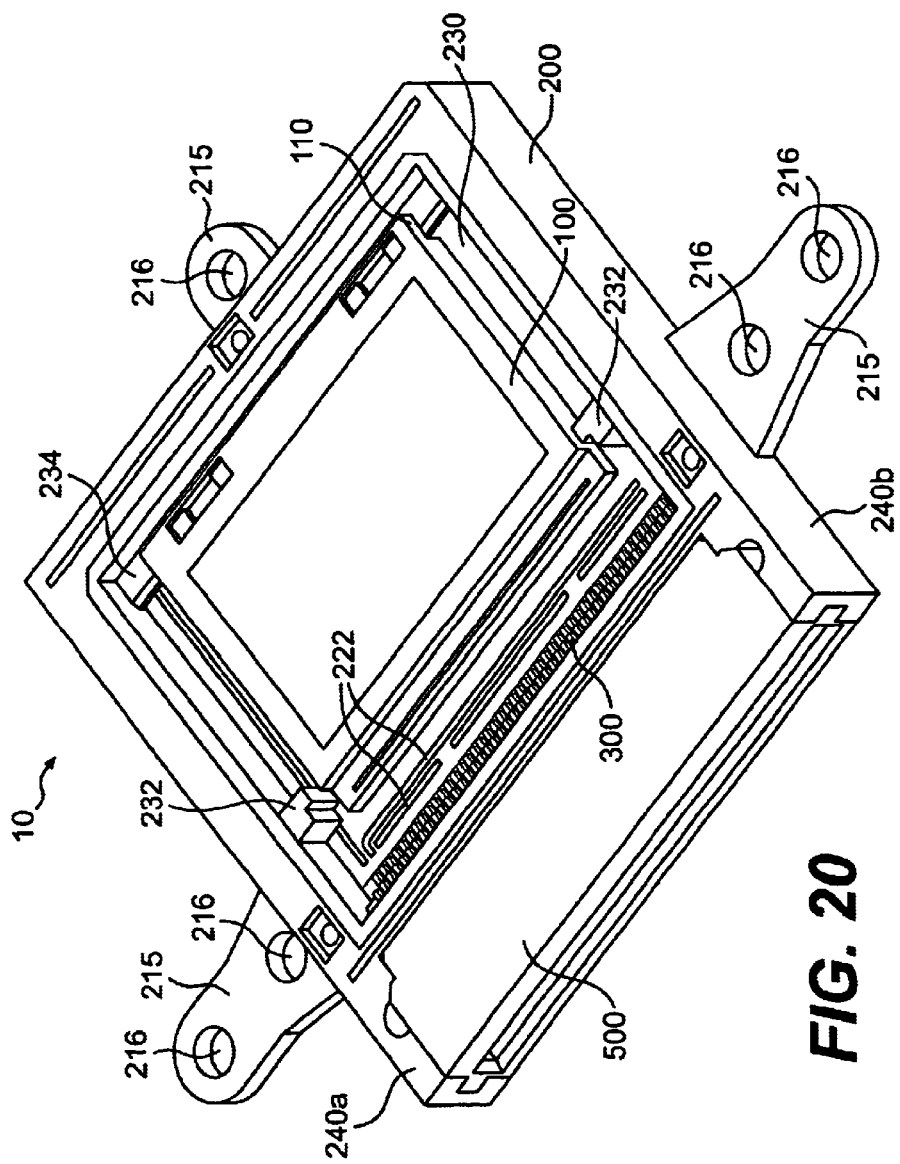
FIG. 20 shows the die package of FIG. 19 with a microdisplay die mounted in a cavity thereof.

End plate 220 may be made of material that can support the die 100, but also support electrically conductive traces 222. For example, end plate 220 may be made of a ceramic material having electrically conductive traces 222. The electrically conductive traces 222 may be made of any suitable electrically conductive material, for example, copper, gold, silver, or a suitable alloy. The traces 222 may be formed, for example, by molding into the end plate 220 or screen printing on the end plate 220. As shown in FIGS. 19 and 20, for example, at least a portion of the electrically conductive traces 222 may be exposed on an interior of cavity 230 to allow electrical connections to the leads 300 and/or the die 100. If desired, portions of the traces 222 may be coated with a protective insulator or be embedded in the end plate, forming a multilayer conductor. The traces may be used, for example, for ground voltage, power voltage, another fixed bias, or a signal bias, or a combination of the foregoing.

FIG. 20 illustrates the exemplary embodiment of the die package 10 of FIG. 19 with a microdisplay die 100 within cavity 230. As shown in FIG. 20, the cavity 230 receives the die 100 so that some of the traces 222 are located between the leads 300 and the bonding pads of the die 100. Consequently, electrical connections can be made between the traces 222 and the bonding pads, between the leads 300 and the traces 222, and between the leads 300 and the bonding pads.

The housing 200 may be designed so that the die 100 fits snugly between dams 232. Dams 232 may be used to restrict the flow of encapsulant material (not shown) that can be used to flow over the electrical connections (e.g., wires, tape bonds, etc.) between leads 300, traces 222, and bonding pads of the die 100. The encapsulant provides structural support for the electrical connections and helps to protect the electrical connections from oxidation, breaks, and/or other effects that could impair current flow.

Figure 21:
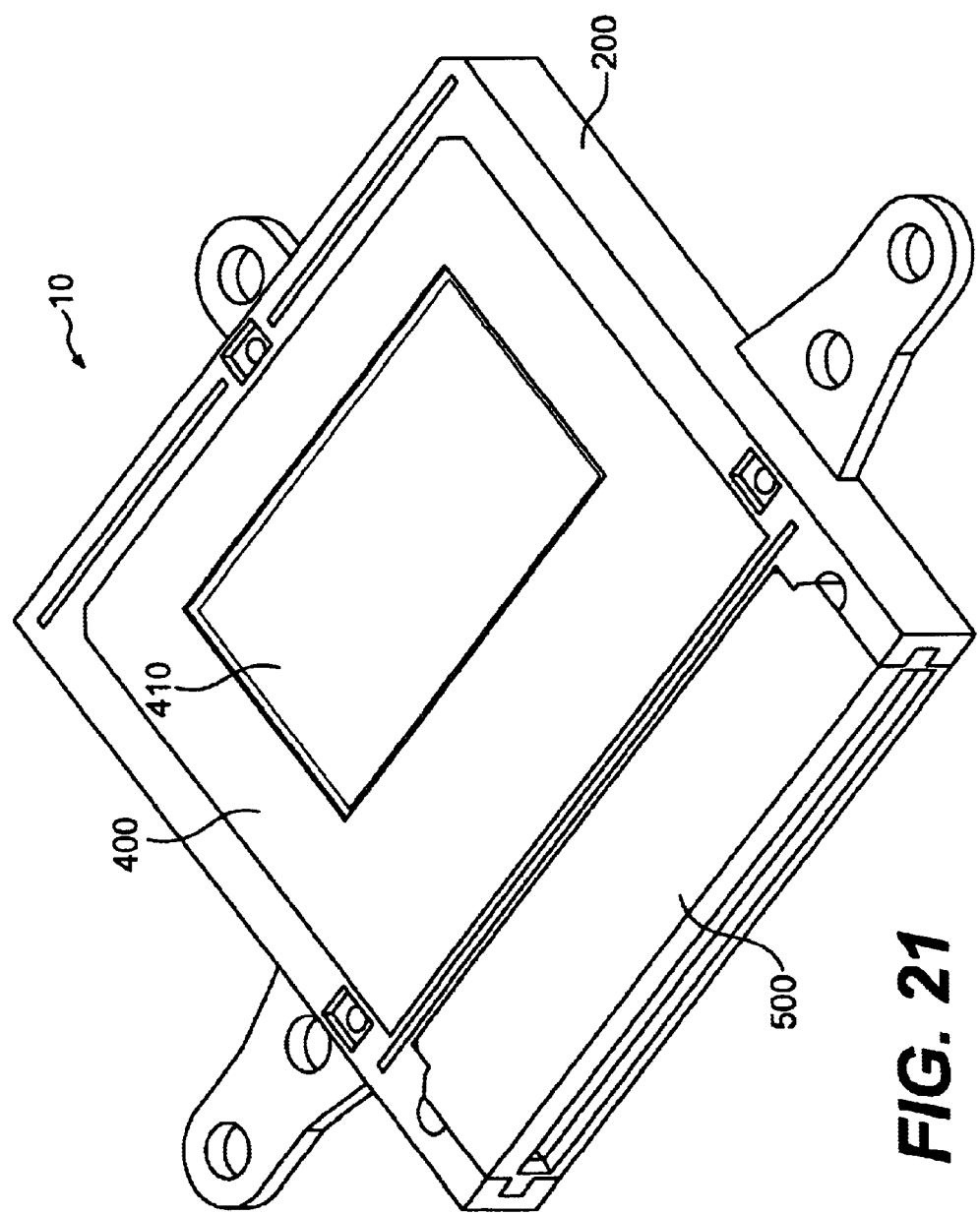
FIG. 21 illustrates the die package of FIG. 20 with the cover plate provided.
Figure 22:
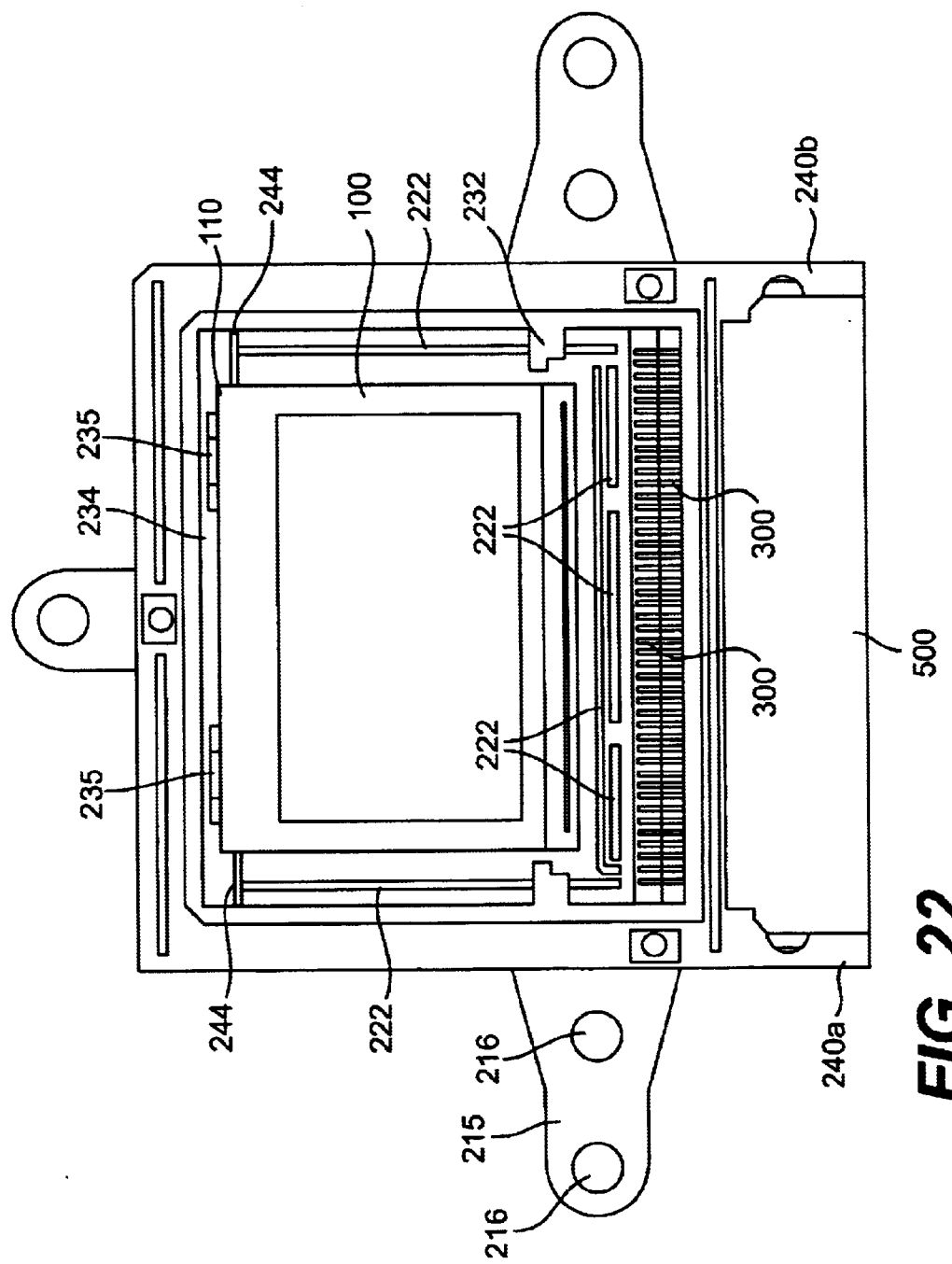
FIG. 22 provides a top view of the die package shown in FIG. 20.
Figure 23:
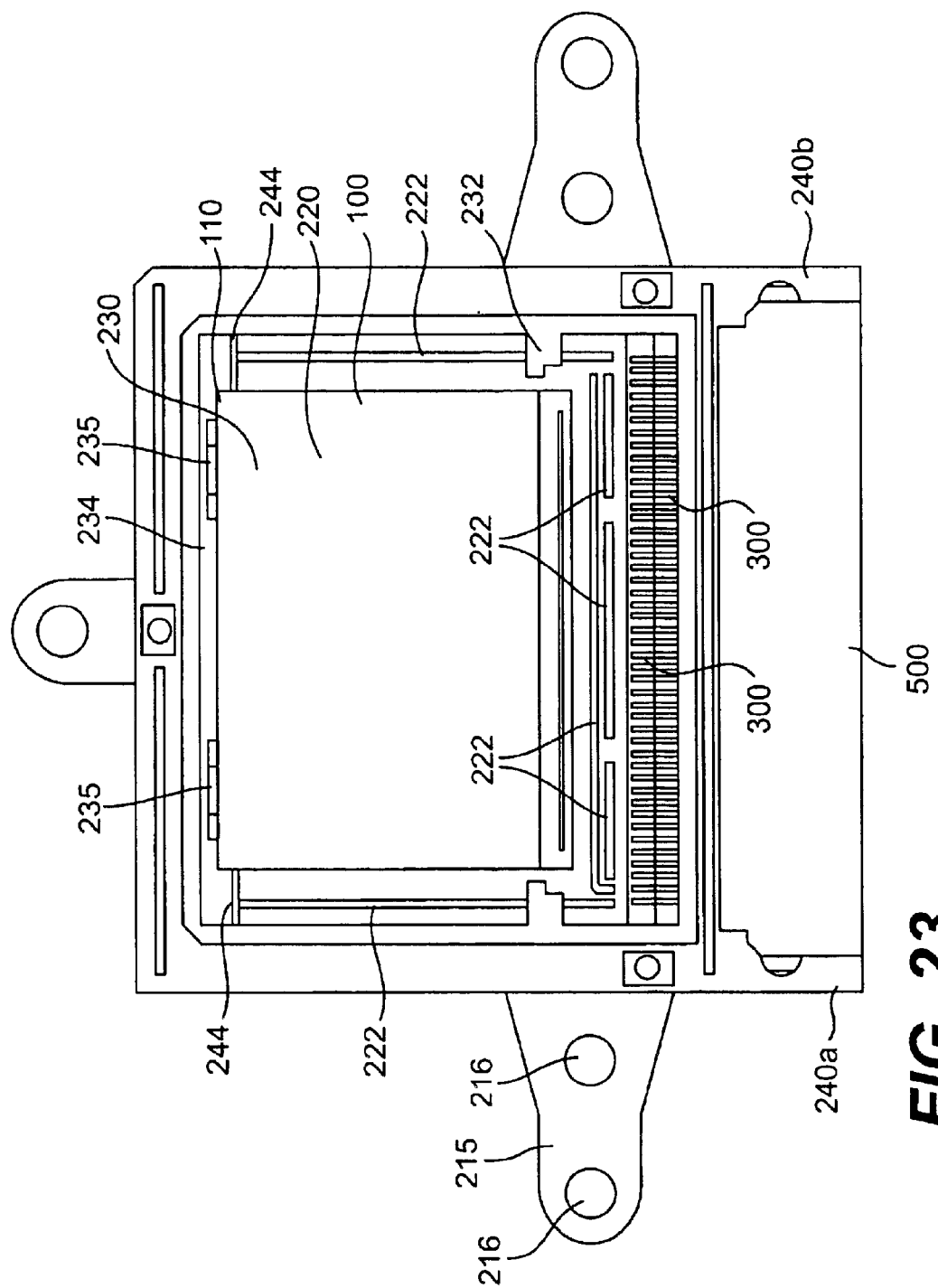
FIG. 23 provides a top view of the die package shown in FIG. 19.
Figure 24:
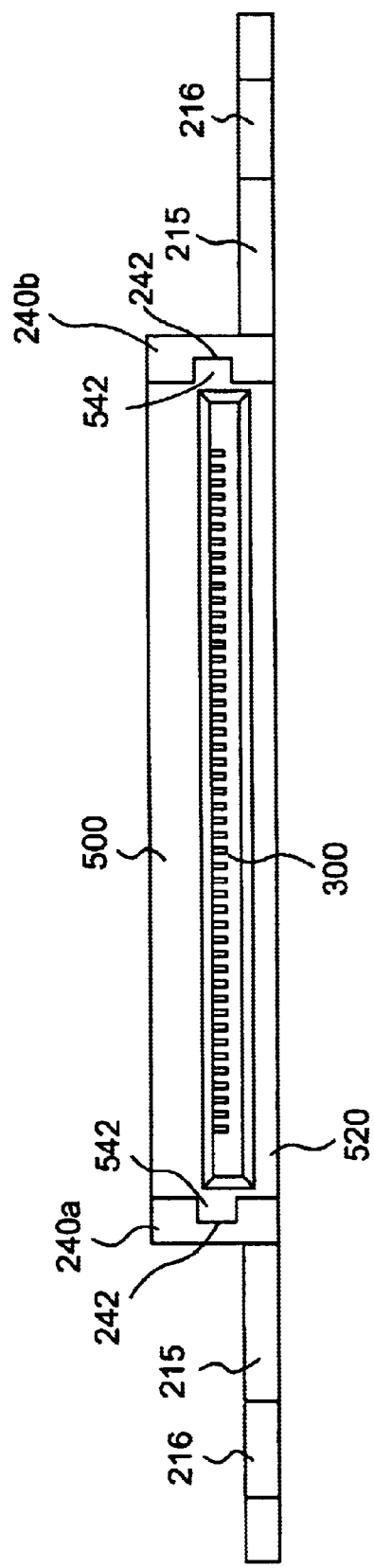
FIG. 24 shows a front view of the die package of FIG. 19 looking into the slot.

FIG. 21 shows the exemplary embodiment of the die package 10 with a cover plate 400 having an aperture 410 to expose a viewing area of the microdisplay die 100. FIG. 22 provides a top view of the arrangement shown in FIG. 20. FIG. 23 shows a top view of the arrangement shown in FIG. 19. FIG. 24 provides a front view of the package 10 looking into the slot 520 of shroud 500.

Figure 25:
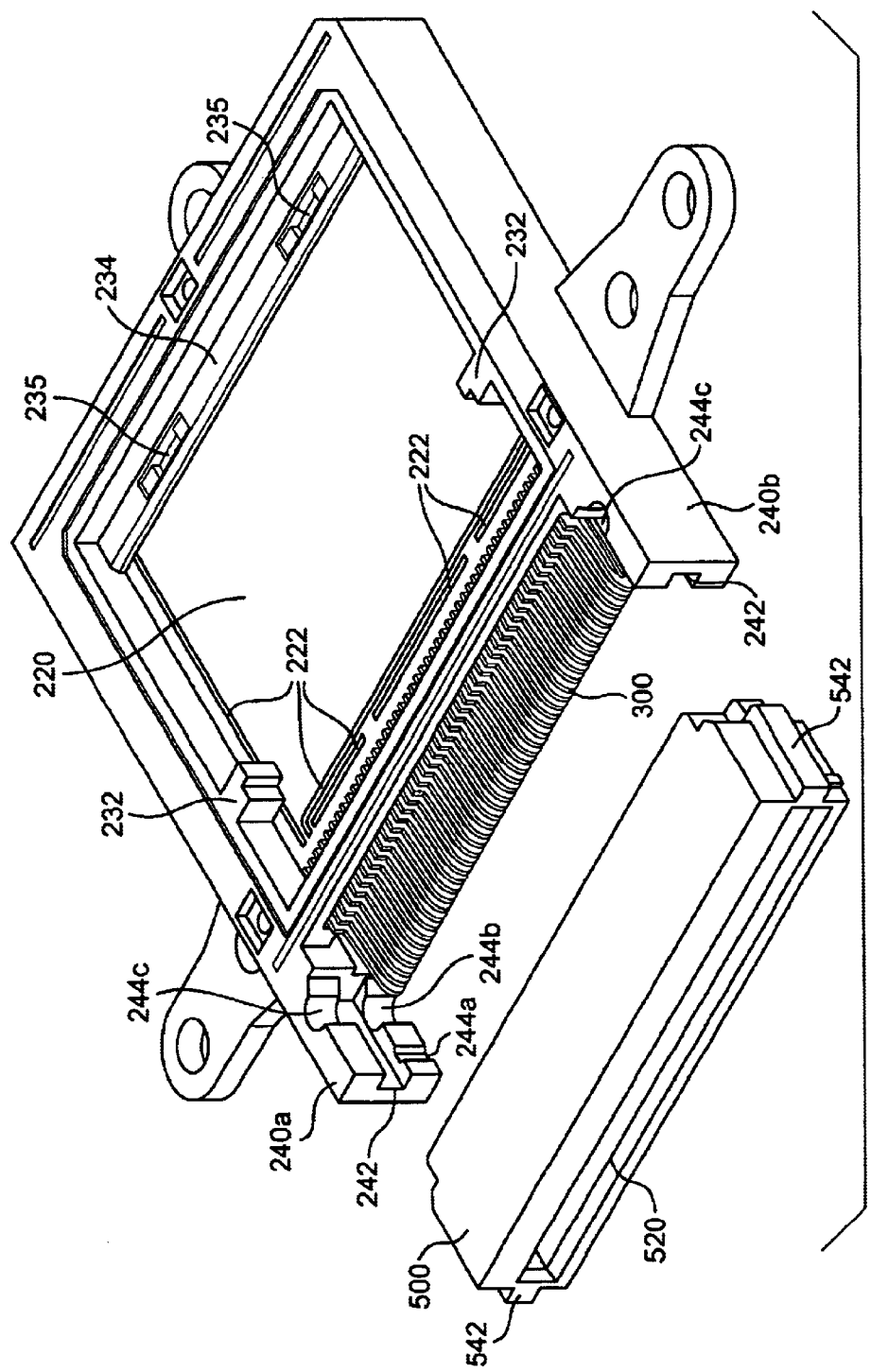
FIG. 25 illustrates the die package of FIG. 19 with the shroud removed.
Figure 26:
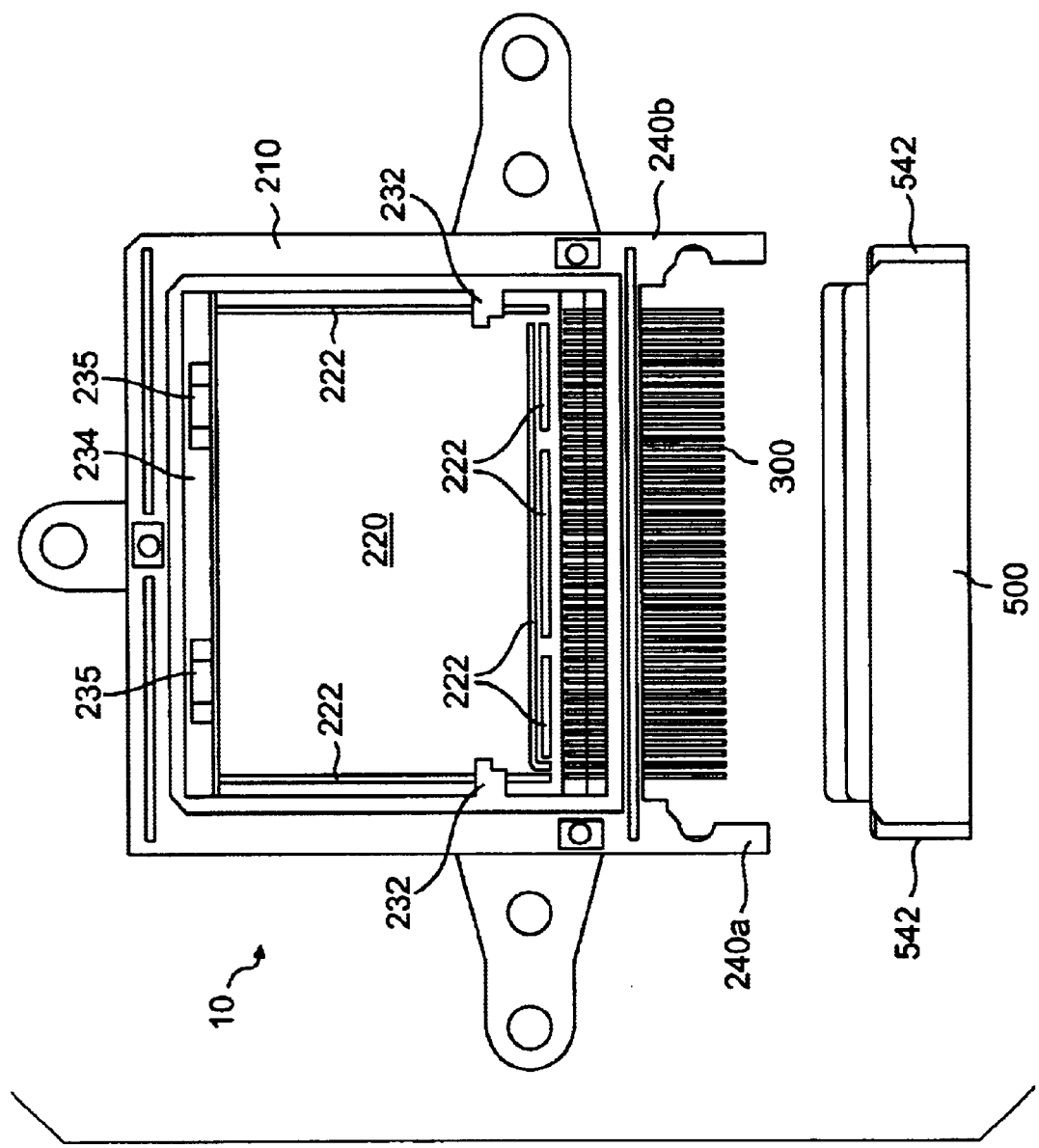
FIG. 26 shows a top view of FIG. 25.

FIGS. 25 and 26 illustrates the attachment of the shroud 500 to the arms 240a and 240b of the housing 200. As shown in FIG. 25, the arms 240a, 240b each include a groove 242 and multiple indents 244a, 244b, and 244c. Indents 244a interface with protrusions 544 on the shroud 500 for removably retaining the shroud 500 to the housing 200, as described above. Indents 244b and 244c may be used to relieve stresses on arms 240a, 240b when shroud 500 is inserted in housing 200. In particular, as the shroud 500 is inserted, protrusions 544 contact arms 240a, 240b and spread them apart, creating stresses in arms 240a, 240b. The indents 244b, 244c help to relieve the stresses and make insertion of the shroud 500 into housing 200 easier. In addition, indents 244b, 244c may be used as alignment areas for tools holding the package and/or provide access to assist in releasing the shroud 500.

Figure 27:
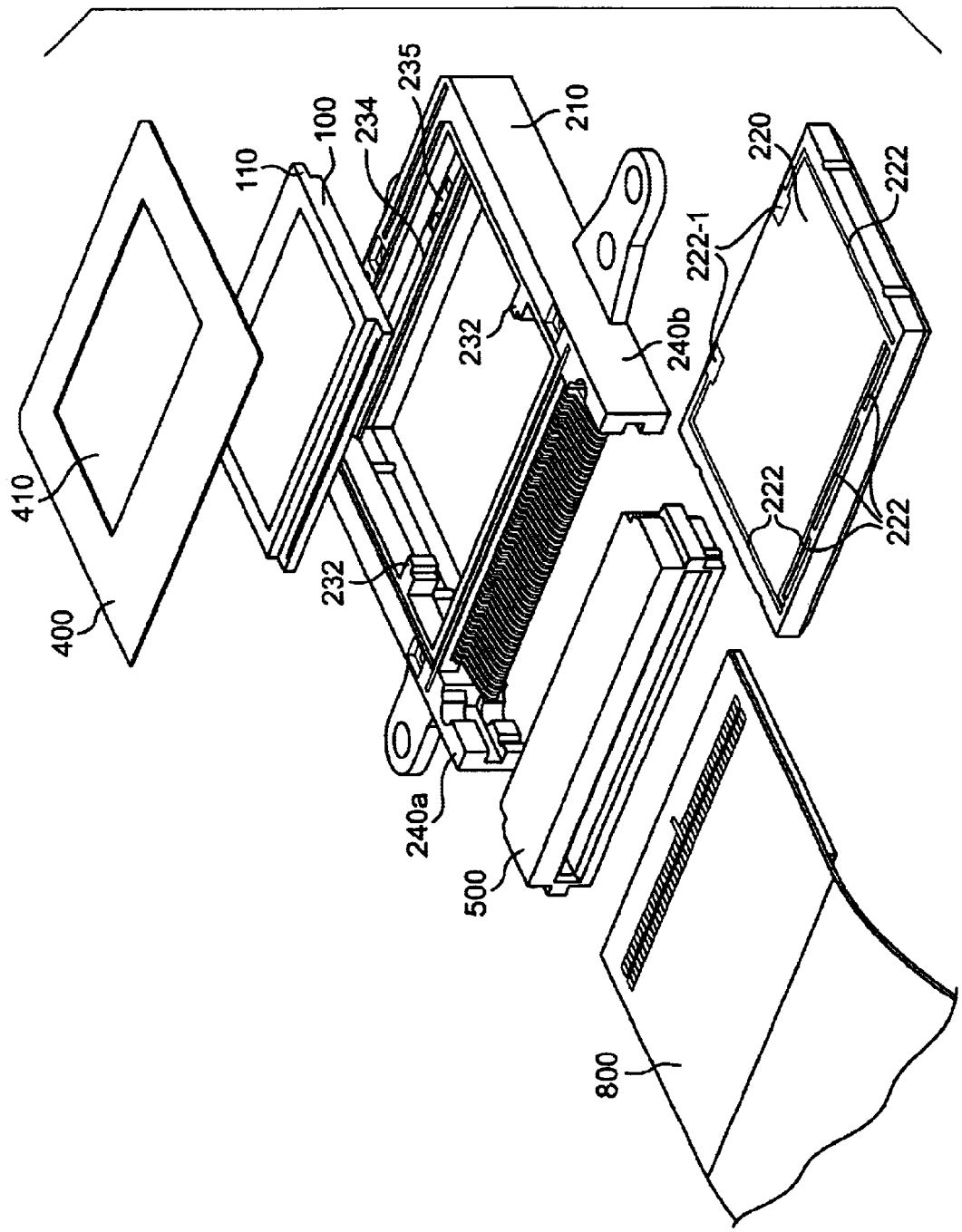
FIG. 27 shows an exploded view of the die package of FIG. 21 together with the substrate, in this case a flex cable.

FIG. 27 provides an exploded view of the die package 10, including die 100, housing 200, end plate 220, cover plate 400 with aperture 410, shroud 500, and FFC 800. FIG. 27 illustrates an example of how traces 222 may be provided on end plate 200. As shown in FIG. 27, the traces 222 may be provided on upper surface of the cover plate and adjacent the peripheries thereof. In the example of FIG. 27, a pair of traces 222 include pad regions 222-1 that are aligned with the holes 235 in ledge 234. The pad regions 222-1 are connected via traces 222 extending along the periphery of the end plate 220 to a position that can be wire bonded to the leads 300.

Figure 28:
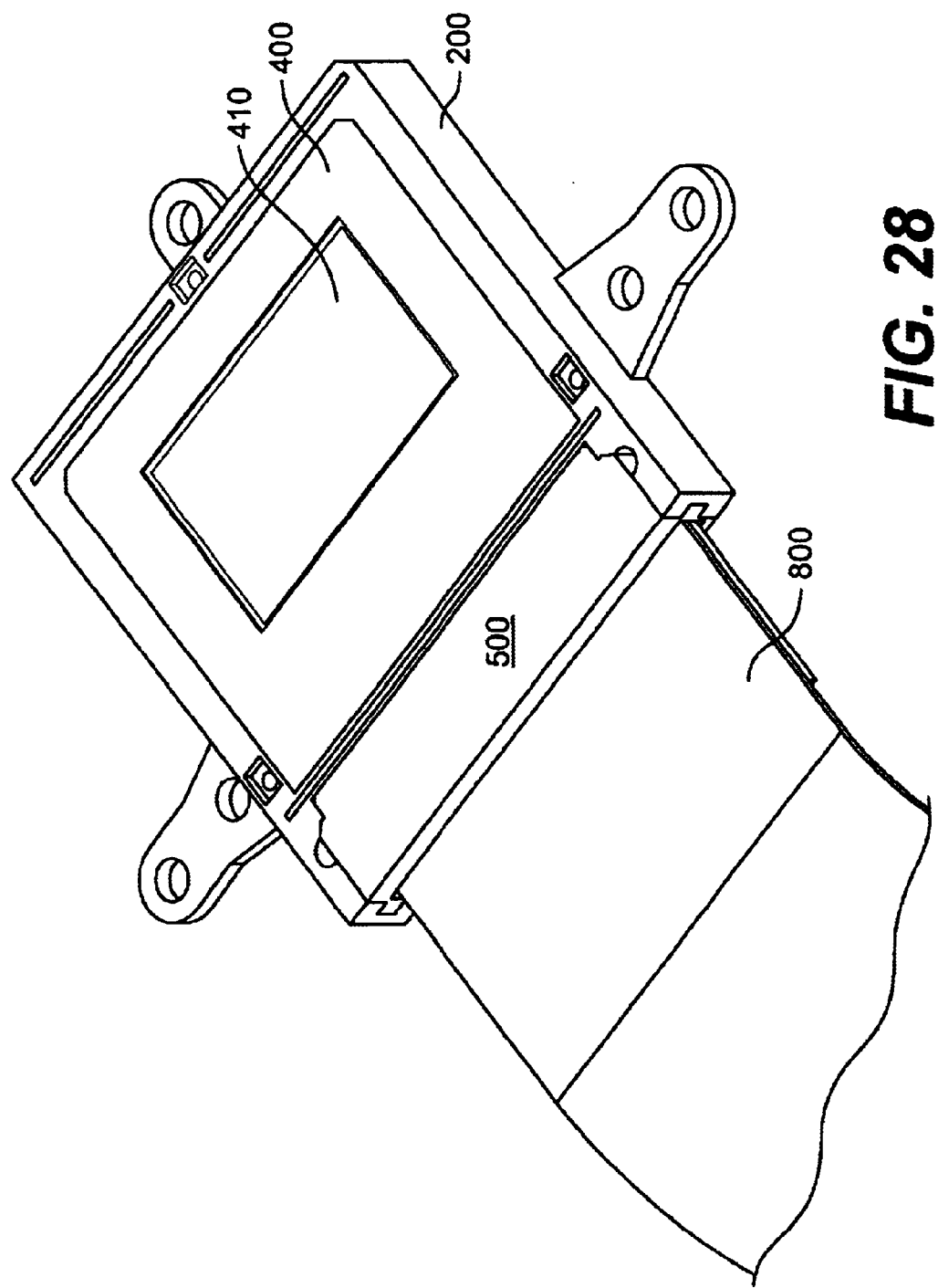
FIG. 28 shows a view of the die package of FIG. 21 coupled to the substrate.
Figure 29:
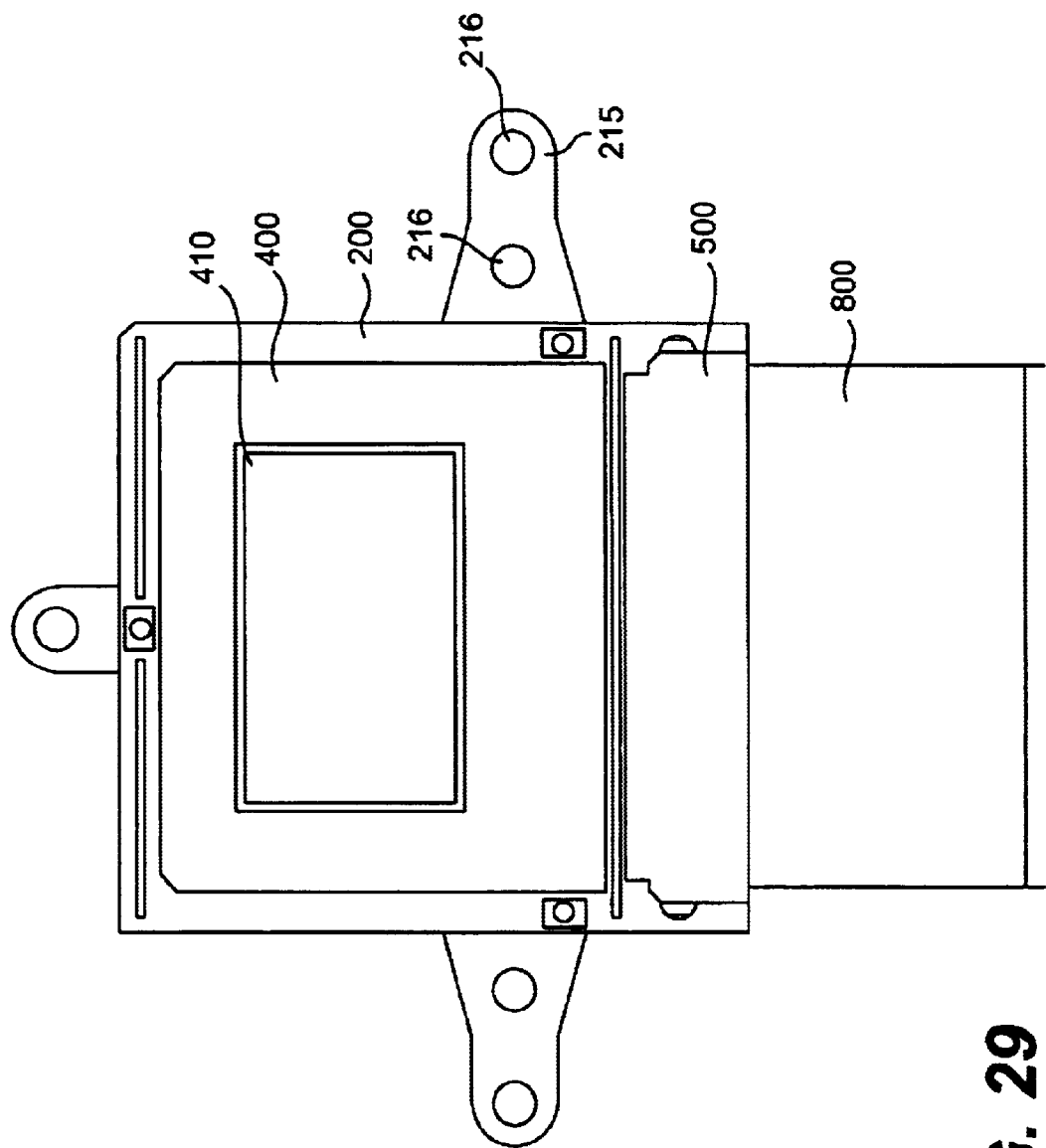
FIG. 29 shows a top view of FIG. 28.
Figure 30:
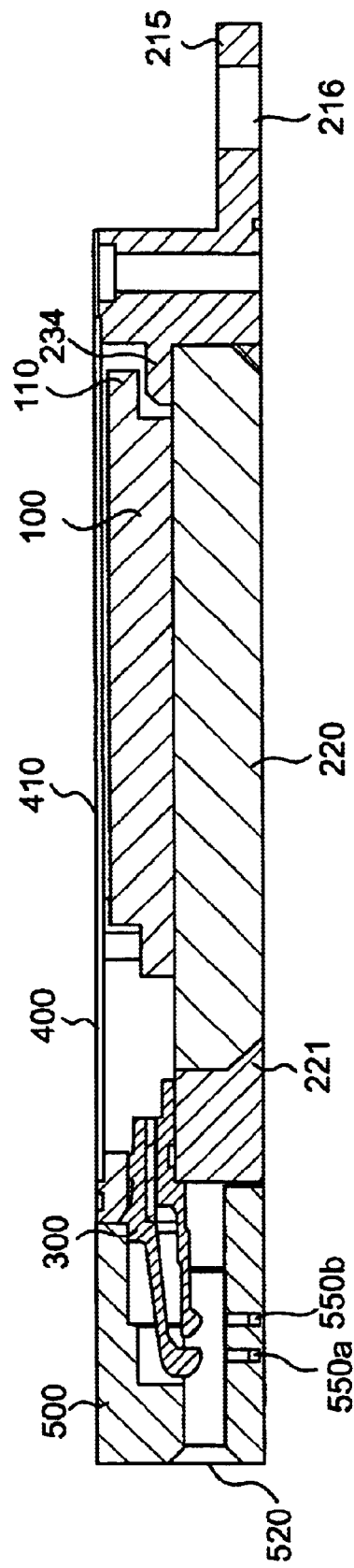
FIG. 30 illustrates a cross section of the die package of FIG. 21 taken through the leads.

FIGS. 28 and 29 illustrate the die package 10 with the FFC 800 inserted into the slot 520 of shroud 500. FIG. 30 provides a cross-sectional view of the die package 10. As shown in FIGS. 30–32, plate 110 provided on the die 100 can extend over the ledge 234. The holes 235 in the ledge may provide communication between the ledge and the end plate 220. The underside of the plate 110 may include conductive traces or film, such as an indium tin oxide coating that are transparent. The holes 235 and the space between the plate 110 and the ledge may be filled with a conductive epoxy to secure the plate and provide an electrical connection from the traces on the plate through the holes 235 and to a conductive pad 222-1 on the surface of the end plate 220 using the conductive epoxy as a medium. The conductive trace 222 may be routed on the surface of the end plate along one or both of the adjacent sides of the housing 200 and terminate adjacent the leads 300 to allow electrical connection to be made to one or more of the leads 300.

FIGS. 30–32 further illustrate that the end plate 220 may be chamfered to enhance retention by the main body of housing 200. In particular, end plate 220 may have chamfered edges 221. If the side walls 210 of the housing are molded around the end plate 220, the molding material forms around the chamfered edges 221 to mechanically secure the end plate 220. FIGS. 30 and 31 also illustrates openings 550a and 550b in shroud 500 to provide access to the leads, e.g., for electrical testing, as described above.

Figure 33:
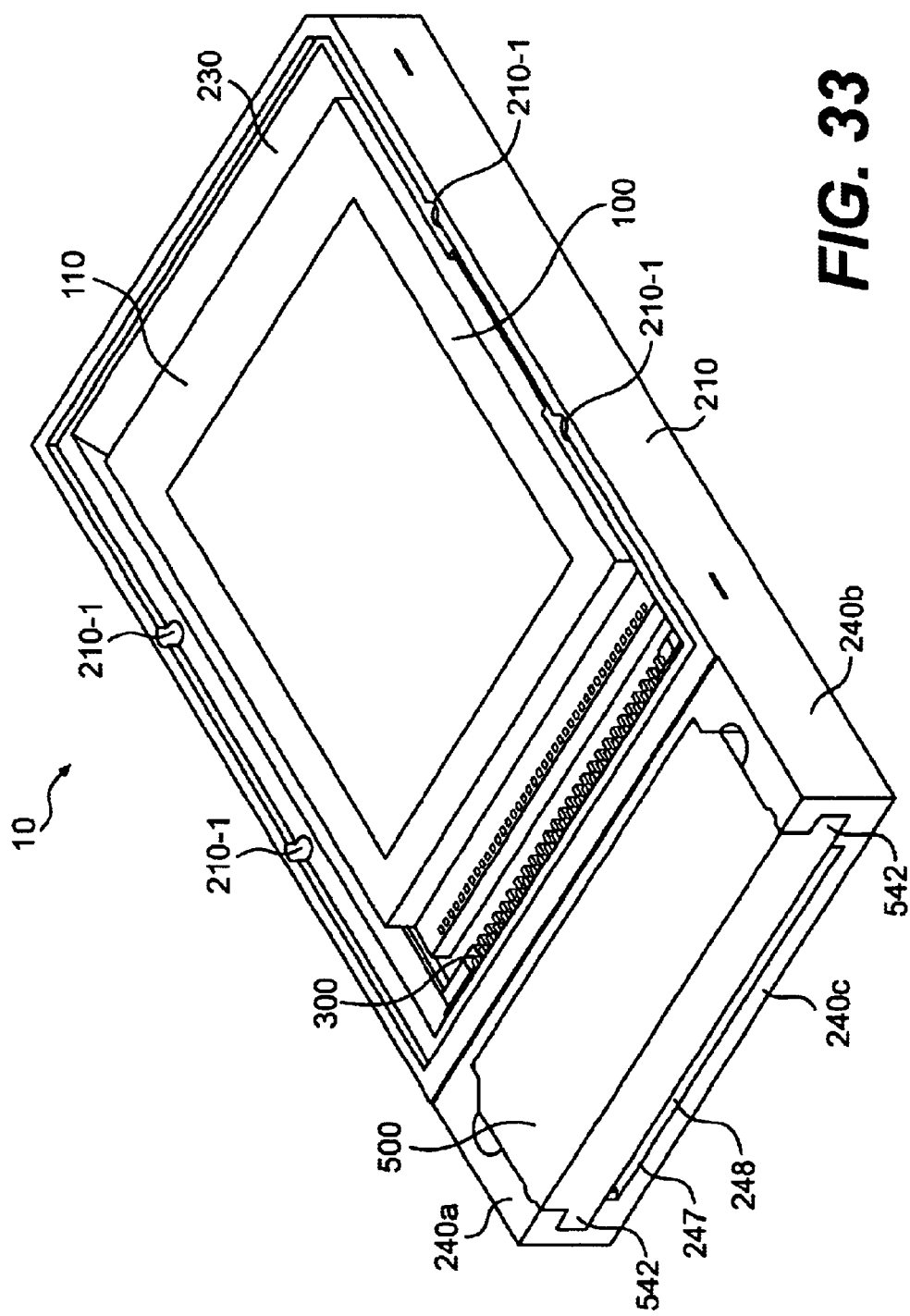
FIG. 33. illustrates a further embodiment of a die package in accordance with the present invention.

FIGS. 33–44 illustrate a further exemplary embodiment of a die package 10 in accordance with the present invention. As above, the embodiment of FIGS. 33–44 includes several features in common with the embodiments of FIGS. 1–32, including housing 200, leads 300, and shroud 500. A description of each feature and alternatives will not be repeated for brevity, but an understanding will be had based on the drawings and from the description above. FIG. 33 shows the die package 10 with a microdisplay die 100 and with the cover plate 400 removed.

Figure 34:
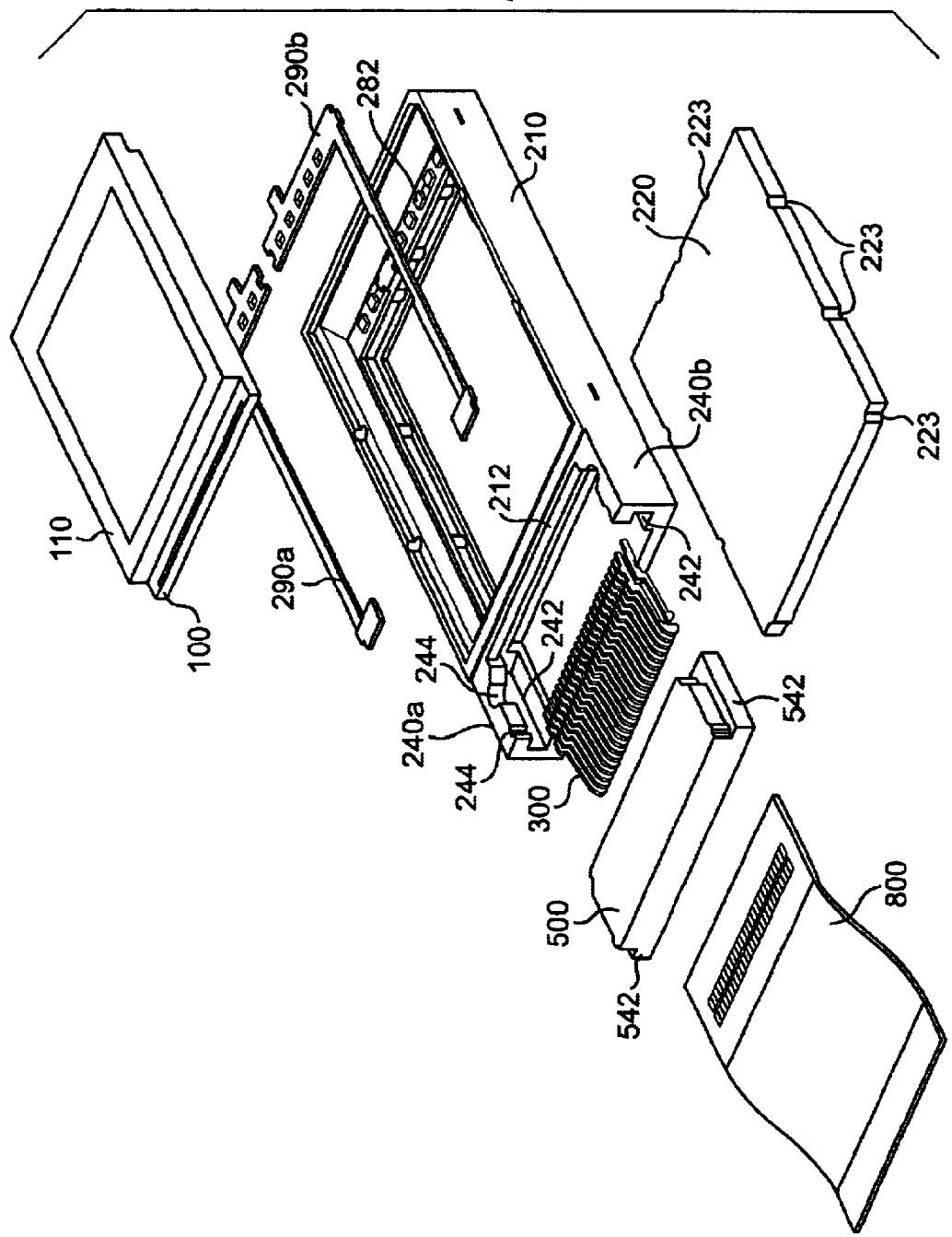
FIG. 34 provides an exploded view of the die package of FIG. 33 with substrate and microdisplay die.

FIG. 34 provides an exploded view showing the die 100, housing 200 including end plate 220, first and second voltage planes 290a and 290b, leads 300, shroud 500, and FPC 800. As shown in FIG. 34, end plate 220 includes multiple edge features 223. The edge features 223 may be used to fix the location of the end plate 220 during molding. For example, pins (not shown) may be positioned in the edge features 223 when the end plate 220 is placed in the mold. The pins hold the end plate 220 in place during the molding process used to form the side walls 210 and the remainder of the housing 200. Holes 210-1 in the side walls 210 may be seen as a result of the pins. These holes 210-1 may be used as wells for epoxy or other adhesive used to attach the cover plate 400 to housing 200.

FIG. 34 also illustrates voltage planes 29a and 290b that may be located by features 282 on the interior surface of the side wall 210. As described above, the voltage planes 290a and 290b may provide electrical connection between conductive traces or film on the underside of the plate 110 of die 100 to the leads 300. More particularly, a conductive epoxy or other conductive medium may be used to electrically connect the traces or film of the plate 110 to the voltage planes 290a and 290b and wire bonds, tape bonds, jumpers, etc. may be used to electrically connect the voltage planes 290a and 290b to leads 300.

Figure 35:
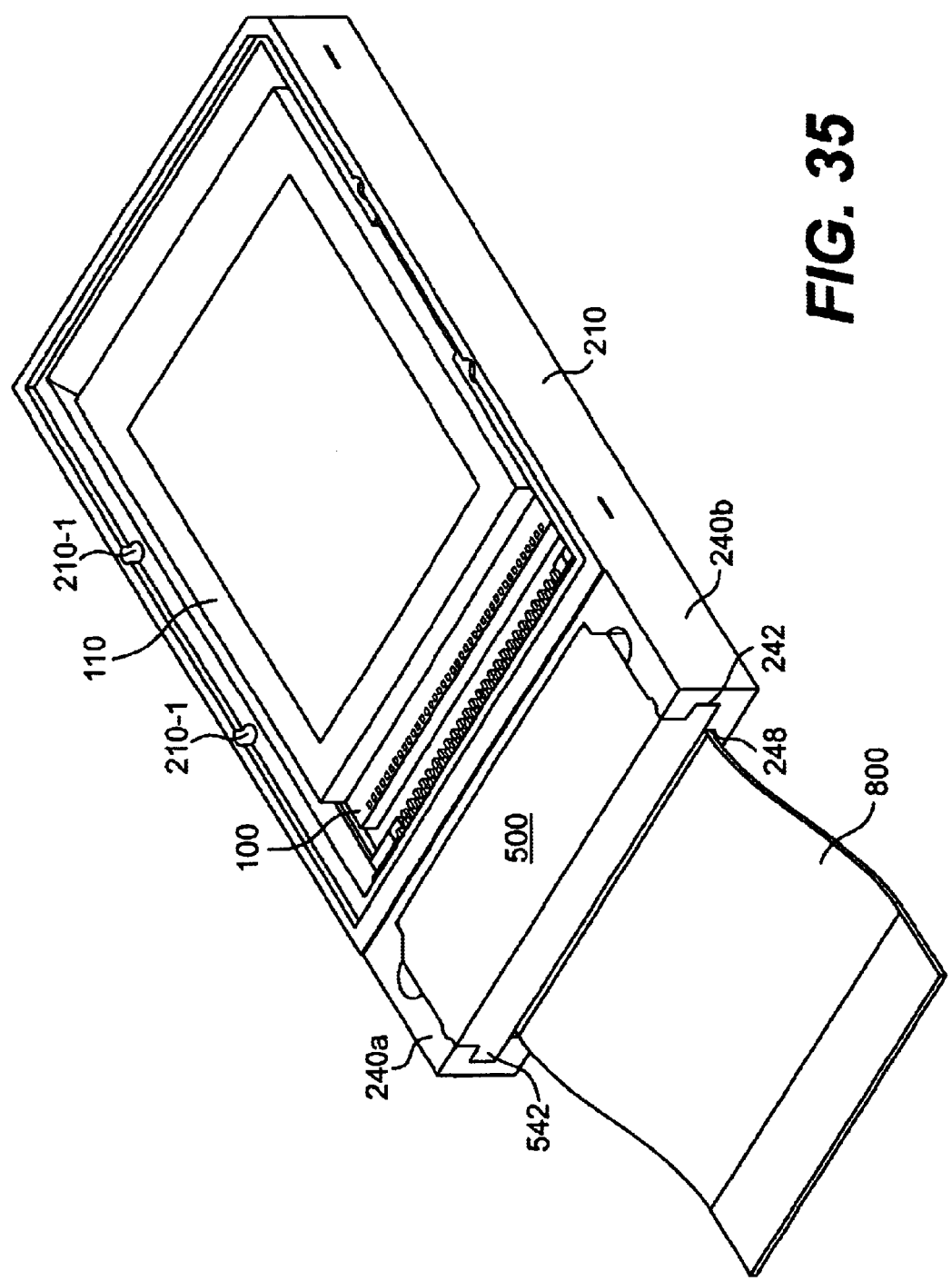
FIG. 35 shows the die package of FIG. 33 coupled to the substrate.
Figure 36:
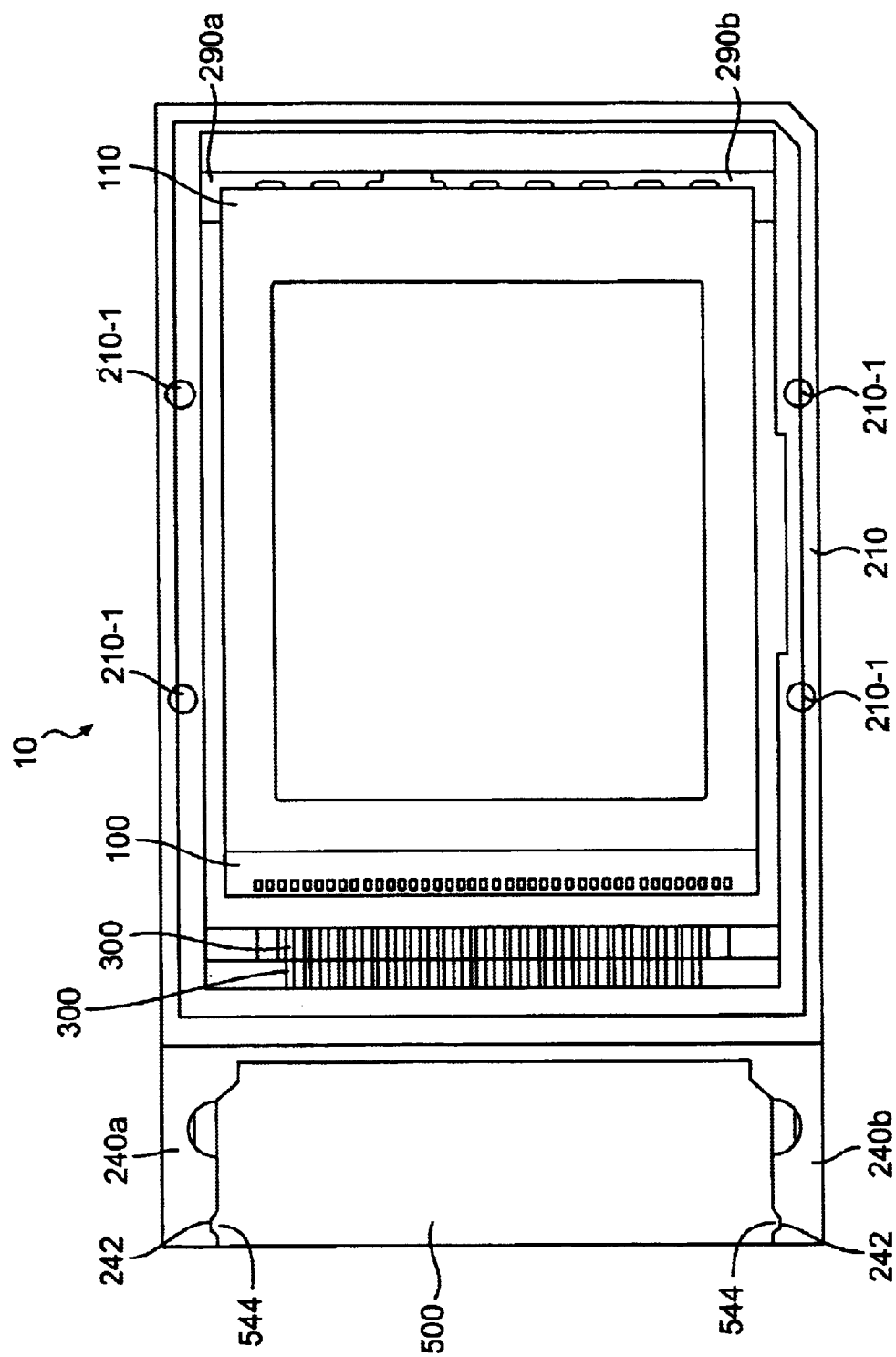
FIG. 36 shows a top view of the die package of FIG. 33.
Figure 37:
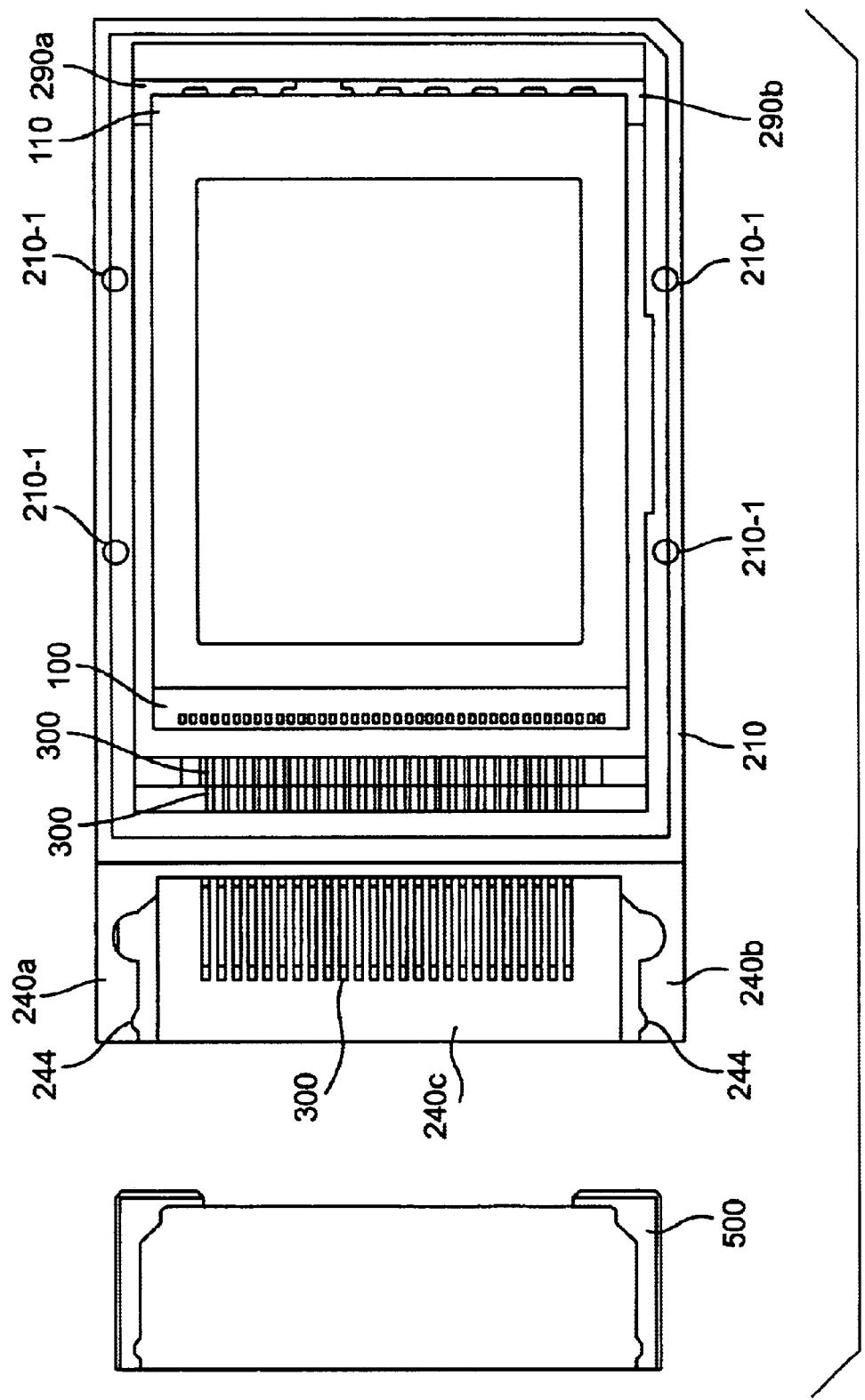
FIG. 37 shows a top view of the die package of FIG. 33 with the shroud removed.
Figure 38:
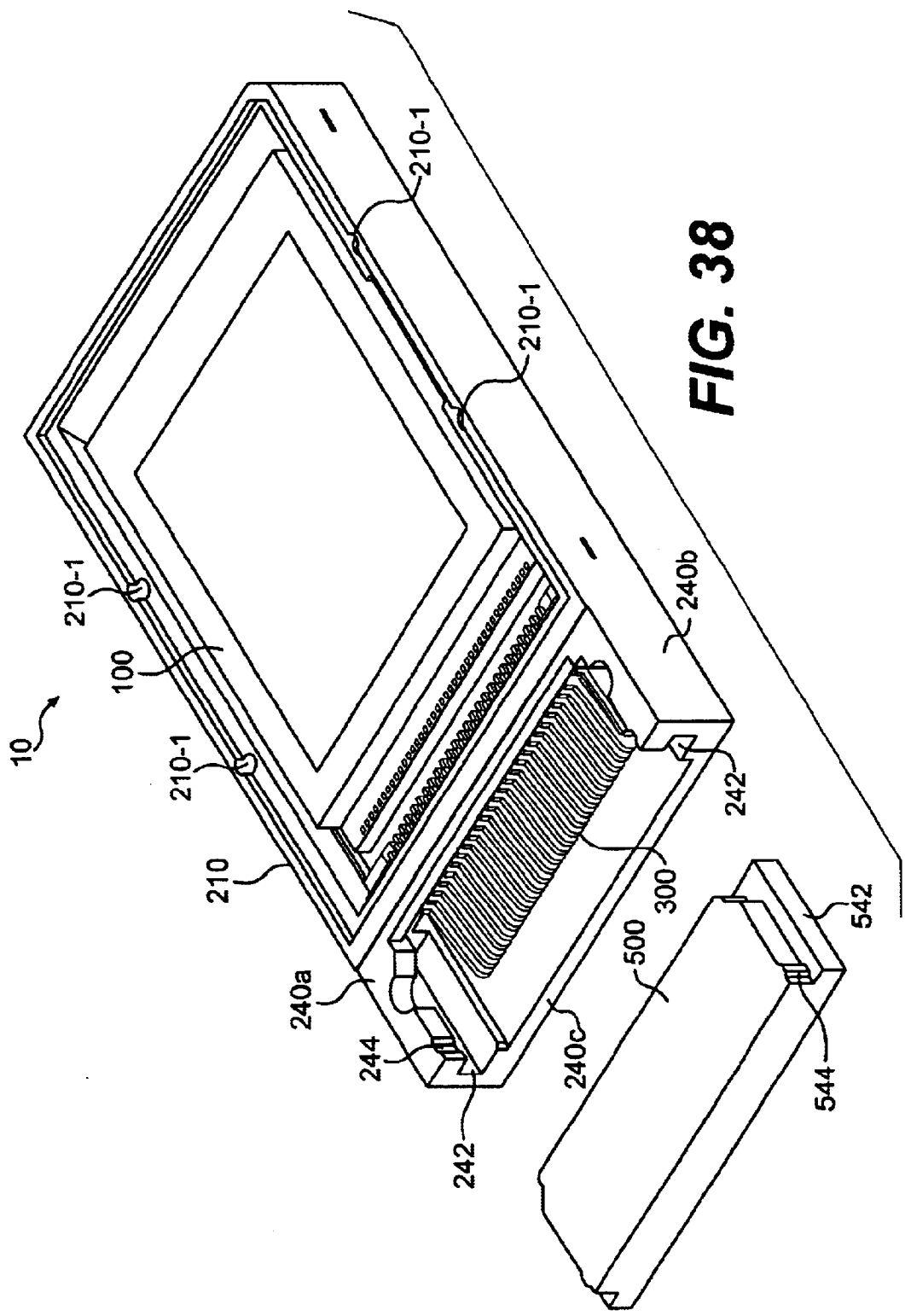
FIG. 38 provides an isometric view of the die package of FIG. 37.
Figure 39:
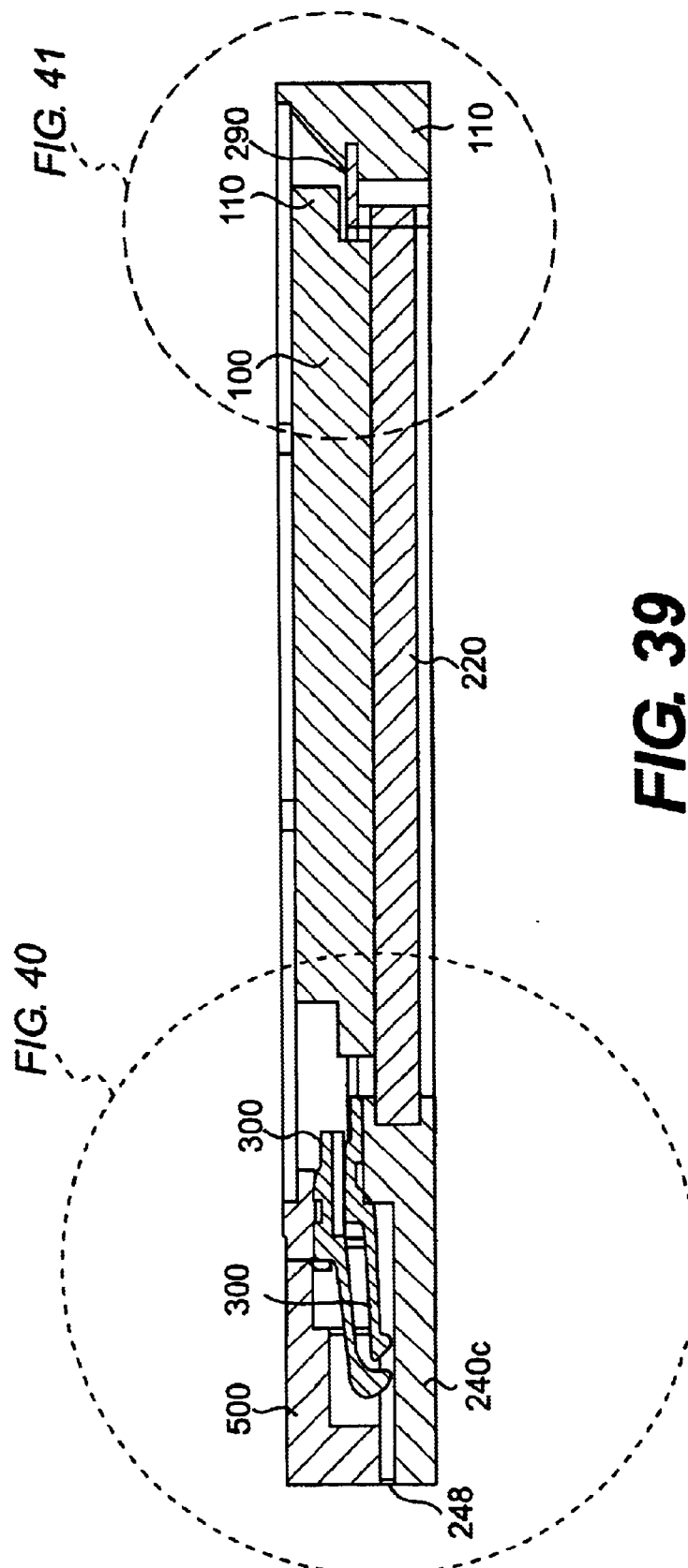
FIG. 39 shows a cross section of the die package of FIG. 33 taken through the leads 300.
Figure 40:
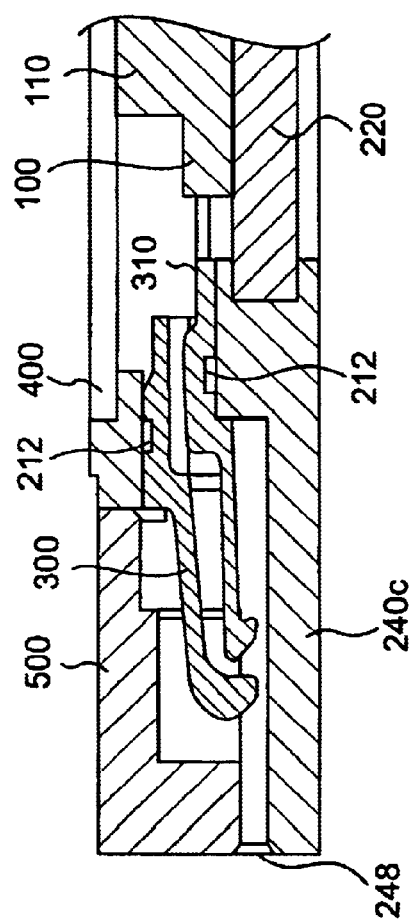
FIGS. 40 and 41 show details of the cross section of FIG. 39.
Figure 41:
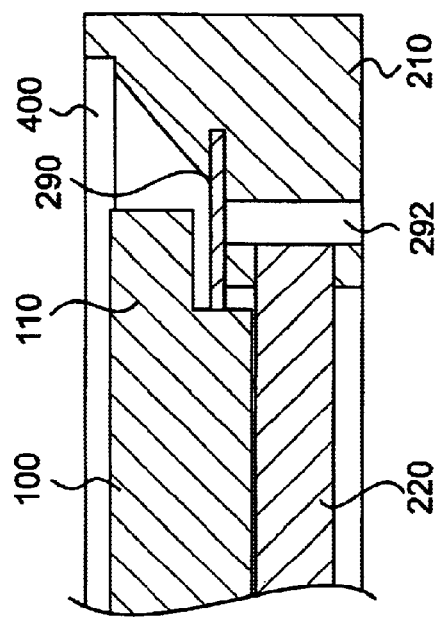
Figure 42:
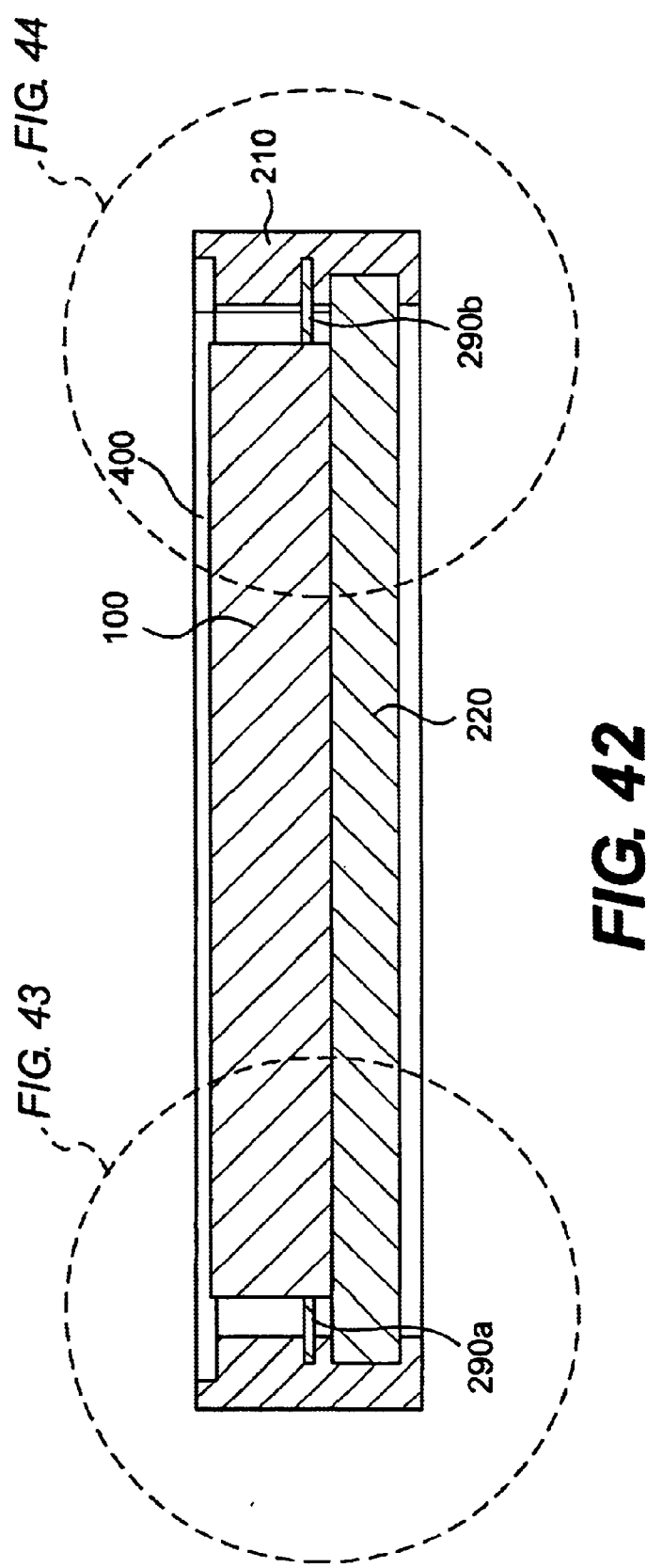
FIG. 42 shows a cross section of the die package taken orthogonal to the cross section of FIG. 39.

FIG. 35 illustrates a view of the die package 10 with the FFC 800 inserted into the shroud 500. FIG. 36 provides a top view of FIG. 33. FIGS. 37 and 38 illustrate the die package 10 with the shroud 500 detached from the housing 200. FIG. 39 provides a cross-sectional view of the die package 10. FIGS. 40 and 41 illustrate details of region of the cross-sectional view of FIG. 39. In particular, FIG. 41 shows the voltage plane 290 molded into the side wall 210 and an opening 292 through the housing 200 to the voltage plane 290. FIG. 42 provides a cross section of the die package 10 orthogonal to that of FIG. 39. FIGS. 43 and 44 illustrates details of FIG. 42. It should be noted that, in the exemplary embodiment shown in FIGS. 43 and 44, the voltage plane 290 is retained in the side walls 210, while allowing portions to be available for connectivity. More particularly, a portion of the voltage plane 290 is embedded in the side wall 210 and a portion is exposed and thus available for electrical connection if desired.

Figure 45:
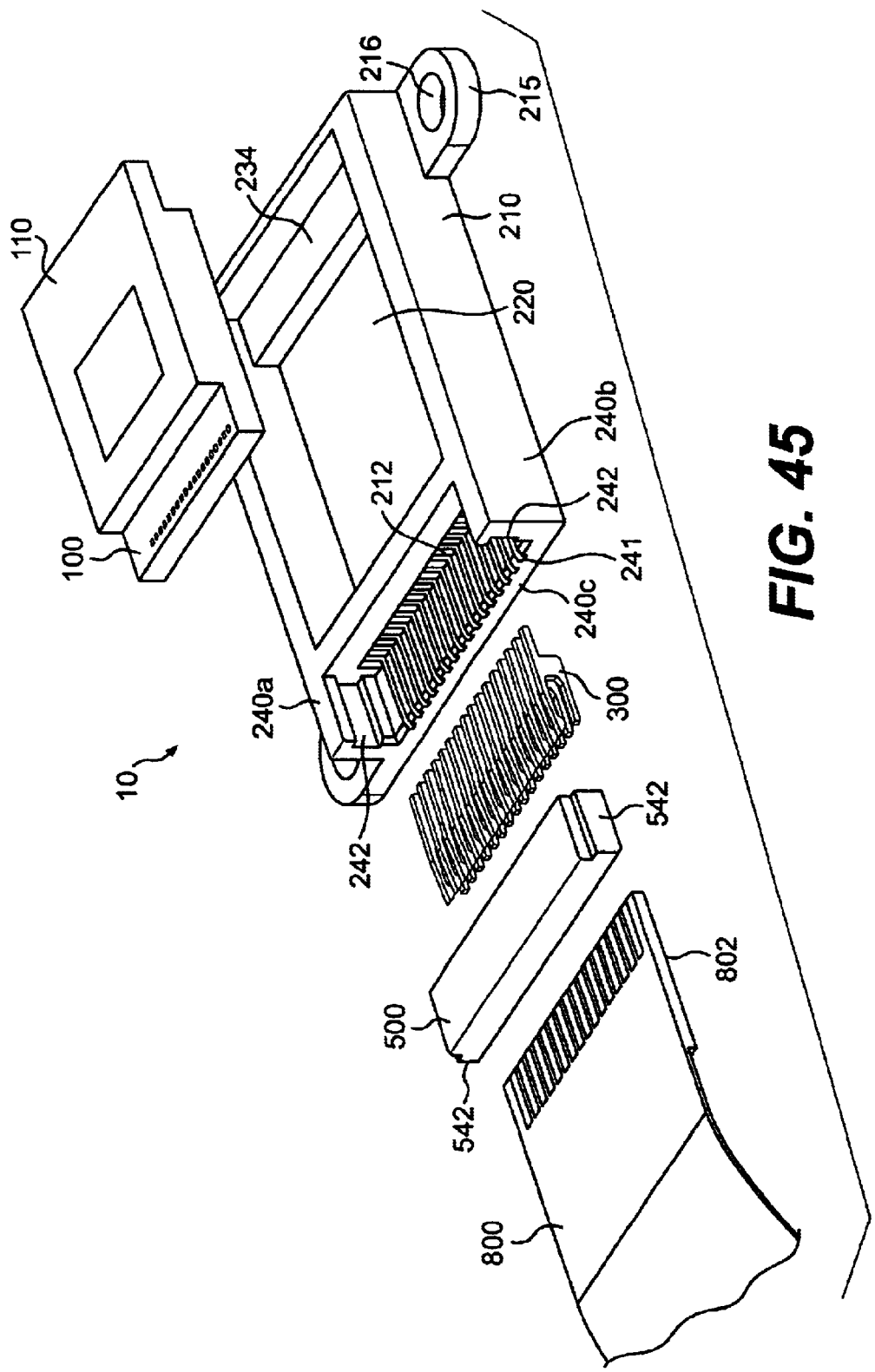
FIG. 45 illustrates an exploded view of a further embodiment of a die package 10 in accordance with the present invention.

FIGS. 45–51 illustrate a further exemplary embodiment of a die package 10 in accordance with the present invention and variations thereof. As above, the embodiment of FIGS. 45–51 includes several features in common with the embodiments of FIGS. 1–44, including housing 200, leads 300, and shroud 500. A description of each feature and alternatives will not be repeated for brevity, but an understanding will be had based on the drawings and from the description above. FIG. 45 illustrates an exploded view of the die package 10 according to the present embodiment. The die package 10 may be used, for example, for near-eye applications and may accommodate a quarter VGA microdisplay die. FIG. 45 shows a die package 10 including a die 100, housing 200, leads 300, and shroud 500 and an FPC 800 with a backing stiffener 802. The die package 10 may further include a cover plate 400 made from glass or other transparent material, or a cover plate 400 with an aperture 410 as described above.

In the exemplary embodiment of FIGS. 45–51, the housing 200 is molded as a single-piece. For example, the side walls 210 and the end plate 220 may be formed simultaneously by a molding process. The housing 200, including both side walls 210 and end plate 220, may be formed of a polymer, such as a liquid crystal polymer, for example, VECTRA™ available from Ticona. Alternatively, the end plate 220 may be a ceramic substrate, for example, with traces as described above. As shown in FIG. 45, the extension 240c of the housing may include notches 241 for receiving the leads 300. The notches 241 may be used to guide insertion of the leads 300 into the housing 200. The notches 241 may be sized to frictionally retain the leads without adhesives. Alternatively, adhesives alone, a mechanical device(s) such as clips or burrs, or a combination of any of these methods may be used to secure the leads 300 to the housing 200. The shroud 500 may include tongues 542 that may be slideably received in grooves 242 of arms 240a and 240b. In this embodiment, the shroud 500 and housing 200 may not include protrusions and notches for mechanical attachment, but may use other expedients, such as adhesives, ultrasonic welding, or ultrasonic spiking, for example. Of course, protrusions and notches, as described above, may be provided.

Figure 46:
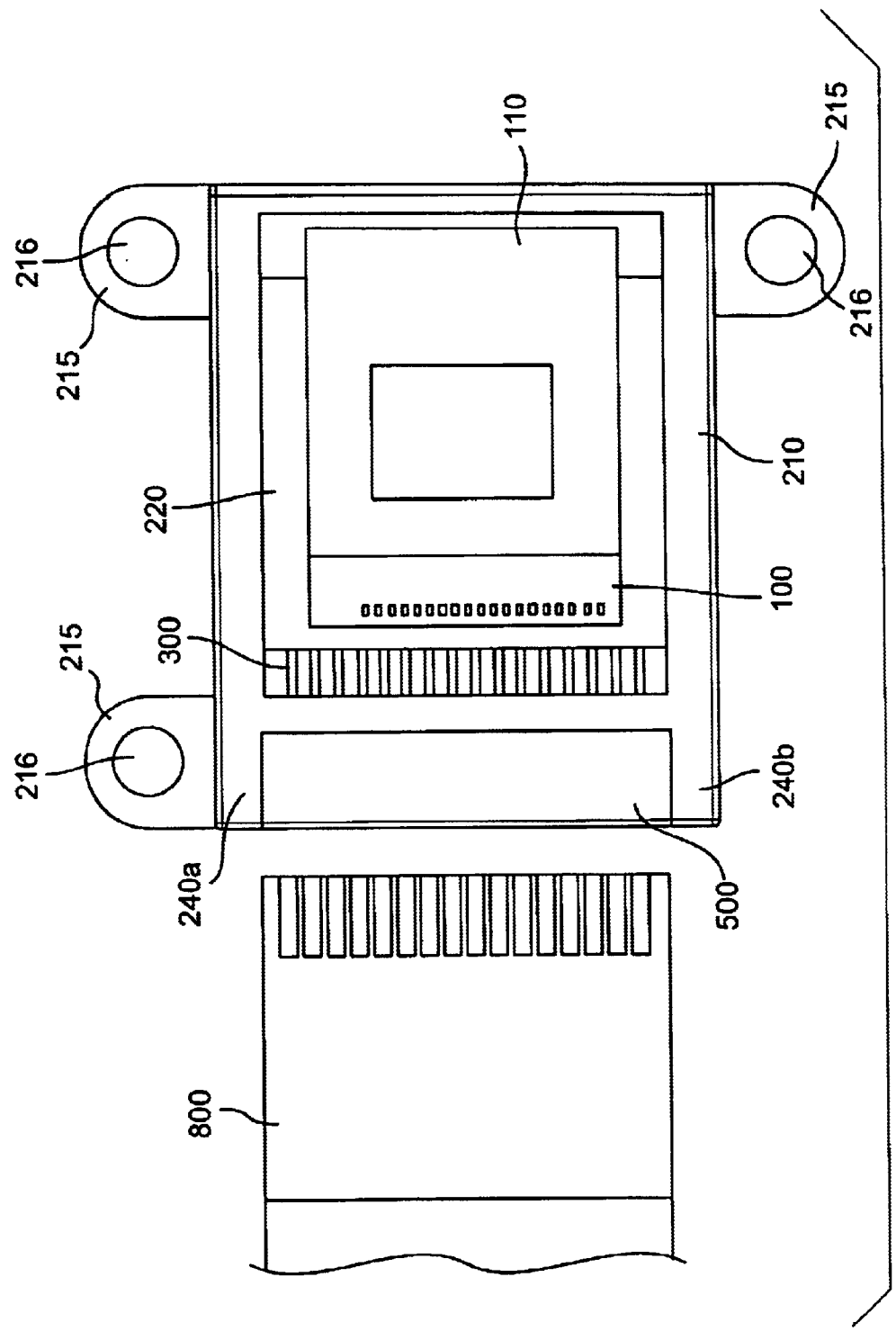
FIG. 46 illustrates a top view of the die package of FIG. 45 with the cover plate removed.
Figure 47:
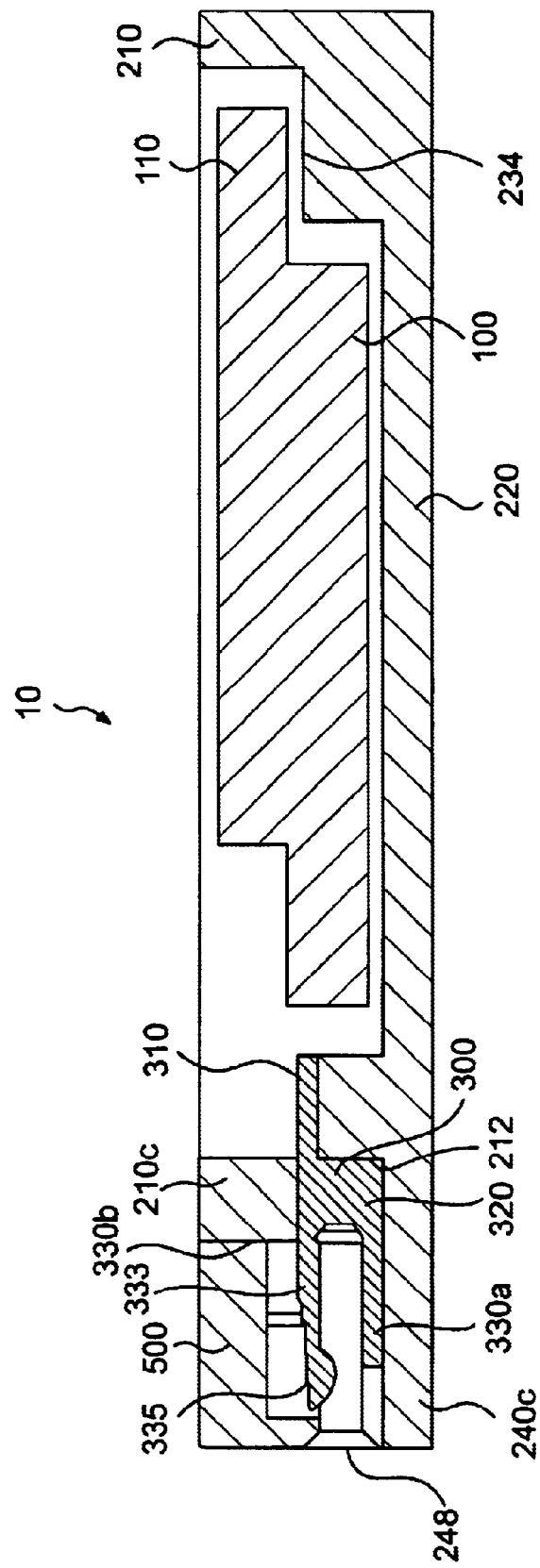
FIG. 47 shows a cross section of the die package of FIG. 46.
Figure 48:
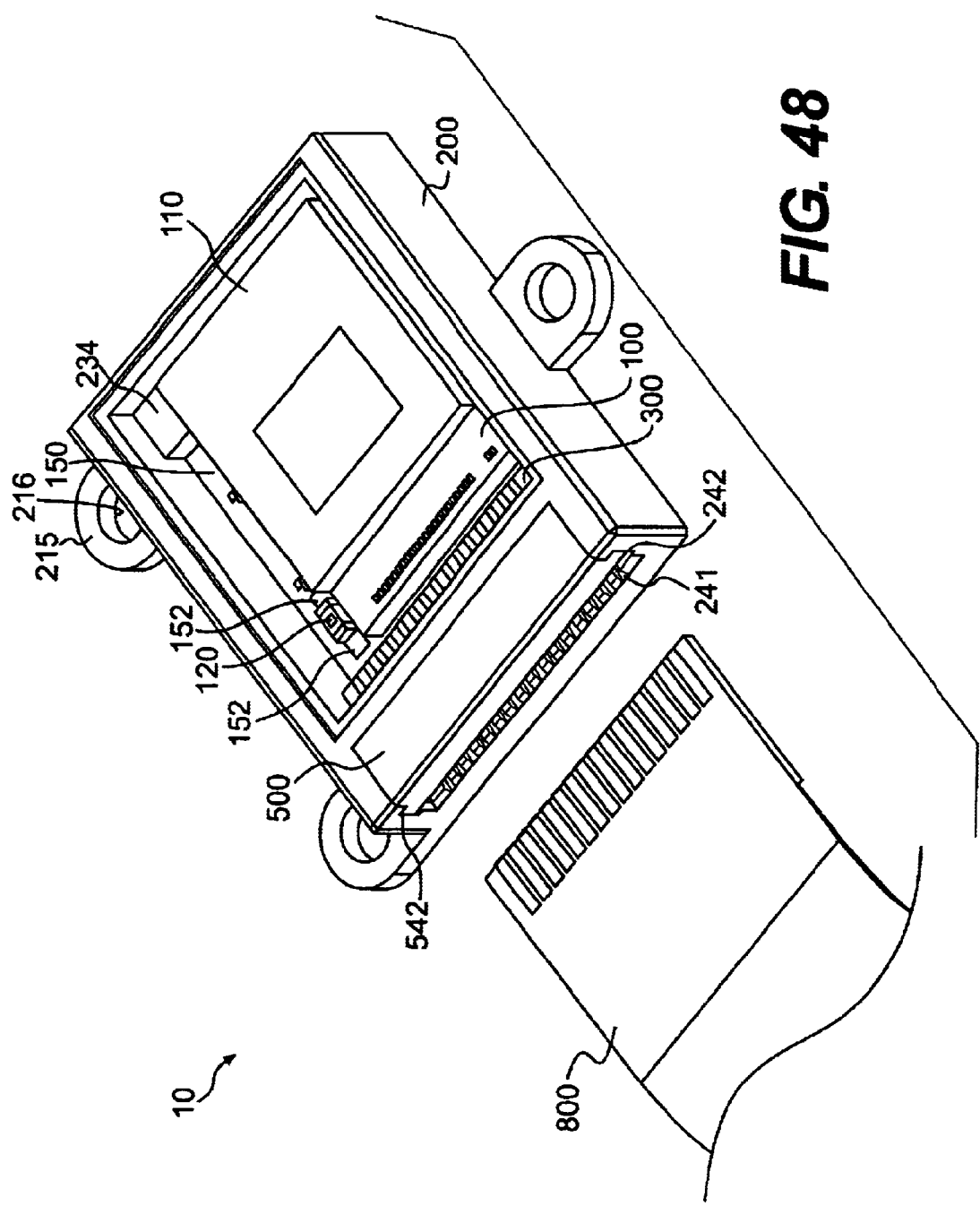
FIGS. 48 and 49 illustrate a variation of the die package of FIG. 45, including discrete components within the die package cavity.
Figure 49:
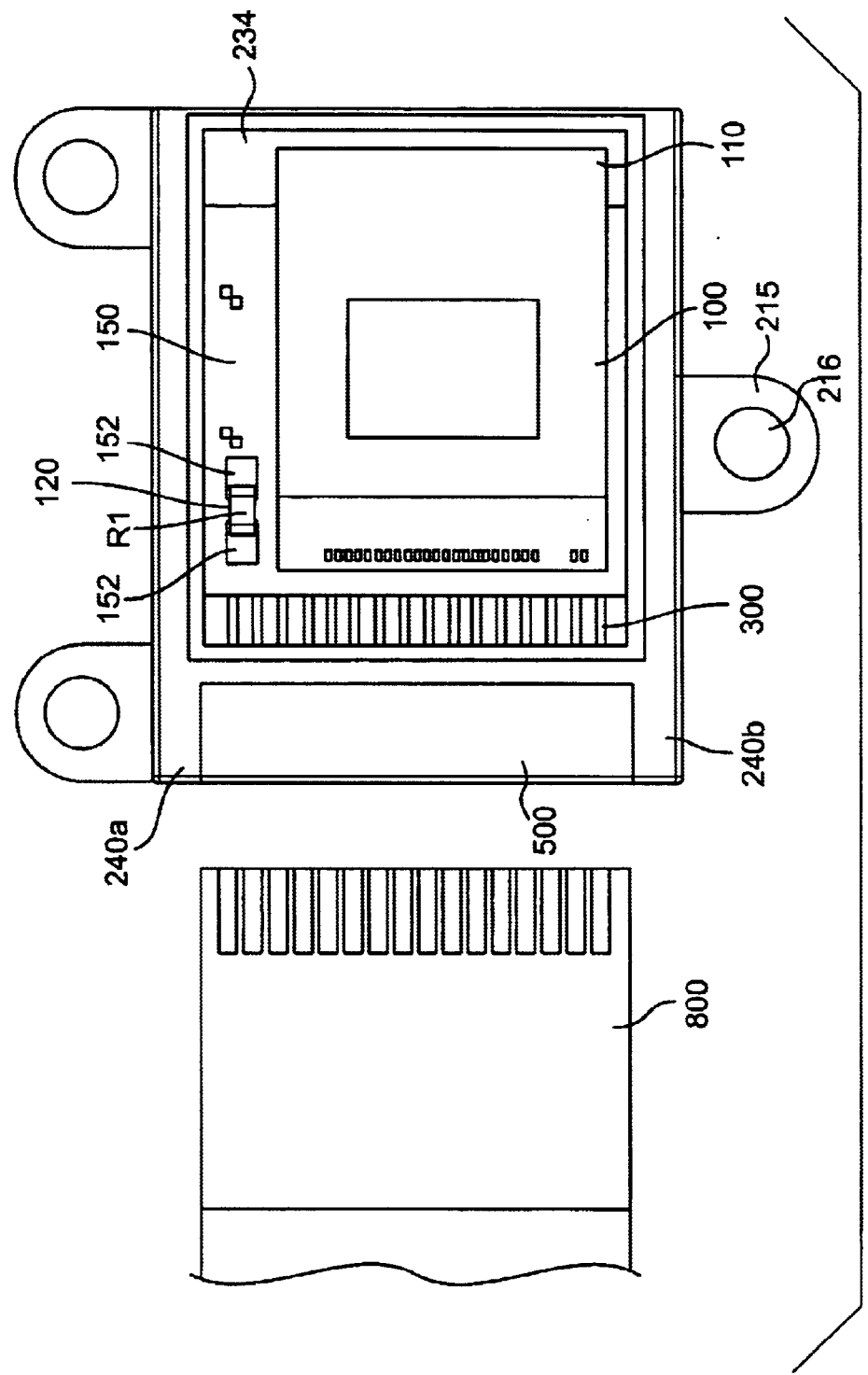
Figure 50:
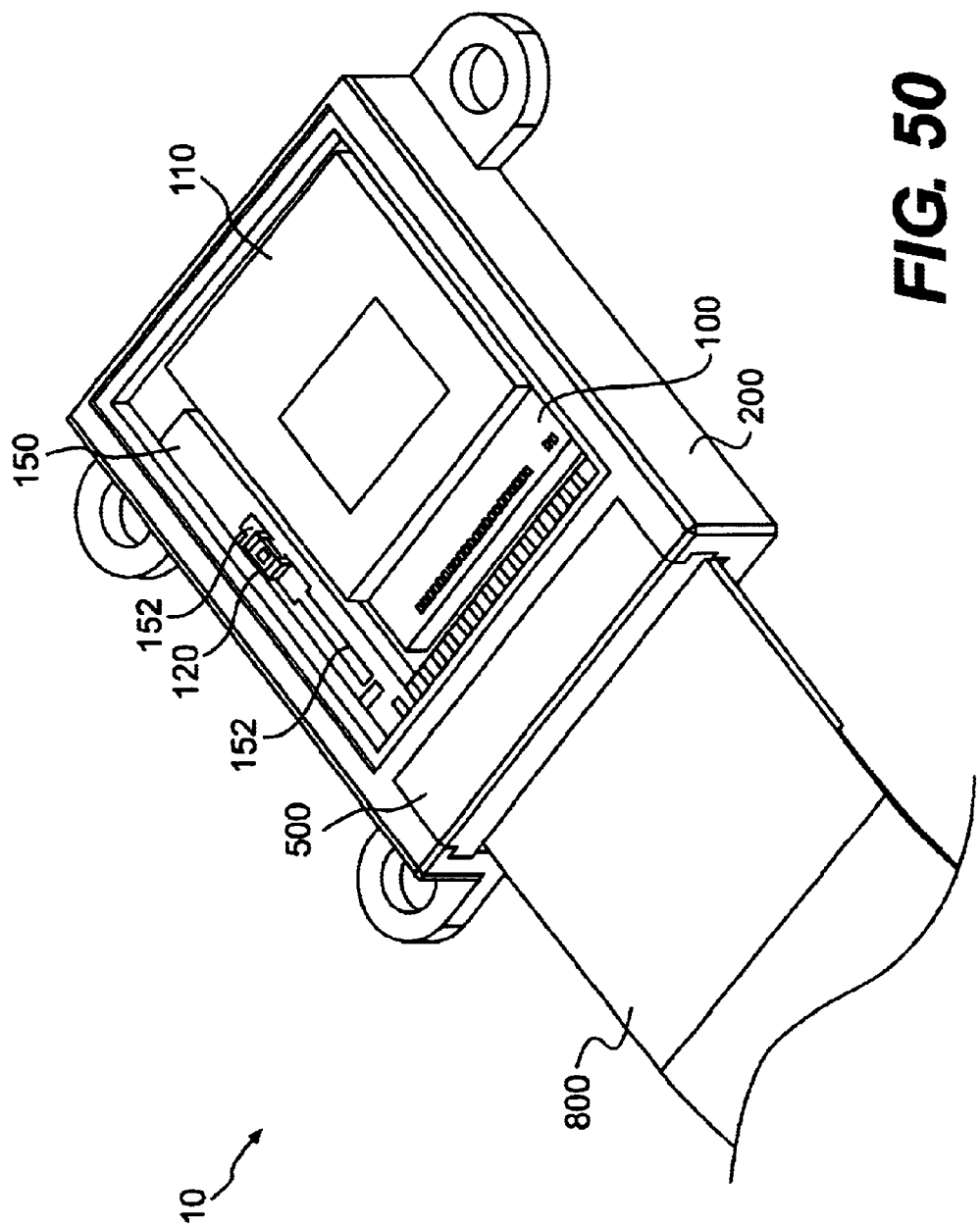
FIGS. 50 and 51 illustrate a further variation of the die package of FIG. 45, including discrete components within the die package cavity.
Figure 51:
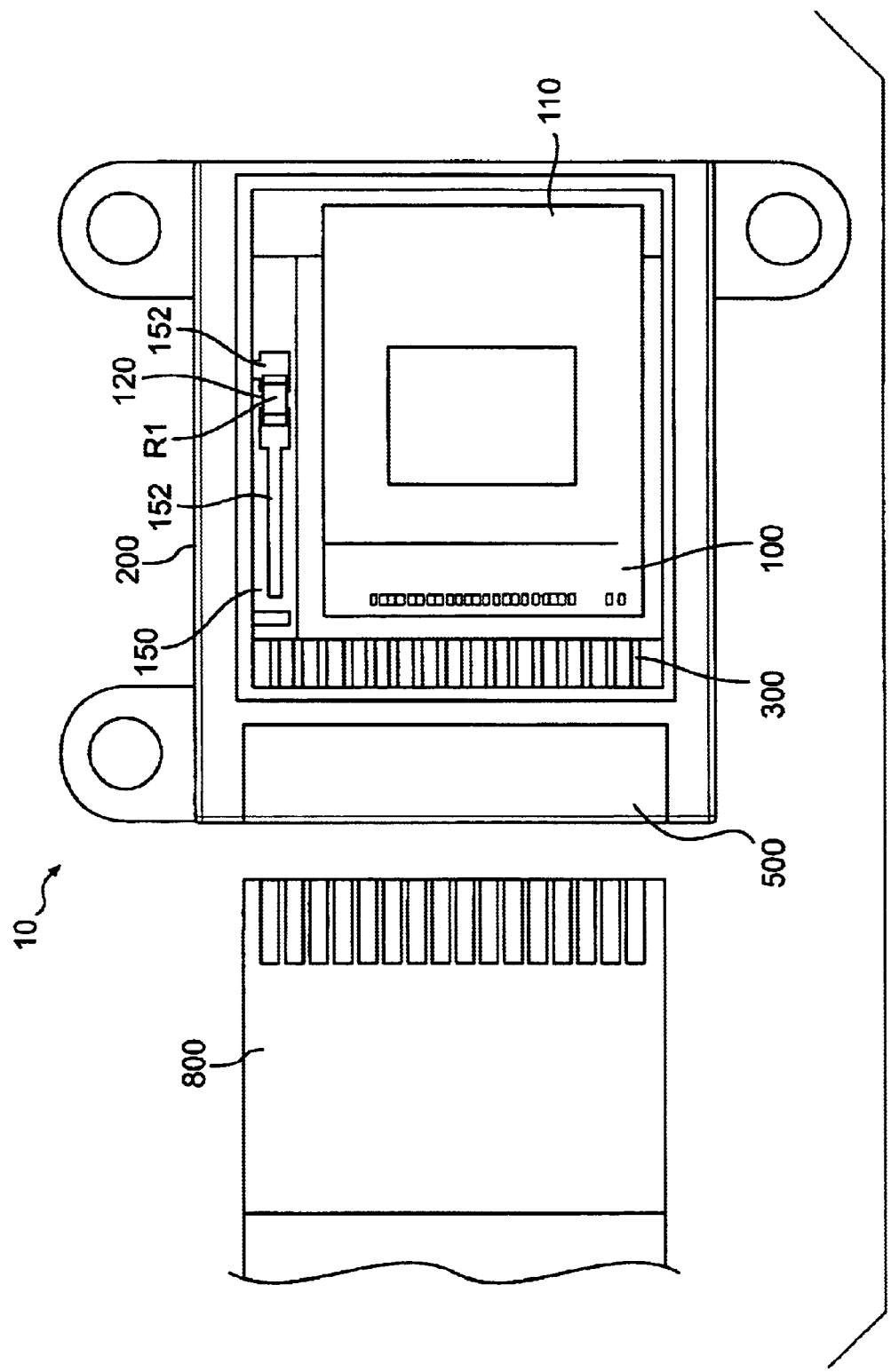
Figure 52:
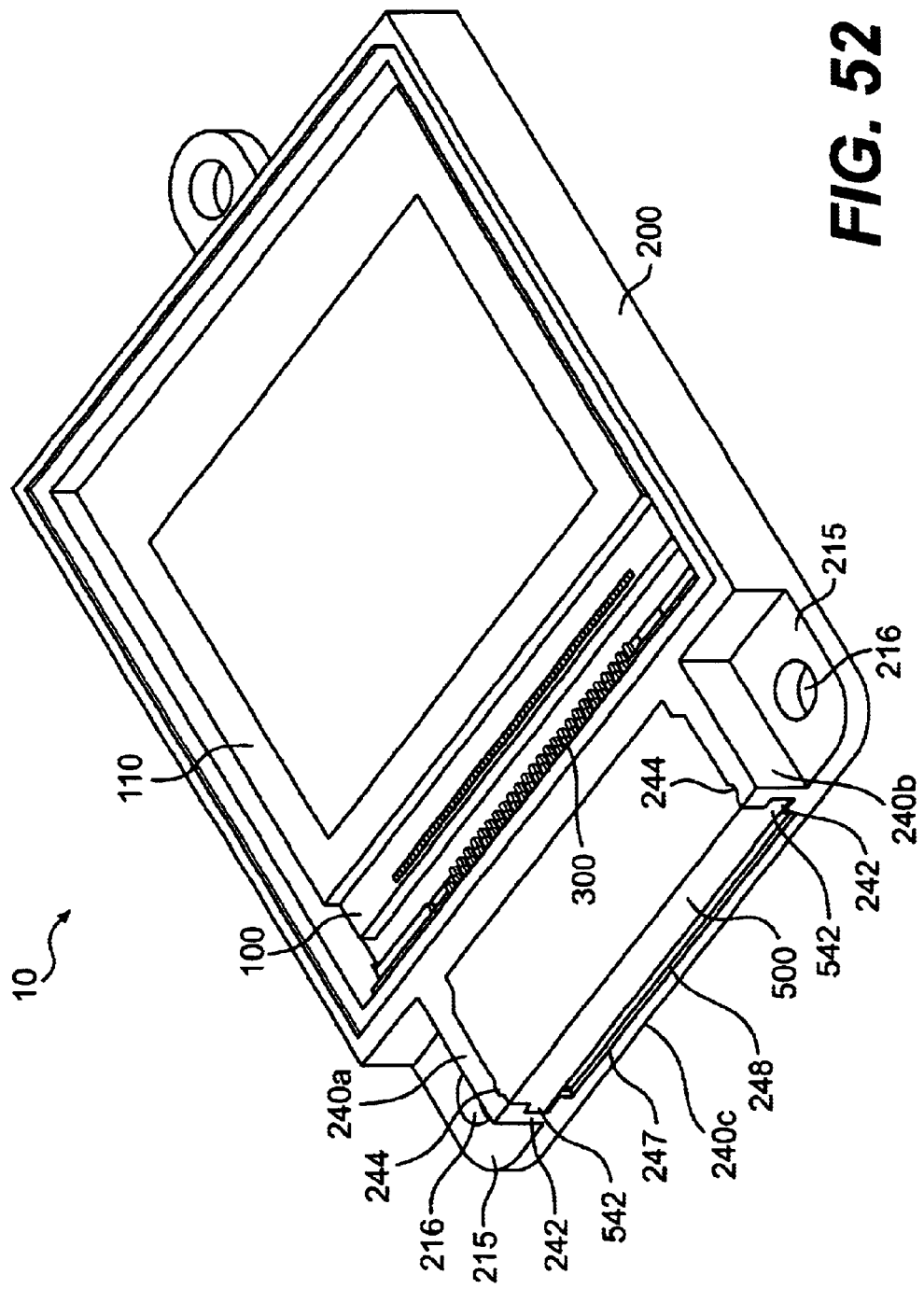
FIG. 52 illustrates a further embodiment of a die package 10 in accordance with the present invention.
Figure 53:
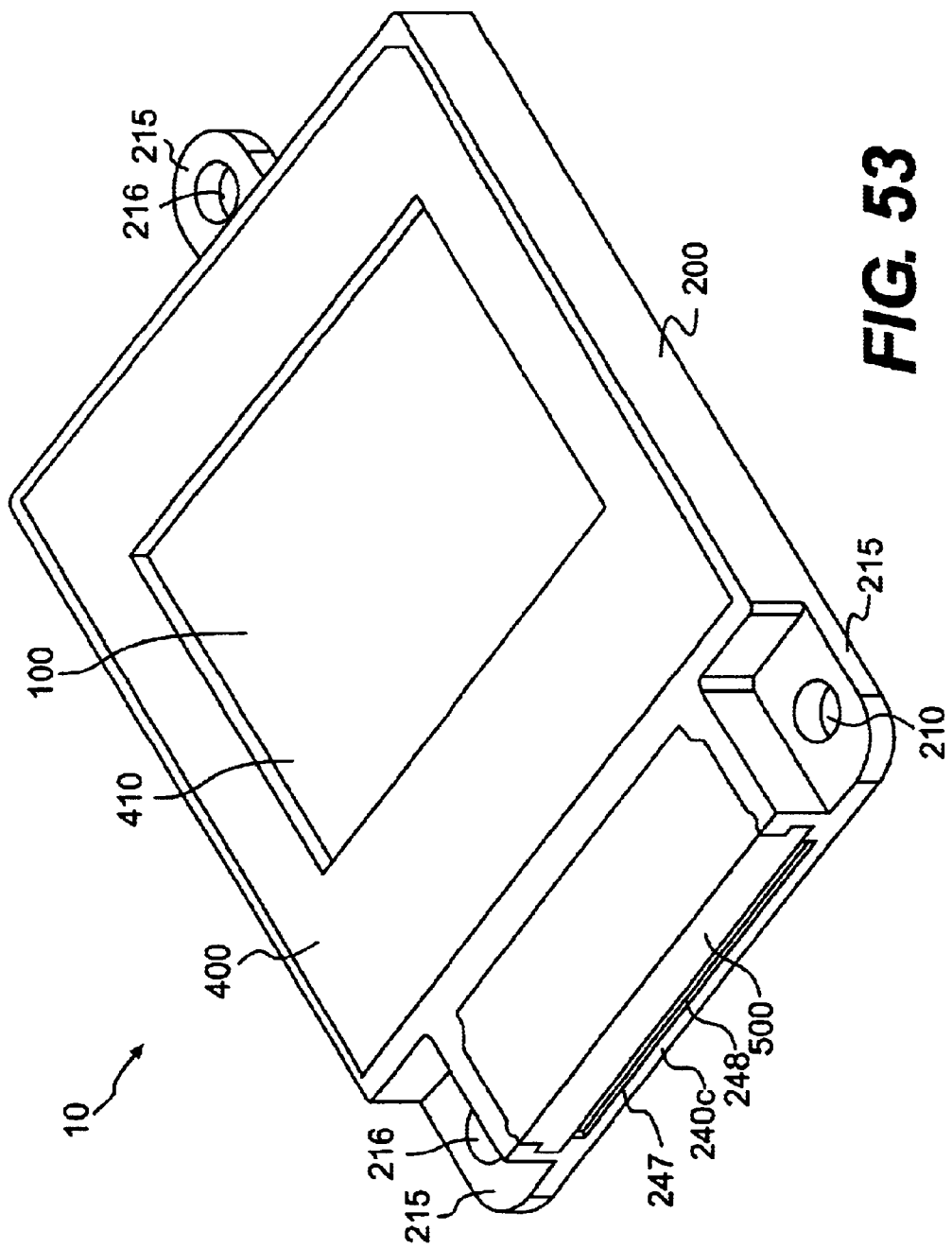
FIG. 53 shows the die package of FIG. 52 with cover plate.
Figure 54:
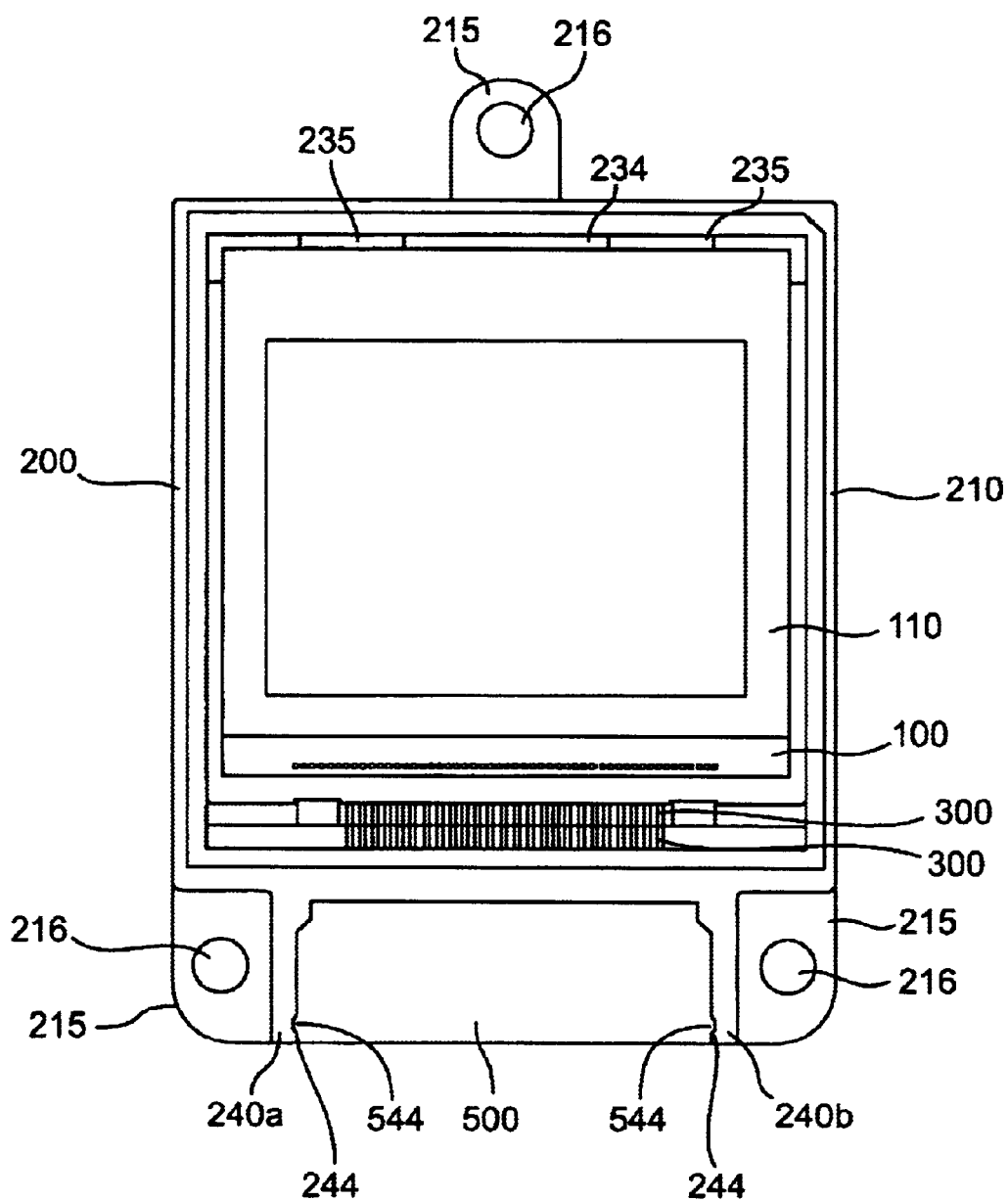
FIG. 54 provides a top view of the die package of FIG. 52.
Figure 55:
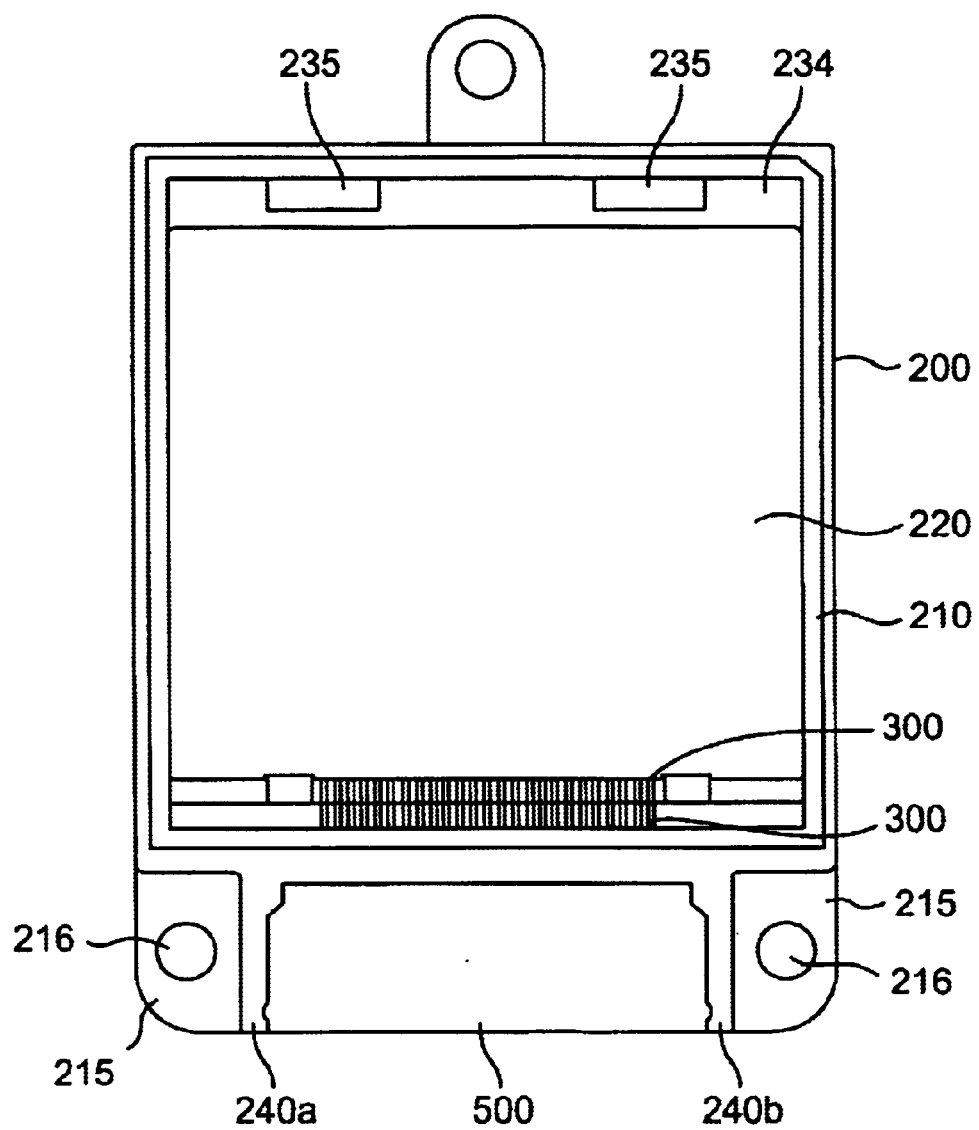
FIG. 55 provides a top view of the die package of FIG. 52 with the microdisplay die removed.
Figure 56:
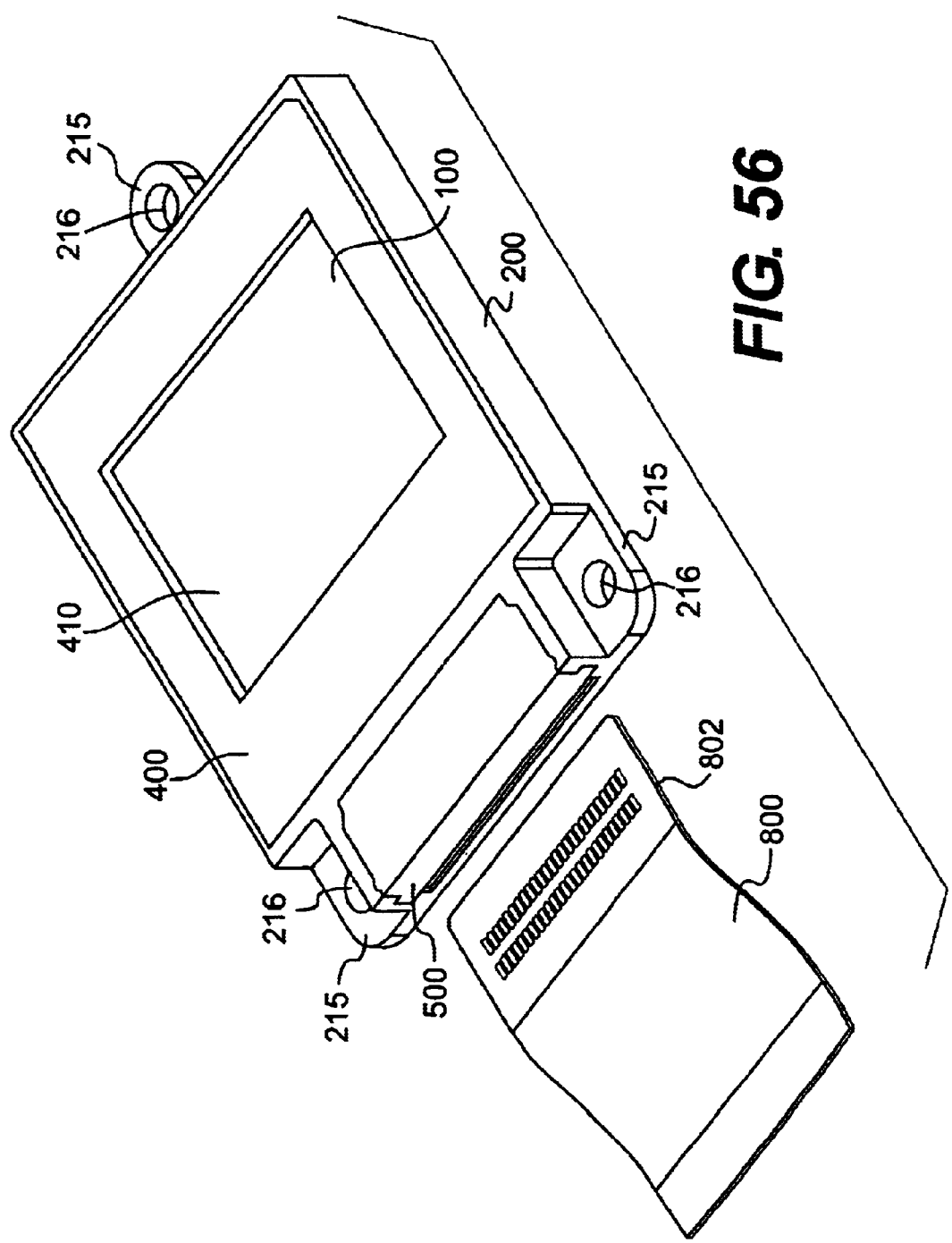
FIG. 56 shows the die package of FIG. 53 with FFC.
Figure 57:
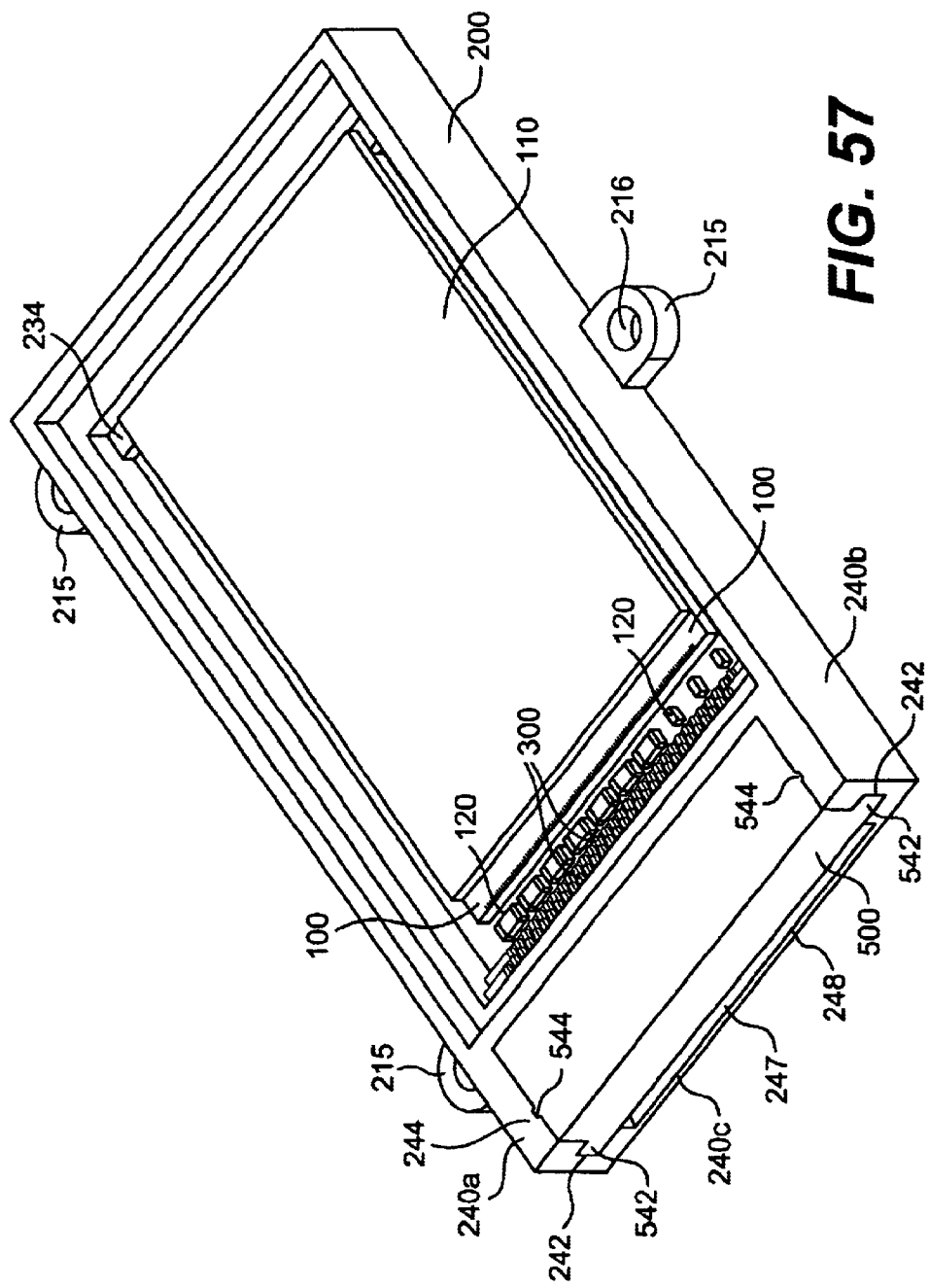
FIG. 57 shows a further embodiment of a die package according to the present invention.
Figure 58:
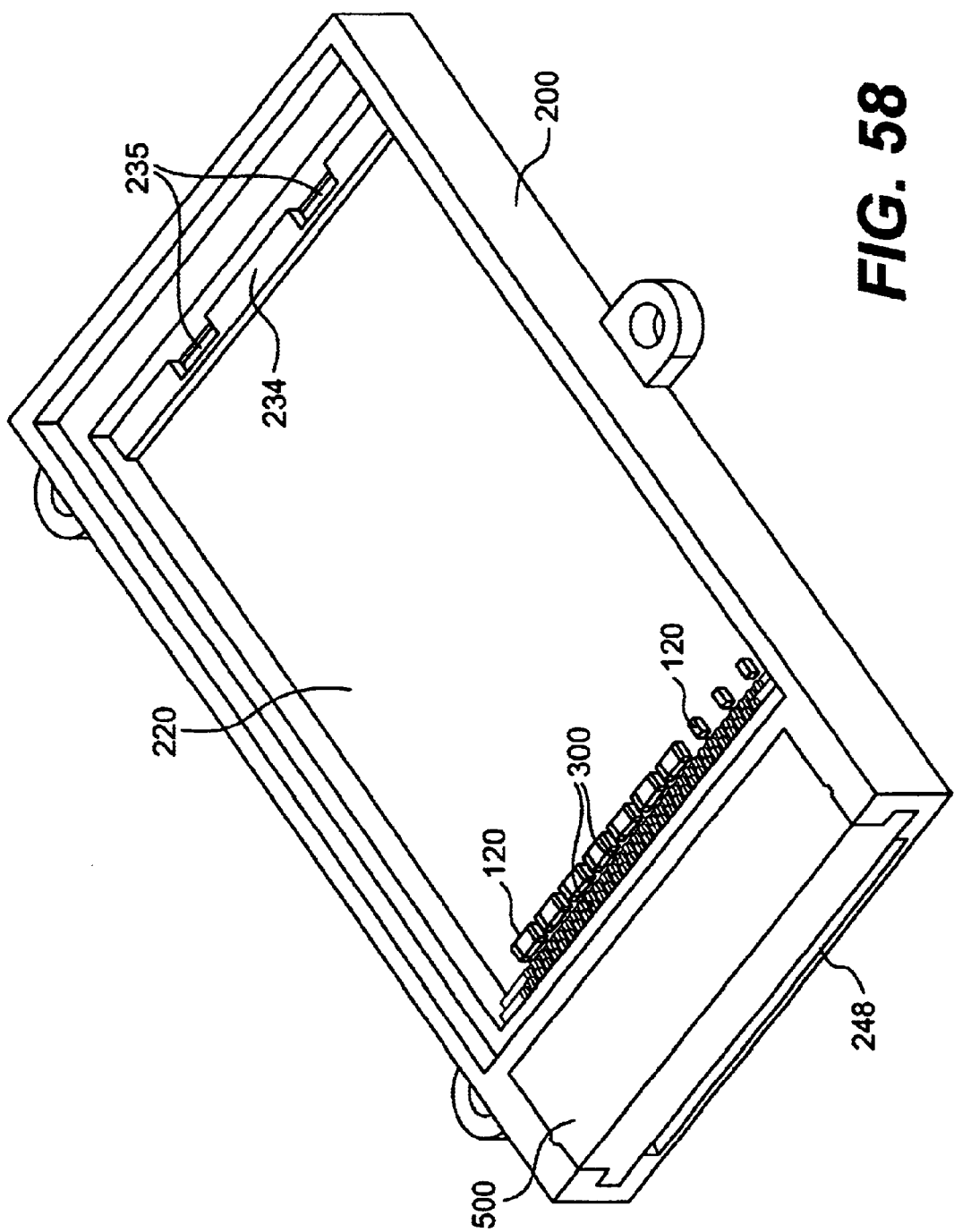
FIG. 58 shows the die package of FIG. 57 with microdisplay die removed.
Figure 59:
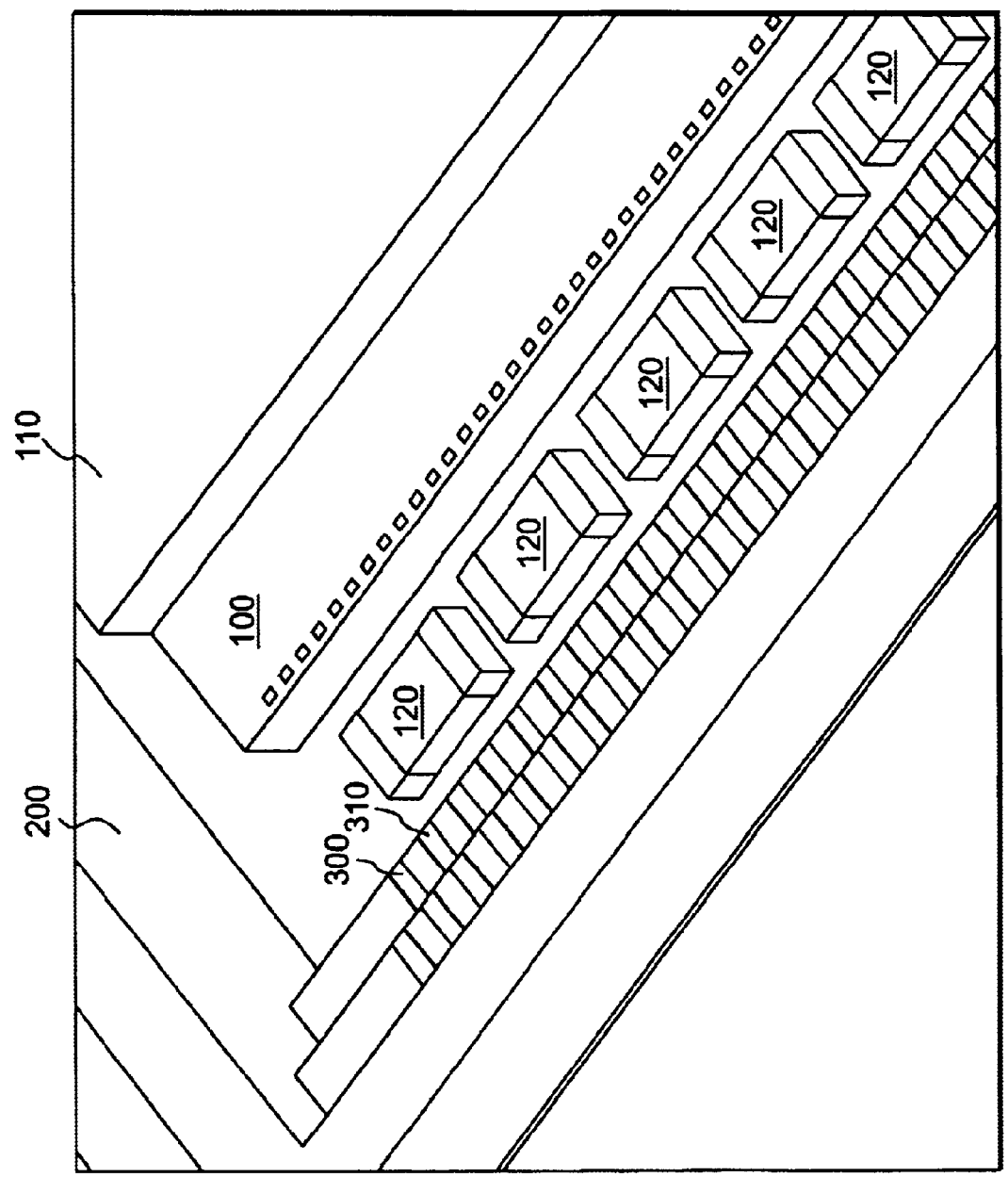
FIG. 59 shows a detailed view of FIG. 57.

FIG. 46 shows a top view of the assembled package 10 of FIG. 45 with FFC 800. FIG. 47 illustrates a cross-sectional view of the die package 10. As should be clear from FIG. 47, the die package 10 includes a single tier of leads 300. The leads 300 include an internal lead portion 310, an body portion 320, and two prongs 330a and 330b. The internal lead portion 310, as above, extends within cavity 230 to permit electrical connections to be formed, such as to the die 100, to a voltage plane, or to traces. The body portion 320 fits in an opening 212 in the side wall 210c. As noted above; the opening 212 maybe sized to frictionally retain the body portion 320 in the housing 200. A first prong 330a fits in the notches 241 of the extension 240c, as noted above. The second prong 330b is self-supporting and extends in free space from the body portion 220. The second prong 330b includes a resiliently flexible portion 333 and a contact portion 335.

Mating of the FFC 800 and die package 10 will be described using a single lead as an example. However, it should be understood that the description is applicable to other leads of the package 10. During mating, the FFC 800 is inserted through the slot 248 between the shroud 500 and the extension 240c. The FFC 800 engages the lead 300, causing the flexible portion 333 to flex and, due to its resilience, force the contact portion 335 against the FFC 800. As noted above, the FPC 800 may have an optionally stiffener 802 that provides structural support as the FPC 800 is inserted into the slot 248. As should be appreciated, the FFC 800 is positioned between prongs 33a and 330b during mating and insertion of the FPC 800 may stop when the FFC abuts the body portion 320 of the leads 300. In this position, the contact portion 335 may form an electrical connection with a trace or pad on the surface of the FFC 800. Moreover, if the FFC 800 includes traces or pads on both sides, electrical connections may be made by both prong 330a and prong 330b. It should be understood that lead design described in connection with FIGS. 45–47 may be used with the other embodiments of the die package 10 described above and below.

FIG. 48–49 and 50–51 illustrate variations of the exemplary embodiment of the die package 10. In FIG. 48–51, the die 100 may be mounted on a substrate. The substrate may be the end plate 220 or a die attach substrate 150 mounted on the end plate 220. In either case, the substrate may be, for example, a ceramic or printed circuit board having traces. Alternatively or in addition, a leadframe or voltage plane, such as voltage plane 290 described above, may be provided with exposed pads for mounting discrete components 120. The substrate may be a multi-layer substrate having multiple layers of conductive traces sandwiched between nonconductive layers, thereby allowing routing of voltages and signals. In the present example, it will be assumed that the substrate is a die attach substrate 150. However, the description is applicable to arrangements in which the substrate is the end plate 220 as well as other arrangements. Discrete electrical components 120, for example resistors or capacitors, may be mounted on the substrate 150 and interconnected by traces 152. The discrete components 120 may serve a variety of purposes, e.g., discrete capacitors may be used for decoupling and/or signal conditioning. The substrate 150 may include pads or traces (not shown) that electrically connect directly or via a conductive medium to traces formed on the plate 110 of the substrate 100, for example, as described above.

FIGS. 52–56 illustrate a further exemplary embodiment of the die package 10 according to the present invention. The embodiment of FIGS. 52–56 includes several features in common with the embodiments of FIGS. 1–51, including housing 200, leads 300, and shroud 500. A description of each feature and alternatives will not be repeated for brevity, but an understanding will be had based on the drawings and from the description above. In the exemplary embodiment of FIGS. 52–56, tabs 215 extend from side wall 210c and sandwich arms 240a and 240b. Tabs 215 include holes 216 and may be used to secure the die package 10 to a structure.

FIGS. 57–60 illustrate a further exemplary embodiment of the die package 10 according to the present invention. The embodiment of FIGS. 57–60 includes several features in common with the embodiments of FIGS. 1–56, including housing 200, leads 300, and shroud 500. A description of each feature and alternatives will not be repeated for brevity, but an understanding will be had based on the drawings and from the description above.

In the embodiment of FIGS. 57–60, one or more discrete components 120 may be mounted between the die 100 and the leads 300. The discrete components 120 may be arranged in one or more rows on a surface of end plate 220 (or a die attach plate 150, if provided). Alternatively, some or all of the discrete components 120 may be embedded in substrate 150 or endplate 220 or surface printed thereon. The discrete components 120 may be, for example; resistors and/or capacitors. The discrete components 120 may be coupled between leads 300, between pads of the die 100 and/or glass 110, between traces on the end plate 220 or substrate 150, or between a combination of the foregoing by an electrically conductive medium, such as wire bonds, tape bonds, jumpers, etc. For example, traces on the glass 110 may be electrically connected to a trace 222 on the end plate 220 by a conductive medium, such as a conductive epoxy. The trace may be coupled to one terminal of a discrete component 120 by a wire bond. Another terminal of the discrete component may be connected to a lead 300 by a wire bond. This above is intended merely as an example and other connections can be made as will be appreciated by those skilled in the art. For example, FIGS. 57–60 illustrate an embodiment with two rows of leads 300. However, it should be understood that a single row of leads of three or more rows of leads may be provided.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A die package comprising:
   a housing for holding a microelectronic die;
   a plurality of electrically conductive leads held in said housing, each of said leads including a flexible, external portion projecting externally from said housing; and
   a shroud attached to said housing over said leads, said shroud having:
   means for receiving a substrate such that, when the substrate is received, the external portions of said leads flexibly contact the substrate to form an electrical connection between said plurality of leads and the substrate;
   wherein each said external lead portion includes a contact portion for establishing an electrical contact to the substrate; and
   wherein each said contact portion includes an angled surface facing an opening of said means for receiving which first receives the substrate, wherein the angled surface angles away from the opening so that, when the substrate is received by said means for receiving, an edge of the substrate abuts the angled surface, flexes the external portion of said lead away from said means for receiving, and slides past said angled surface.

2. A die package according to claim 1, wherein said electrically conductive leads are held in said housing in two vertically-spaced rows.

3. A die package according to claim 1, wherein said microelectronic die is a microdisplay die housed in said housing, said microdisplay die being electrically coupled to an interior portion of said electrically conductive leads disposed within said housing.

4. A die package according to claim 1, wherein said leads are mechanically held in a sidewall of said housing.

5. A die package according to claim 4, wherein the means for receiving the substrate comprises a slot disposed to receive the substrate such that an edge of the substrate received in said slot faces a sidewall of said housing.

6. A die package according to claim 1, wherein the means for receiving the substrate comprises a slot intersecting said contact portions of said leads.

7. A die package according to claim 1, wherein said shroud is detachable from said housing.

8. A die package according to claim 1, wherein the substrate comprises a printed circuit board.

9. A die package according to claim 1, wherein the substrate comprises a flexible circuit board.

10. A die package according to claim 1, wherein said housing holds a plurality of microelectronic dies.

11. A die package according to claim 1, wherein the microelectronic die is a light-producing display die.

12. A die package according to claim 1, wherein the microelectronic die is a data collection device die that collects data based on light sensitivity.

13. A die package according to claim 1, wherein the means for receiving the substrate comprises a slot.

14. A die package comprising:
   a housing for holding a microelectronic die;
   a plurality of electrically conductive leads held in said housing, each of said leads including a flexible, external portion projecting externally from said housing; and a shroud attached to said housing over said leads, said shroud having means for receiving a substrate such that, when the substrate is received, the external portions of said leads flexibly contact the substrate to form an electrical connection between said plurality of leads and the substrate wherein the housing includes a plurality of arms for receiving said shroud, said arms extending from a sidewall of said housing.

15. A die package according to claim 14, wherein each of said arms include a groove, and said shroud includes tongues for insertion into said grooves.

16. A microdisplay comprising:

a microdisplay die; and a die package for holding said microdisplay die, said die package including a housing, a plurality of electrically conductive leads held in said housing, each of said leads including a flexible, external portion projecting externally from said housing, and a shroud attached to said housing over said leads, said shroud having a slot for receiving a substrate such that, when the substrate is received in said slot, the external portions of said leads flexibly contact the substrate to form an electrical connection between said plurality of leads and the substrate.

17. A microdisplay according to claim 16, wherein said electrically conductive leads are held in said housing in two vertically-spaced rows.

18. A microdisplay according to claim 16, wherein said leads are mechanically held in a sidewall of said housing.

19. A microdisplay according to claim 16, wherein:

each said external lead portion includes a contact portion for establishing an electrical contact to the substrate, and said shroud further includes an opening transverse to said slot and opposite said contact portions of said leads such that, when the substrate is received in said slot, the substrate is held between said contact portions and said opening.

20. A microdisplay according to claim 16, wherein said shroud is detachable from said housing.

21. A microdisplay according to claim 16, wherein the substrate comprises a flexible circuit board.

22. A method for securing a substrate to a die package, the die package including a package housing, a plurality of resilient, electrically-conductive leads extending from said housing, and a shroud attached to said housing over said leads, said shroud having a slot for receiving the substrate, said method comprising:

inserting the substrate into said slot such that an edge of the substrate abuts contact portions of said leads and causes said leads to flex to allow the edge of the substrate to pass the contact portions of said leads, and further inserting the substrate into said slot so that the contact portions flexibly engage electrically-conductive contact regions on a surface of the substrate adjacent to the edge, thereby forming an electrical connection between said plurality of leads and the substrate.

23. A method of securing a substrate to a die package according to claim 22, wherein said substrate is a printed circuit board.

24. A method of securing a substrate to a die package according to claim 23, wherein said substrate is a flexible circuit board.

25. A method of securing a substrate to a die package according to claim 23, wherein said die package comprises a microdisplay die package housing a microdisplay die.

26. A method of securing a substrate to a die package according to claim 23, wherein said package housing holds a plurality of microelectronic dies.

27. A method of securing a substrate to a die package according to claim 23, wherein said package housing hold a light-producing display die.

28. A method of securing a substrate to a die package according to claim 23, wherein the package housing holds a data collection device die that collects data based on light sensitivity.

29. A die package comprising:

a housing for holding a microelectronic die;

a plurality of electrically conductive leads held in said housing, each of said leads including a flexible, external portion projecting externally from said housing; and a shroud attached to said housing over said leads, said shroud having:

a slot for receiving a substrate such that, when the substrate is received the slot, the external portions of said leads flexibly contact the substrate to form an electrical connection between said plurality of leads and the substrate; and an opening transverse to said slot and opposite said contact portions of said leads, wherein when the substrate is received in said slot, the substrate is held between said contact portions and said opening.

* * * * *